US011830875B2

(12) United States Patent
Chuang et al.

(10) Patent No.: US 11,830,875 B2
(45) Date of Patent: Nov. 28, 2023

(54) METHOD TO EMBED PLANAR FETS WITH FINFETS

(71) Applicant: Taiwan Semiconductor Manufacturing Company, Ltd., Hsin-Chu (TW)

(72) Inventors: Harry-Hak-Lay Chuang, Zhubei (TW); Wei Cheng Wu, Zhubei (TW); Li-Feng Teng, Hsinchu (TW); Li-Jung Liu, Kaohsiung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/751,958

(22) Filed: May 24, 2022

(65) Prior Publication Data
US 2022/0285344 A1 Sep. 8, 2022

Related U.S. Application Data

(62) Division of application No. 16/858,801, filed on Apr. 27, 2020, now Pat. No. 11,355,493.
(Continued)

(51) Int. Cl.
*H01L 27/088* (2006.01)
*H01L 29/06* (2006.01)
*H01L 29/417* (2006.01)

(52) U.S. Cl.
CPC ...... *H01L 27/0886* (2013.01); *H01L 29/0649* (2013.01); *H01L 29/41791* (2013.01)

(58) Field of Classification Search
CPC ..... H01L 21/823431; H01L 21/823462; H01L 29/41791; H01L 21/823412;
(Continued)

(56) References Cited

U.S. PATENT DOCUMENTS 8,354,319 B2 * 1/2013 Anderson ....... H01L 21/823456
257/E21.409
8,536,029 B1 * 9/2013 Chang ............... H01L 29/78696
257/29
(Continued)

FOREIGN PATENT DOCUMENTS

KR 20160100925 A 8/2016

OTHER PUBLICATIONS

Notice of Allowance dated Feb. 2, 2022 for U.S. Appl. No. 16/858,801.

*Primary Examiner* — Mouloucoulaye Inoussa
(74) *Attorney, Agent, or Firm* — Eschweiler & Potashnik, LLC

(57) ABSTRACT

Various embodiments of the present disclosure are directed towards a method to embed planar field-effect transistor (FETs) with fin field-effect transistors (finFETs). A semiconductor substrate is patterned to define a mesa and a fin. A trench isolation structure is formed overlying the semiconductor substrate and surrounding the mesa and the fin. A first gate dielectric layer is formed on the mesa, but not the fin. The trench isolation structure recessed around the fin, but not the mesa, after the forming the first gate dielectric layer. A second gate dielectric layer is deposited overlying the first gate dielectric layer at the mesa and further overlying the fin. A first gate electrode is formed overlying the first and second gate dielectric layers at the mesa and partially defining a planar FET. A second gate electrode is formed overlying the second gate dielectric layer at the fin and partially defining a finFET.

20 Claims, 55 Drawing Sheets

Related U.S. Application Data

(60) Provisional application No. 62/988,967, filed on Mar. 13, 2020.

(58) Field of Classification Search
CPC ............ H01L 27/0886; H01L 29/0649; H01L 27/0922; H01L 21/823481; H01L 21/823456; H01L 29/78696; H01L 21/8252; H01L 29/7869; H01L 23/34; H01L 29/66462; H01L 29/205; H01L 29/2003; H01L 29/66969; H01L 29/7787; H01L 29/42384; H01L 29/785; H01L 29/0657; H01L 29/7783; H01L 29/7786; H01L 21/8258; H01L 29/267; H01L 27/1203; H01L 27/092; H01L 21/8238; H01L 27/0605; H01L 29/4236; H01L 27/0924; H01L 27/0688; H01L 27/1207; H01L 29/402; H01L 29/16; H01L 25/0652; H01L 29/0847; H01L 29/66795; H01L 24/73; H01L 24/17; H01L 21/563; H01L 23/3128; H01L 24/13; H01L 29/66545; H01L 25/0655; H01L 29/78; H01L 27/0705; H01L 21/823468; H01L 21/823437; H01L 29/40117; H01L 27/085; H01L 21/0262; H01L 21/02639; H01L 29/792; H01L 29/0653; H01L 29/7851; H01L 29/45; H01L 2224/32225; H01L 2225/06517; H01L 2224/17181; H01L 2225/06513; H01L 2924/15311; H01L 2224/16235; H01L 2225/06586; H01L 2224/16227; H01L 2924/181; H01L 2224/16145; H01L 2224/73204; H01L 2224/16225; H01L 2223/54426; H01L 2223/54453; H01L 2924/0002; H10B 43/40; H10B 43/30; G11C 16/3495; G11C 16/10; G11C 16/0466; G11C 16/0425; G11C 16/26; G11C 16/14
USPC ... 257/192, 288, 18, 19, 268, 368, 328, 784, 257/296, 621, E29.193, E21.618, 257/E21.625, E21.624, E21.621, E21.429, 257/E21.645; 438/197, 938, 285, 164, 438/586, 618, 643, 612

See application file for complete search history.

(56) References Cited

U.S. PATENT DOCUMENTS

| | | | | |
|---|---|---|---|---|
| 8,581,320 | B1* | 11/2013 | Cheng | H01L 28/90 257/E27.071 |
| 9,419,015 | B1* | 8/2016 | Wu | H01L 21/823412 |
| 9,741,716 | B1* | 8/2017 | Cheng | H01L 21/823456 |
| 2005/0056892 | A1* | 3/2005 | Seliskar | H01L 29/42384 438/149 |
| 2005/0093082 | A1* | 5/2005 | Son | H01L 29/66795 257/E27.111 |
| 2005/0167750 | A1* | 8/2005 | Yang | H01L 27/1203 257/E21.703 |
| 2005/0226047 | A1 | 10/2005 | Hieda et al. | |
| 2006/0081895 | A1* | 4/2006 | Lee | H01L 29/66795 257/288 |
| 2006/0232307 | A1 | 10/2006 | Kanno et al. | |
| 2006/0275988 | A1* | 12/2006 | Yagishita | H01L 29/6681 257/288 |
| 2006/0278921 | A1* | 12/2006 | Pellizzer | H01L 29/42392 257/E21.41 |
| 2007/0045748 | A1* | 3/2007 | Booth, Jr. | H01L 27/0924 257/369 |
| 2007/0052027 | A1* | 3/2007 | Ke | H01L 27/1207 257/351 |
| 2007/0069293 | A1* | 3/2007 | Kavalieros | H01L 21/823431 438/153 |
| 2007/0096204 | A1* | 5/2007 | Shiratake | H10B 12/09 438/257 |
| 2007/0170474 | A1* | 7/2007 | Kawasaki | H01L 21/823437 257/288 |
| 2007/0259501 | A1* | 11/2007 | Xiong | H01L 27/1211 438/283 |
| 2008/0050885 | A1* | 2/2008 | Tang | H01L 29/785 257/E21.235 |
| 2008/0251839 | A1* | 10/2008 | Lee | H01L 29/66795 257/331 |
| 2008/0299711 | A1* | 12/2008 | Anderson | H01L 21/84 438/154 |
| 2009/0008716 | A1* | 1/2009 | Goto | H01L 21/823462 257/E27.06 |
| 2009/0121284 | A1* | 5/2009 | Fujimoto | H01L 29/66818 257/E21.409 |
| 2009/0121310 | A1 | 5/2009 | Yamauchi | |
| 2009/0221132 | A1* | 9/2009 | Oba | H01L 21/845 257/E21.09 |
| 2009/0278196 | A1* | 11/2009 | Chang | H01L 27/1203 438/440 |
| 2010/0155835 | A1* | 6/2010 | Seliskar | H01L 29/66545 257/E21.632 |
| 2010/0203695 | A1* | 8/2010 | Oh | H10B 12/482 438/270 |
| 2010/0270621 | A1 | 10/2010 | Iwamoto et al. | |
| 2010/0327363 | A1* | 12/2010 | Nakabayashi | H01L 29/785 257/E27.06 |
| 2011/0049611 | A1* | 3/2011 | Kiyotoshi | H10B 41/27 257/326 |
| 2011/0101445 | A1* | 5/2011 | Kim | H10B 41/42 257/784 |
| 2011/0228725 | A1* | 9/2011 | Nakamoto | H04L 61/45 370/328 |
| 2013/0026471 | A1* | 1/2013 | Zahurak | H01L 23/528 257/E21.409 |
| 2013/0049136 | A1* | 2/2013 | Wahl | H01L 27/1207 257/E27.06 |
| 2013/0052781 | A1* | 2/2013 | Dai | H01L 27/1211 438/275 |
| 2013/0134520 | A1* | 5/2013 | Maeda | H01L 21/77 257/E27.06 |
| 2013/0175611 | A1* | 7/2013 | Shinohara | H01L 21/823857 257/334 |
| 2014/0154854 | A1 | 6/2014 | Wei et al. | |
| 2014/0299831 | A1* | 10/2014 | Park | H01L 27/0688 438/238 |
| 2015/0069528 | A1* | 3/2015 | Chiang | H01L 29/1033 438/700 |
| 2015/0187763 | A1* | 7/2015 | Kim | H01L 29/518 257/368 |
| 2016/0020109 | A1* | 1/2016 | Yoo | H01L 21/306 438/275 |
| 2016/0027644 | A1* | 1/2016 | Tsai | H01L 21/311 257/408 |
| 2016/0126352 | A1 | 5/2016 | Cheng et al. | |
| 2016/0307803 | A1* | 10/2016 | Mun | H01L 21/3086 |
| 2016/0308041 | A1* | 10/2016 | Then | H01L 21/84 |
| 2016/0359021 | A1* | 12/2016 | Kim | H01L 29/66545 |
| 2018/0090626 | A1* | 3/2018 | Yamashita | H01L 29/66833 |
| 2018/0145164 | A1* | 5/2018 | Dasgupta | H01L 29/0657 |
| 2019/0027412 | A1* | 1/2019 | Moriwaki | H01L 29/42364 |
| 2019/0057905 | A1* | 2/2019 | Chen | H01L 21/3086 |
| 2019/0097006 | A1* | 3/2019 | Li | H01L 29/41725 |
| 2019/0164809 | A1 | 5/2019 | Meyer et al. | |
| 2019/0214307 | A1* | 7/2019 | Xie | H01L 21/823487 |
| 2019/0355729 | A1 | 11/2019 | Liaw | |
| 2019/0378851 | A1* | 12/2019 | Takizawa | H10B 43/40 |
| 2020/0006183 | A1 | 1/2020 | Huang et al. | |
| 2020/0219878 | A1* | 7/2020 | Then | H01L 29/7869 |
| 2020/0243517 | A1* | 7/2020 | Liu | H01L 29/78 |
| 2020/0273860 | A1* | 8/2020 | Dasgupta | H01L 21/8258 |
| 2020/0295170 | A1* | 9/2020 | Dayeh | H01L 29/7787 |

(56) References Cited

U.S. PATENT DOCUMENTS

2020/0381352 A1   12/2020  Chou et al.
2021/0057579 A1*  2/2021  Chen ................ H01L 29/66522

* cited by examiner

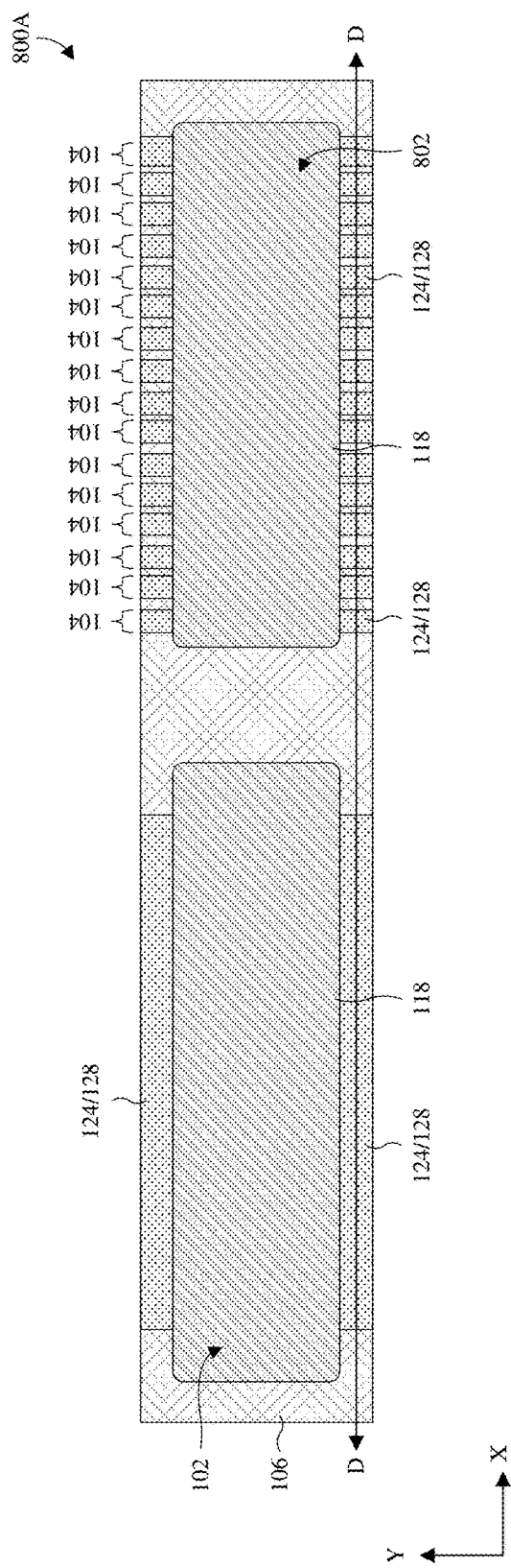
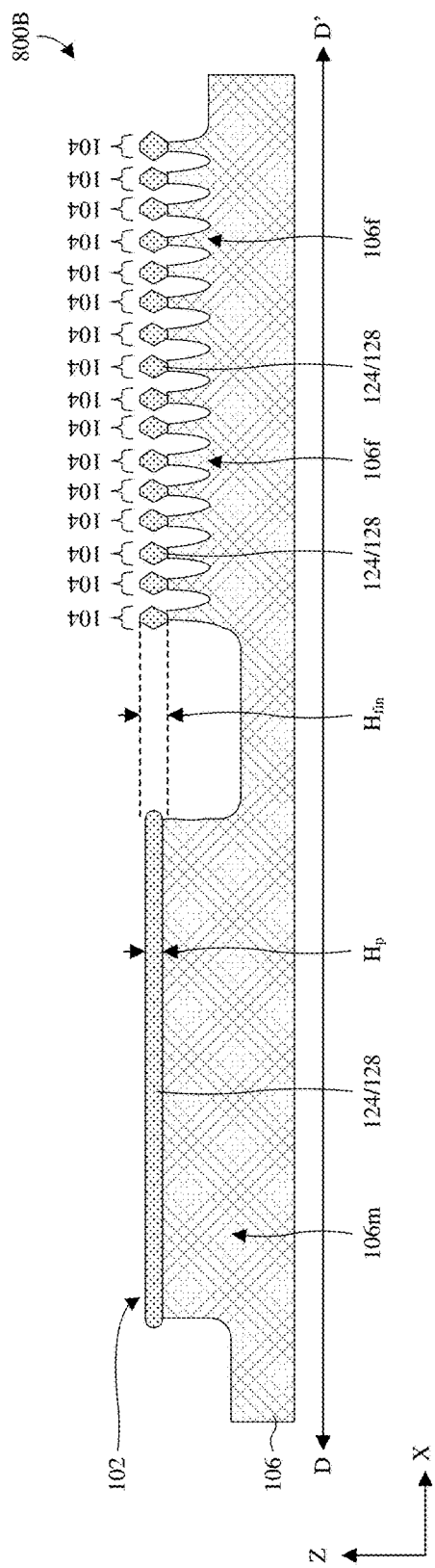
Fig. 8A
Fig. 8B

METHOD TO EMBED PLANAR FETS WITH FINFETS

REFERENCE TO RELATED APPLICATION

This application is a Divisional of U.S. application Ser. No. 16/858,801, filed on Apr. 27, 2020, which claims the benefit of U.S. Provisional Application No. 62/988,967, filed on Mar. 13, 2020. The contents of the above-referenced patent applications are hereby incorporated by reference in their entirety.

BACKGROUND

The integrated circuit (IC) manufacturing industry has experienced exponential growth over the last few decades. As ICs have evolved, functional density (e.g., the number of interconnected devices per chip area) has increased while feature sizes have decreased. One advancement by the IC manufacturing industry to increase functional density and decrease feature sizes is the development of fin field-effect transistors (finFETs). While finFETs have several advantages over traditional planar FETs (e.g., reduced power consumption, smaller feature sizes, etc.), the use of finFETs does not come without problems.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 8A and 8B respectively illustrate top and cross-sectional views of some embodiments of an IC comprising a planar FET and a plurality of finFETs that are spaced from each other in a direction extending transverse to corresponding channel lengths.

FIGS. 10A and 10B through FIGS. 13A and 13B, FIGS. 14A-14C through FIGS. 23A-23C, FIGS. 24A and 24B, FIGS. 25A-25D through FIGS. 28A-28D, FIGS. 29A and 29B through FIGS. 37A and 37B illustrate a series of views of some embodiments of a method for forming an IC comprising a planar FET and a finFET.

DETAILED DESCRIPTION

Figure 1A:
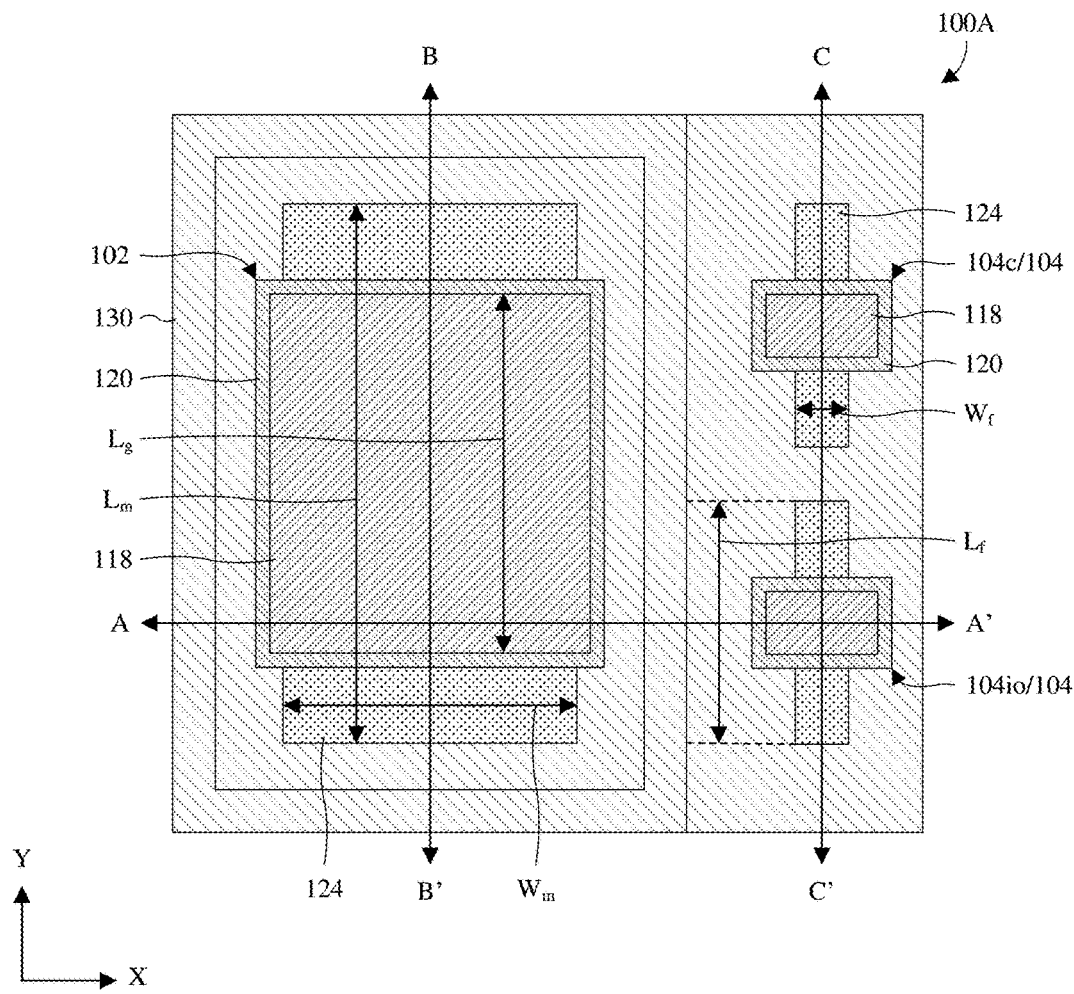
FIGS. 1A-1D respectively illustrate top and cross-sectional views of some embodiments of an IC comprising a planar field-effect transistor (FET) and a fin FET (finFET).

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An integrated circuit (IC) may, for example, comprise a plurality of fin field-effect transistors (finFETs) that define a logic core and input/output (IO). A challenge with the IC is that IO finFETs may be configured for low operating voltages. For example, the IO finFETs may be configured to operate at 1.8 volts or some other suitable voltage. Due to the low operating voltages, the IO finFETs may be unsuitable for high voltage (HV) applications, non-volatile memory (NVM) applications, and other suitable applications.

A solution is to reconfigure the IO finFETs for higher operating voltages. For example, the IO finFETs may be reconfigured to operate at 2.5 volts or some other suitable voltage. However, this may come at the expense of low voltage IO, which may still have application within the IC. Further, the IO finFETs may have short lifespans due to the higher operating voltages. Another solution is to integrate additional IO configured for the higher operating voltages into the IC while maintaining IO configured for the low operating voltages. However, this may pose process challenges as discussed hereafter. Further, the additional IO finFETs configured for the higher operating voltages may still have short lifespans.

According to a method for integrating low voltage IO with high voltage IO, fins are defined in a semiconductor substrate. A shallow trench isolation (STI) structure is formed surrounding the fins, and dopants are implanted into the fins to define wells for finFETs being formed. The STI structure is recessed around the fins, and dopants are again implanted into the fins to tune threshold voltages and/or other suitable properties of the finFETs being formed. A high voltage IO dielectric layer is deposited on the fins and is subsequently removed from the fins corresponding to the low voltage IO. A low voltage IO dielectric layer is deposited on the fins and polysilicon gate electrodes are formed over the high and low IO dielectric layers.

A challenge is that formation of the high and/or low voltage IO dielectric layer(s) after the tuning may change properties of the finFETs. For example, the high and low voltage IO dielectric layers may be formed by thermal oxidation for high quality and low leakage. However, thermal oxidation may partially consume the fins and may hence erode dopants implanted to tune threshold voltages and/or other suitable properties of the finFETs. This may, in turn, change the threshold voltages and/or other suitable properties of the finFETs.

Methods for forming the IC with low voltage IO, but without high voltage IO, may be designed to compensate for the changes in doping profile during formation of the low voltage IO dielectric layer. However, when high voltage IO is integrated into these methods as described above, there may be no compensation for the changes in doping profile during formation of the high voltage IO dielectric layer. As a result, manufacturing yields may be negatively impacted without costly rework of the methods.

Various embodiments of the present disclosure are directed towards a method for forming a planar FET and a finFET together, as well as an IC resulting from the method. According to some embodiments of the method, a semiconductor substrate is patterned to define a mesa and a fin. A trench isolation structure is formed surrounding the mesa and the fin. A first dielectric layer is deposited on the mesa and the fin and is then removed from the fin. The trench isolation structure is recessed after removing the first dielectric layer from the fin, and dopants are implanted into the semiconductor substrate (e.g., at the fin and/or some other suitable location(s)) to tune threshold voltages and/or other suitable properties for semiconductor devices being formed. A second dielectric layer is deposited overlying the first dielectric layer at the mesa and further overlying the fin. A first gate electrode is formed overlying the first and second dielectric layers at the mesa and partially defining a planar FET. Further, a second gate electrode is formed overlying the second dielectric layer at the fin and partially defining a finFET.

The planar FET may be employed for IO, whereas the finFET may be employed for lower voltage IO or a logic core. For example, the planar FET may be employed for 2.5-volt IO, whereas the finFET may be employed for 1.8-volt IO. Other suitable voltages are, however, amenable. FinFETs may have reduced power consumption, smaller feature sizes, and other benefits over planar FETs. However, finFETs may be less reliable than planar FETs. Hence, IO finFETs may have short lifespans when operated at higher voltages. By using the planar FET for higher voltage IO while using the finFET for a logic core or lower voltage IO, the lifespan of the IC may be enhanced. The planar FET mitigates reliability issues, and the finFET provides the aforementioned benefits where reliability is less of an issue. Further, because the planar FET may be employed for higher voltage IO, the IC may be used for HV applications, NVM applications, and other suitable applications that depend upon higher voltages.

By forming the first dielectric layer before the recessing, the first gate dielectric layer may be formed without negatively impacting doping profiles of semiconductor devices on the semiconductor substrate. For example, the first dielectric layer may be formed by thermal oxidation for high quality and low leakage. Thermal oxidation may consume the semiconductor substrate. If the first dielectric layer was formed after the recessing and after the tuning, thermal oxidation may consume portions of the semiconductor substrate at which dopants are implanted for the tuning. This, in turn, may change doping profiles of the semiconductor devices and may hence change the threshold voltages and/or other suitable parameters. Because the first dielectric layer may be formed without negatively impacting doping profiles of the semiconductor devices, the first dielectric layer and hence the planar FET may be formed without negatively impacting yields for the semiconductor devices. The semiconductor devices may include, for example, static random-access memory (SRAM) devices and/or other suitable semiconductor device(s). Further, the first dielectric layer and hence the planar FET may be integrated with and formed with no impact or minimal impact on existing finFET processes.

Figure 1B:
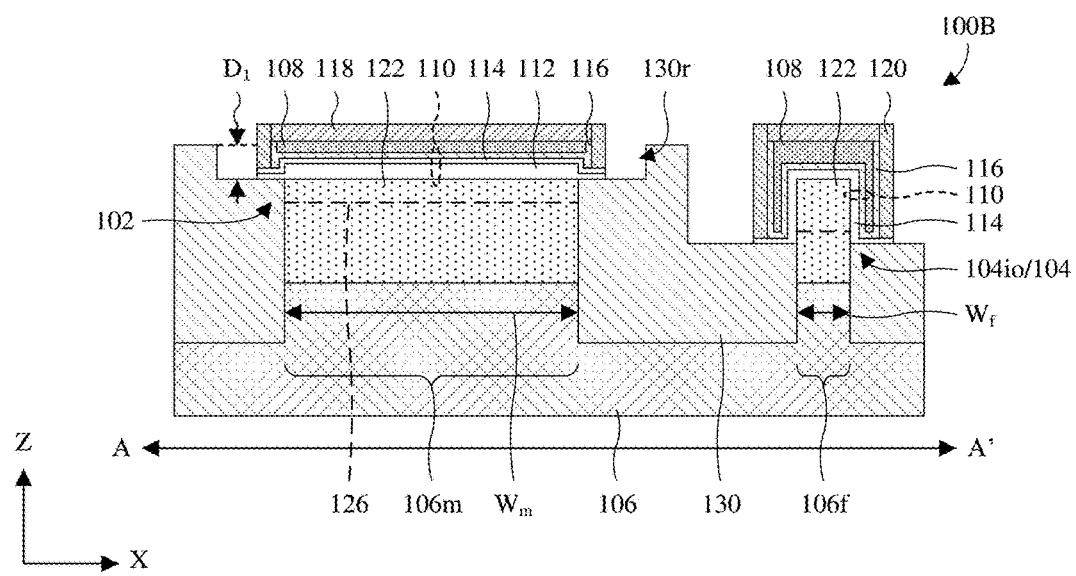
Figure 1C:
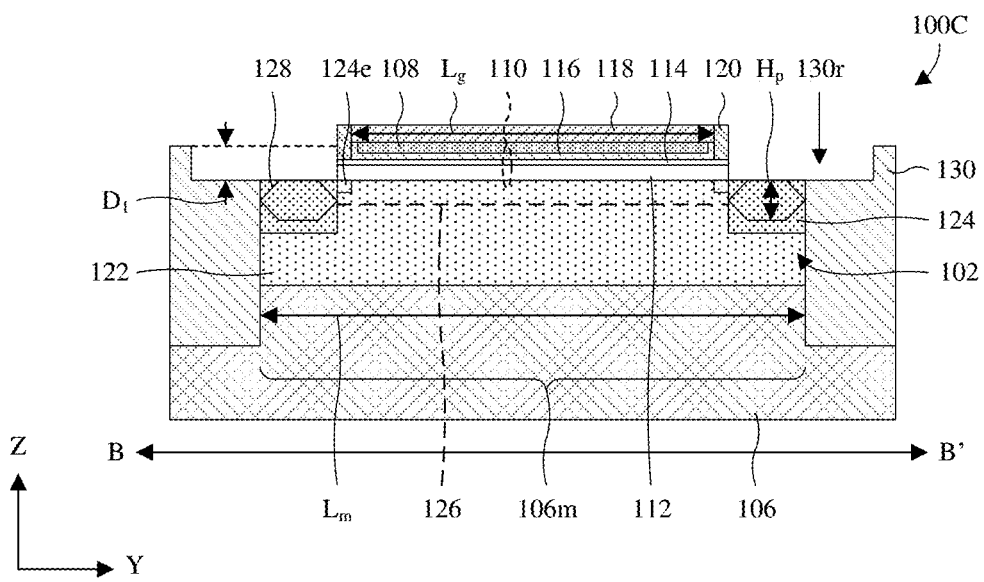
Figure 1D:
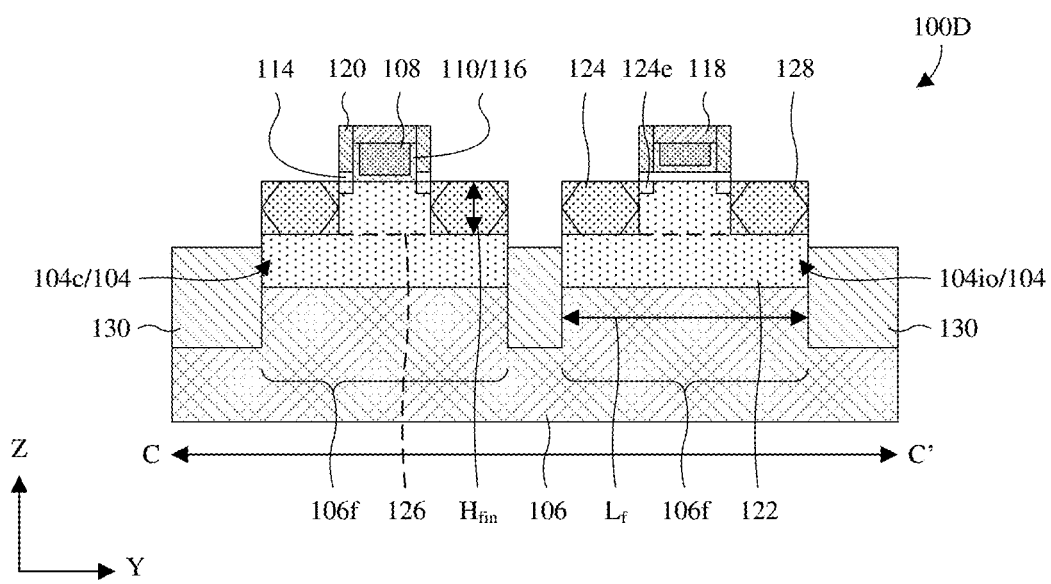

With reference to FIGS. 1A-1D, top and cross-sectional views 100A-100D of some embodiments of an IC comprising a planar FET 102 and a plurality of finFETs 104 is provided. FIG. 1A is a top view 100A of the IC, whereas FIGS. 1B-1D are cross-sectional views 100B-100D respectively along lines A-A', B-B', and C-C' in FIG. 1A. The plurality of finFETs 104 comprises a core finFET 104c and an IO finFET 104io. The planar FET 102 is employed for IO, and the core and IO finFETs 104c, 104io are respectively employed for a logic core and lower voltage IO. For example, the planar FET 102 may be employed for 2.5-volt IO, and the IO finFET 104io may be employed for 1.8-volt IO. Other suitable voltages are, however, amenable.

FinFETs may have reduced power consumption, smaller feature sizes, and other benefits over planar FETs. However, finFETs may be less reliable than planar FETs. Hence, IO finFETs may have shorter lifespans when operated at higher voltages. By using the planar FET 102 for higher voltage IO while using the IO finFET 104io for lower voltage IO, the lifespan of the IC may be enhanced. The planar FET 102 mitigates reliability issues from higher voltages, and the IO finFET 104io provides the aforementioned benefits where reliability is less of an issue. Further, because the planar FET 102 may be employed for higher voltage IO, the IC may be used for HV applications, NVM applications, and other suitable applications.

The planar FET 102 and the finFETs 104 overlie a semiconductor substrate 106 and comprise corresponding gate electrodes 108 and corresponding gate dielectric layers 110. The planar FET 102 is on a mesa 106m defined by the semiconductor substrate 106, and the finFETs 104 are respectively on fins 106f defined by the semiconductor substrate 106. The semiconductor substrate 106 may, for example, be or comprise a bulk substrate of monocrystalline silicon or some other suitable semiconductor substrate.

The mesa 106m has a length $L_m$ and the fins 106f have a length $L_f$. In some embodiments, a ratio of the mesa length $L_m$ to the fin length $L_f$ is greater than or equal to about 1:1, 2:1, or 5:1. Other suitable values are, however, amenable. In some embodiments, the mesa 106m has a width $W_m$ that is greater than about 150 nanometers, but other suitable values are amenable. In some embodiments, the fins 106f have individual widths $W_f$ that are greater than about 16 nanometers or some other suitable values. In some embodiments, a top surface area of the mesa 106m is an order of magnitude greater than individual top surface areas of the fins 106f, but other suitable relationships between the top surface areas are amenable.

The gate electrodes 108 respectively overlie the mesa 106m and the fins 106f. The gate electrode 108 of the planar FET 102 has a bottommost surface wholly or substantially elevated above a topmost surface of the mesa 106m. In some embodiments, the gate electrode 108 of the planar FET 102 has a bottom with an inverted U-shaped profile, a flat or planar profile, or some other suitable profile. In some embodiments, the gate electrode 108 of the planar FET 102 has a bottommost point or edge elevated above a topmost point or edge of the mesa 106m. The gate electrodes 108 of the finFETs 104 respectively wrap around tops of the fins 106f and have bottom surfaces recessed relative to top surfaces of the fins 106f. In some embodiments, the gate electrodes 108 of the finFETs 104 have bottoms with inverted U-shaped profiles or some other suitable profiles. The gate electrodes 108 may, for example, be or comprise metal, doped polysilicon, some other suitable conductive material(s), or any combination of the foregoing.

In some embodiments, the gate electrode 108 of the planar FET 102 has a length $L_g$ greater than about 0.24 micrometers, 0.4 micrometers, 0.5 micrometers, 0.72 micrometers, 1.0 micrometers, or some other suitable value. Increasing the length $L_g$ increases the voltage with which the planar FET 102 can sustain operation and/or increases the lifetime of the planar FET 102. For example, increasing the length $L_g$ from about 0.24 micrometers to about 1.0 micrometers may increase the lifetime of the planar FET 102 by about 2-3 orders of magnitude.

The gate dielectric layers 110 respectively separate the gate electrodes 108 from the semiconductor substrate 106. The gate dielectric layer 110 of the planar FET 102 separates the gate electrode 108 of the planar FET 102 from the mesa 106m, and the gate dielectric layers 110 of the finFETs 104 respectively separate the gate electrodes 108 of the finFETs 104 from the fins 106f. The gate dielectric layers 110 have different thicknesses and/or material compositions to account for different operating conditions and/or usages. For example, the gate dielectric layer 110 of the planar FET 102 may be thicker than the gate dielectric layer 110 of the IO finFET 104io because the planar FET 102 may be employed for higher voltage IO than the IO finFET 104io.

In some embodiments, the gate dielectric layer 110 of the planar FET 102 is defined by a first IO dielectric layer 112, a second IO dielectric layer 114, and a core dielectric layer 116, whereas the gate dielectric layer 110 of the IO finFET 104io is defined by the second IO dielectric layer 114 and the core dielectric layer 116 but not the first IO dielectric layer 112. In alternative embodiments, the core dielectric layer 116 is omitted from the gate dielectric layer 110 of the planar FET 102 and/or the gate dielectric layer 110 of the IO finFET 104io. In some embodiments, the gate dielectric layer 110 of the core finFET 104c is defined by the core dielectric layer 116 but not the first and second IO dielectric layers 112, 114. In alternative embodiments, the gate dielectric layer 110 of the core finFET 104c is also defined by the first IO dielectric layer 112 and/or the second IO dielectric layer 114.

The first IO dielectric layer 112 may, for example, be or comprise silicon oxide and/or some other suitable dielectric(s). Similarly, the second IO dielectric layer 114 may, for example, be or comprise silicon oxide and/or some other suitable dielectric(s). In some embodiments, the second IO dielectric layer 114 has an elevated concentration of nitrogen than the first IO dielectric layer 112. The nitrogen may, for example, suppress diffusion of dopants through the first IO dielectric layer 112, which may, for example, lead to reduced gate current leakage and/or increased reliability. In some embodiments, the first and second IO dielectric layers 112, 114 are or comprise the same material, such that boundaries therebetween may not be readily distinguishable.

As seen hereafter, the first IO dielectric layer 112 may be formed without negatively impacting semiconductor devices on the semiconductor substrate 106. For example, during the formation of the IC, dopants may be implanted into the semiconductor substrate 106 to tune threshold voltages and/or other suitable parameters of the semiconductor devices. The first IO dielectric layer 112 may be formed before this tuning so the deposition process employed for the first IO dielectric layer 112 does not impact these dopants. Because the first IO dielectric layer 112 may be formed without impacting the semiconductor devices, the first IO dielectric layer 112 and hence the planar FET 102 may be formed without negatively impacting yields for the semiconductor devices. The semiconductor devices may include, for example, SRAM devices, the core finFET 104c, the IO finFET 104io, some other suitable semiconductor device(s), or any combination of the foregoing. Further, the first IO dielectric layer 112 and hence the planar FET 102 may be integrated into existing finFET processes with no or minimal impact.

The core dielectric layer 116 may, for example, be or comprise silicon oxide, a high k dielectric, some other suitable dielectric(s), or any combination of the foregoing. In some embodiments, the core dielectric layer 116 has U-shaped profiles individual to and respectively cupping undersides of the gate electrodes 108. In alternative embodiments, the core dielectric layer 116 has some other suitable profiles.

Hard masks 118 respectively cover the gate electrodes 108 and/or sidewall spacers 120 are respectively on sidewalls of the gate electrodes 108. In alternative embodiments, the hard masks 118 and/or the sidewall spacers 120 are omitted. The hard masks 118 may be or comprise, for example, silicon nitride and/or some suitable dielectric(s). Similarly, the sidewall spacers 120 may be or comprise, for example, silicon nitride and/or some other suitable dielectric(s). In some embodiments, the hard masks 118 and the sidewall spacers 120 are or comprise the same material, such that boundaries therebetween may not be readily distinguishable.

Device wells 122 are respectively in the mesa 106m and the fins 106f and are respectively along top surfaces of the mesa 106m and the fins 106f. The device wells 122 are individual to the planar FET 102 and the finFETs 104 and respectively underlie the planar FET 102 and the finFETs 104. The device wells 122 each have a doping type that varies depending upon a type (e.g., P-type or N-type) of a corresponding FET. For example, a P-type FET may have an N-type device well, whereas an N-type FET may have a P-type device well. In alternative embodiments, one, some, or all of the device wells 122 is/are omitted.

Source/drain regions 124 respectively overlie the device wells 122 and are respectively in the mesa 106m and the fins 106f. Further, the source/drain regions 124 are arranged so that each of the gate electrodes 108 is sandwiched between two of the source/drain regions 124. In embodiments, the source/drain regions 124 have individual source/drain extensions 124e. The source/drain extensions 124e respectively underlie the sidewall spacers 120 and have a lower doping concentration than remainders of corresponding source/drain regions. In alterative embodiments, some or all of the source/drain extensions 124e are omitted. The source/drain regions 124 have opposite doping type as corresponding device wells.

Channel regions 126 individual to the planar FET 102 and the finFETs 104 respectively underlie the corresponding FETs and extend between the source/drain regions of the corresponding FETs. Depending upon a bias voltage applied to the gate electrode of a FET, a corresponding channel region switches between a conducting state and a non-conducting state. In the conducting state, the source/drain regions of the FET are electrically coupled together. In the non-conducting state, the source/drain regions of the FET are electrically isolated.

Epitaxial structures 128 respectively overlap with the source/drain regions 124 and impose stress on the channel regions 126 to increase carrier mobility. Source/drain regions that overlap with epitaxial structures may, for example, also be known as strained source/drain (SSD) regions. For an N-type FET, an epitaxial structure may, for example, be or comprise silicon carbide or some other suitable material that imposes tensile stress on a corresponding channel. For a P-type FET, an epitaxial structure may, for example, be or comprise silicon germanium or some other suitable material that imposes compressive stress on a corresponding channel. In some embodiments, the epitaxial structures 128 have hexagonal profiles, but other suitable profiles are amenable. In alternative embodiments, one, some, or all of the epitaxial structures 128 are omitted.

As best seen in FIGS. 1C and 1D, the epitaxial structures 128 of the planar FET 102 have different profiles and heights than the epitaxial structures 128 of the finFETs 104. For example, the epitaxial structures 128 of the planar FET 102 may have a first height $H_p$, whereas the epitaxial structures 128 of the finFETs 104 may have a second height $H_{fin}$ greater than the first height $H_p$. The different profiles and heights may, for example, be due to different epitaxial loading during formation of the epitaxial structures 128. For example, the epitaxial structures 128 of the planar FET 102 may be concurrently formed with the epitaxial structures 128 of the finFETs 104. Different feature densities and/or pitches around locations of the epitaxial structures 128 may lead to different etch rates while forming openings within which the epitaxial structures 128 are formed. As a result, the openings may have different heights and profiles. In some embodiments, the epitaxial structures 128 of the planar FET 102 also have different volumes than the epitaxial structures 128 of the finFETs 104 due to, for example, the epitaxial loading.

A trench isolation structure 130 overlies the semiconductor substrate 106 and surrounds the mesa 106m and the fins 106f. The trench isolation structure 130 steps down from the planar FET 102 to the finFETs 104, such that the fins 106f extend above the trench isolation structure 130. Further, the trench isolation structure 130 has a recess 130r that extends along a periphery of the mesa 106m so a top surface of the mesa 106m is even with or about even with a recessed top surface portion of the trench isolation structure 130. In some embodiments, the recess 130r extends in a closed path along the periphery of the mesa 106m. In alternative embodiments, the recess 130r is localized to edges of the mesa 106m extending between the source/drain regions 124 of the planar FET 102. The trench isolation structure 130 may be or comprise, for example, silicon oxide and/or some other suitable dielectric(s). Further, the trench isolation structure 130 may, for example, be a shallow trench isolation (STI) structure or some other suitable type of the trench isolation structure.

It has been appreciated that the recess 130r may, for example, enhance performance of the planar FET 102. For example, edges of the mesa 106m that extend between the source/drain regions 124 of the mesa 106m may have a high concentration of defects that negatively affect the saturation current and off current for the planar FET 102. The recess 130r changes the structure at the edges to at least partially mitigate the effect of the defects and to enhance the saturation current and off current for the planar FET 102. This may, in turn, enhance the reliability of the planar FET 102. In some embodiments, a distance $D_1$ from the top surface of the mesa 106m to the top surface of the trench isolation structure 130 is greater than about 4 nanometers, 6 nanometers, or some other suitable value. In alternative embodiments, the distance $D_1$ is about 2-4 nanometers, about 2-6 nanometers, less than or equal to about 4 nanometers, less than or equal to about 6 nanometers, or some other suitable value. In at least some embodiments in which the distance $D_1$ is less than or equal to about 4 nanometers, 6 nanometers, or some other suitable value, the recess 130r may be omitted because of a minimal performance improvement.

While the planar FET 102 is described as being employed for IO, it is to be appreciated that the planar FET 102 is not limited to IO. Rather, the planar FET 102 may alternatively be used for logic, HV applications, and so on in alternative embodiments. Similarly, while the core finFET 104c and the IO finFET 104io are respectively described with regard to a logic core and IO, the core finFET 104c and the IO finFET 104io are not limited to a logic core and IO. The core finFET 104c and/or the IO finFET 104io may be used for other suitable applications on in alternative embodiments. For example, the core finFET 104c may be used for SRAM. Further yet, while the planar FET 102 as being integrated with finFETs, the planar FET 102 may alternatively be integrated with nanosheet FETs, gate-all-around (GAA) FETs, and so on. For example, the core finFET 104c may be replaced with a nanosheet FET, a GAA FET, or another suitable type of FET, and/or the IO finFET 104io may be replaced with a nanosheet FET, a GAA FET, or another suitable type of FET.

Figure 2:
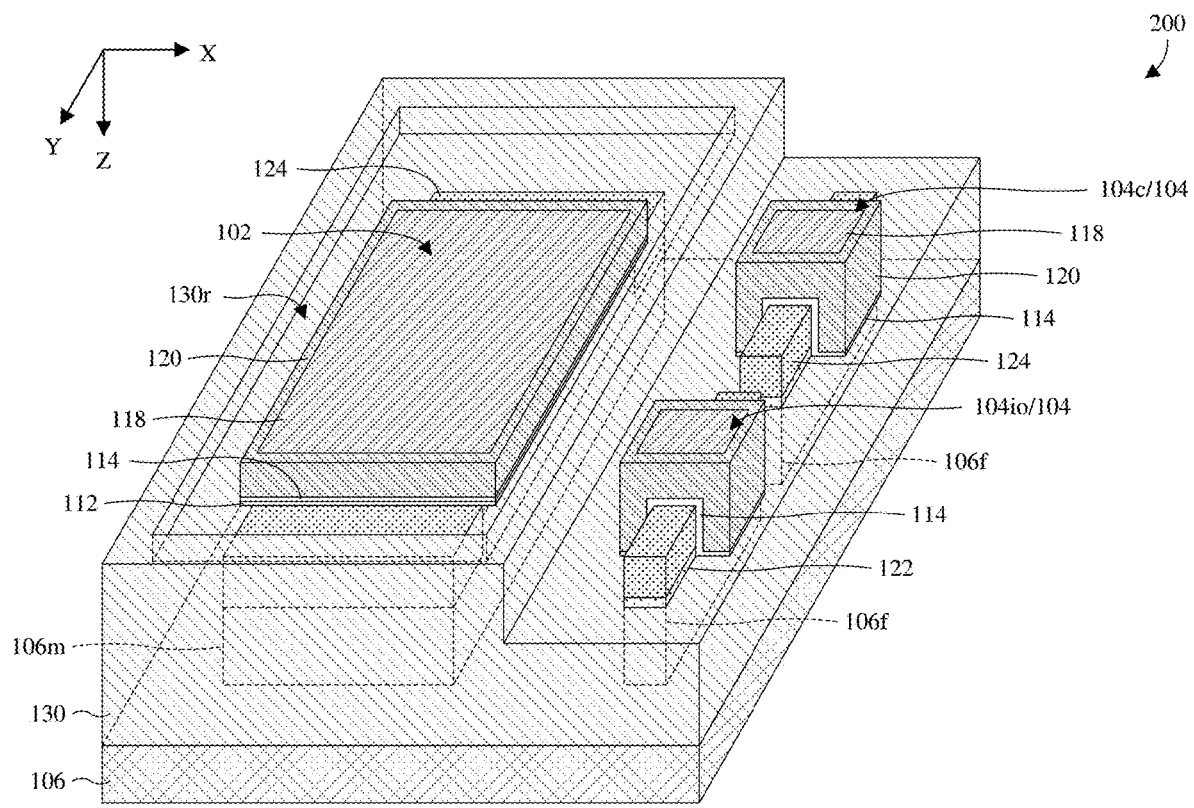
FIG. 2 is a perspective view of some embodiments of the IC of FIGS. 1A-1D.

With reference to FIG. 2, a perspective view 200 of some embodiments of the IC of FIGS. 1A-1D is provided. For clarity, the fins 106f, the mesa 106m, and the source/drain regions 124 are shown in phantom where covered by the trench isolation structure 130.

With reference to FIGS. 3A-3E, cross-sectional views 300A-300E of some alternative embodiments of the IC of FIGS. 1A-1D is provided. The cross-sectional views 300A-300E may, for example, be taken along line A-A' in FIG. 1A.

Figure 3A:
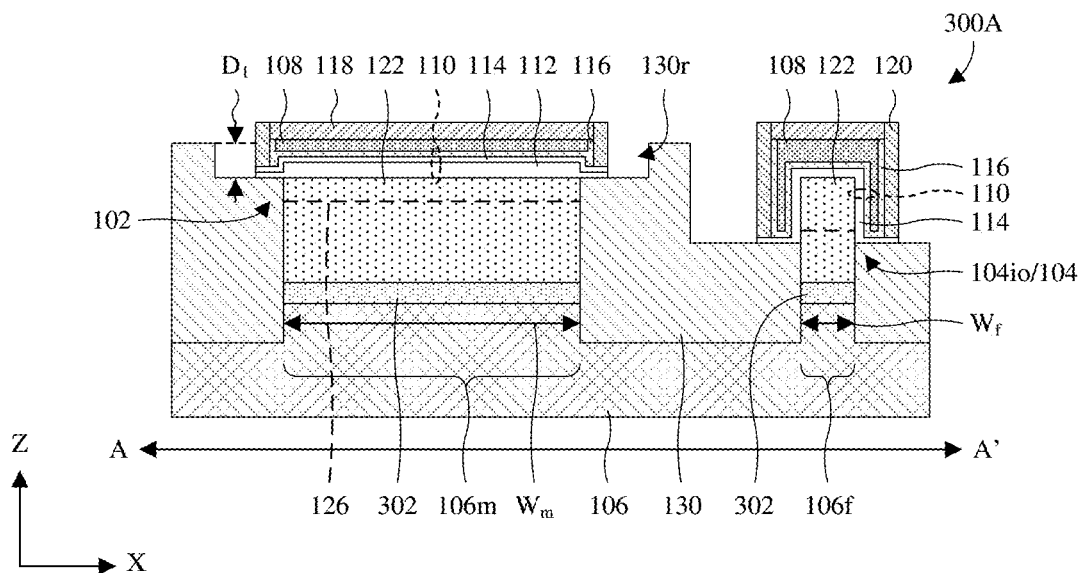
FIGS. 3A-3E illustrate cross-sectional views of some alternative embodiments of the IC of FIG. 1B.

As illustrated by the cross-sectional view 300A of FIG. 3A, deep wells 302 are respectively in the mesa 106m and the fins 106f. Further, the deep wells 302 respectively underlie the device wells 122. Although not visible, one of the deep wells 302 may underlie the device well 122 of the core finFET 104c as illustrated for the IO finFET 104io. The deep wells 302 have opposite doping types as corresponding device wells. The deep wells 302 may, for example, suppress diffusion of dopants and/or impurities in the device wells 122 to a remainder of the semiconductor substrate 106 or vice versa. Additionally, or alternatively, the deep wells 302 may, for example, provide enhanced electrical isolation to the planar FETs 102 and the finFETs 104. In some embodiments, the deep wells 302 are employed for N-type FETs, but not P-type FETs. In alternative embodiments, one, some, or all of the deep wells 302 is/are omitted.

Figure 3B:
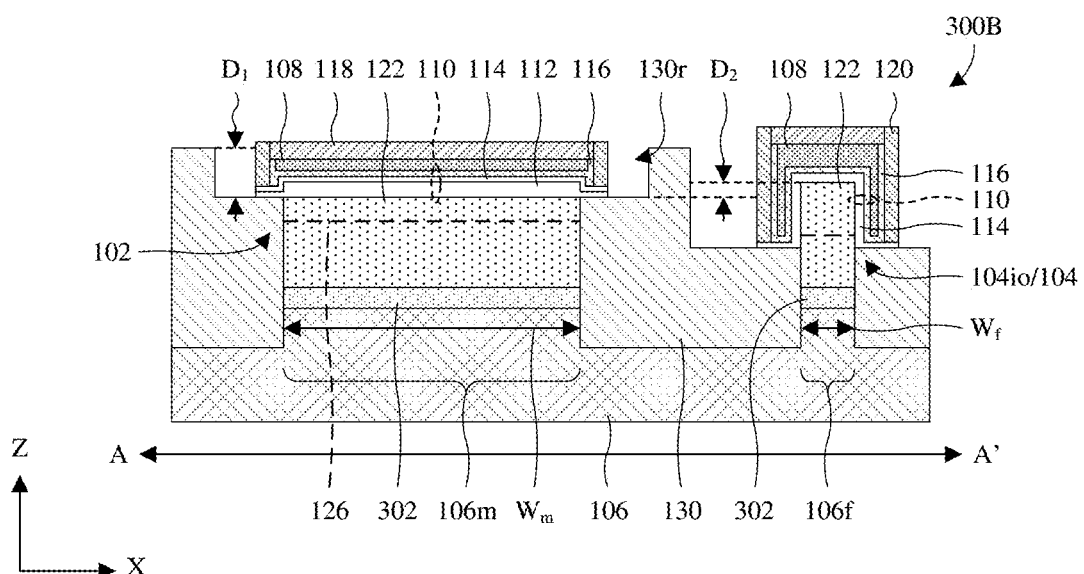

As illustrated by the cross-sectional view 300B of FIG. 3B, a top surface of the mesa 106m is recessed relative to top surfaces of the fins 106f by a distance $D_2$. In alternative embodiments, the top surface of the mesa 106m may be elevated relative to the top surfaces of the fins 106f the distance $D_2$. The vertical offset between the top surface of the mesa 106m and the top surfaces of the fins 106f may, for example, be employed to minimize uneven loading of a planarization process performed while forming the IC. Such uneven loading could lead to an uneven planarization, which could lead to misalignment during photolithography and other suitable semiconductor manufacturing processes performed while forming the IC.

Figure 3C:
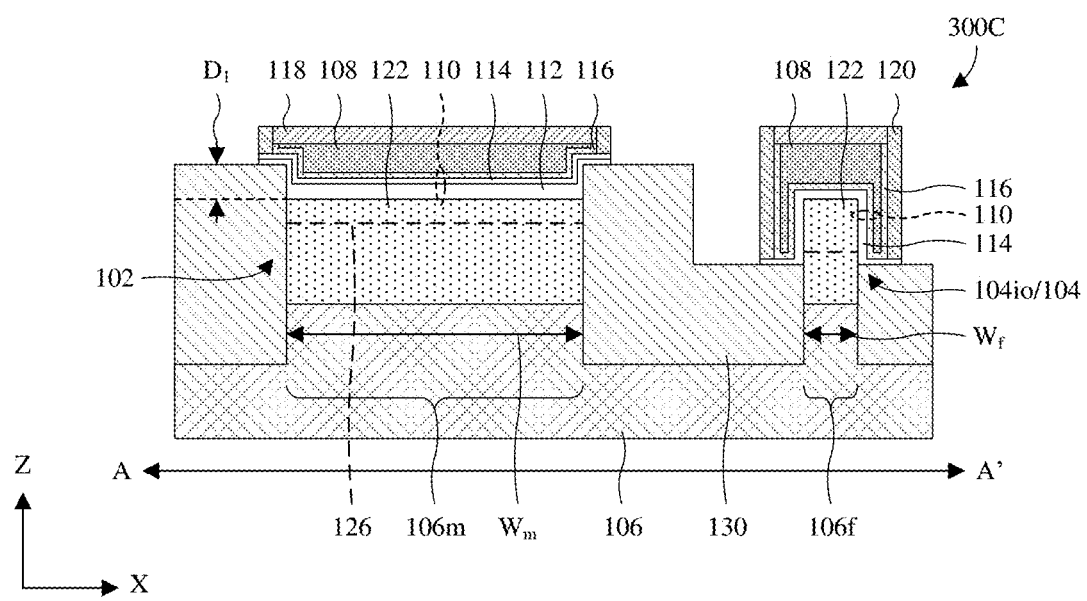

As illustrated by the cross-sectional view 300C of FIG. 3C, the recess 130r (see, e.g., FIG. 1B) at a periphery of the mesa 106m is omitted. As such, a sidewall of the trench isolation structure 130 that adjoins the mesa 106m has a top edge elevated above a top surface of the mesa 106m. The recess 130r may, for example, enhance performance of the planar FET 102. However, where the distance $D_1$ from the top surface of the mesa 106m to the top surface of the trench isolation structure 130 is less than about 4 nanometers, 6 nanometers, or some other suitable value, the performance improvement from the recess 130r may be minimal and hence the recess 130r may be omitted with minimal impact on performance of the planar FET 102. As seen hereafter, this may lead to a cost savings. In some embodiments, the distance $D_1$ is about 2-4 nanometers, about 2-6 nanometers, about 4-6 nanometers, or some other suitable value.

Figure 3D:
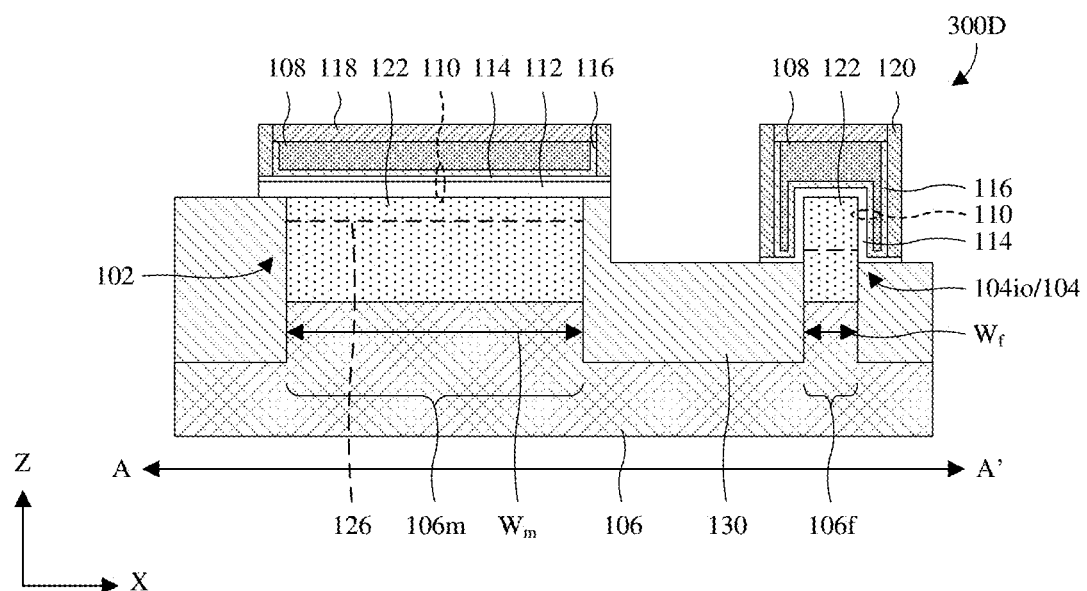

As illustrated by the cross-sectional view 300D of FIG. 3D, the recess 130r (see, e.g., FIG. 1B) at a periphery of the mesa 106m is omitted and the distance $D_1$ (see, e.g., FIG. 1B) is zero or about zero. As such, the gate electrode 108 of the planar FET 102 has a bottom profile that is flat and/or planar. Other suitable profiles are, however, amenable. Additionally, the trench isolation structure 130 steps down from the planar FET 102 to the finFETs 104 at a location closer to the planar FET 102 and aligned to a sidewall spacer of the planar FET 102. In alternative embodiments, the trench isolation structure 130 steps down from the planar FET 102 to the finFETs 104 at the location illustrated in FIG. 1B or at some other suitable location.

Figure 3E:
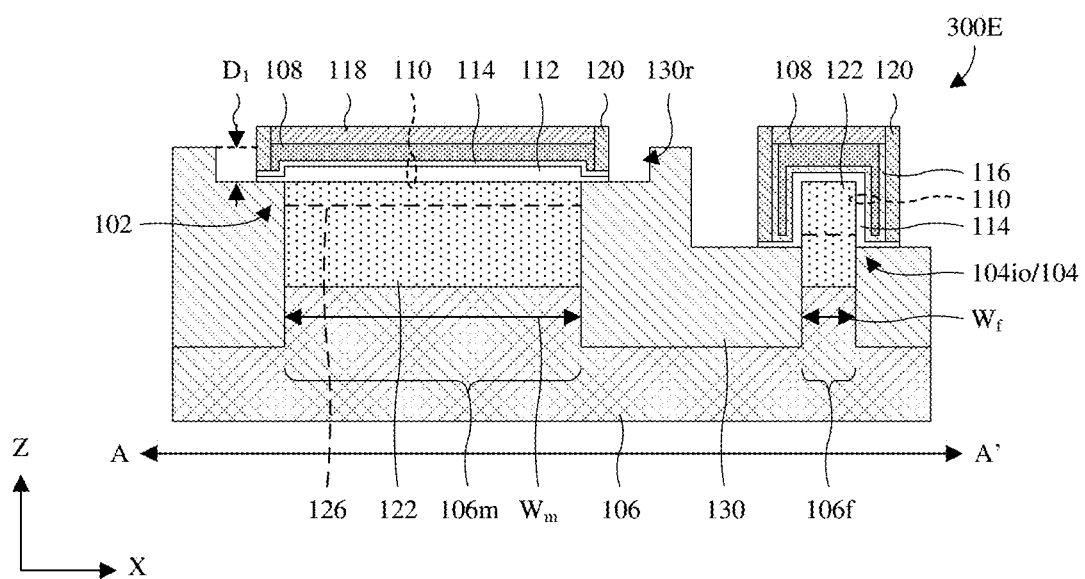

As illustrated by the cross-sectional view 300E of FIG. 3E, the core dielectric layer 116 may, for example, be omitted from the gate dielectric layer 110 of the planar FET 102.

While FIGS. 3A-3E describe variations to the IC of FIGS. 1A-1D through modification of the cross-sectional view 100B of FIG. 1B, it is to be appreciated that the top and cross-sectional views 100A, 100C, and 100D respectively at FIGS. 1A, 1C, and 1D may be similarly modified. For example, the cross-sectional view 100D of FIG. 1D may be modified to include deep wells 302 respectively underlying the core finFET 104c and the IO finFET 104io as illustrated in FIG. 3A. Further, while FIGS. 3A-3E describe different variations to the IC of FIGS. 1A-1D, it is to be appreciated that combinations of the variations are amenable. For example, the IC may have deep wells 302 as illustrated in FIG. 3A and may further omit the recess 130r (see, e.g., FIG. 1B) at a periphery of the mesa 106m as illustrated in FIG. 3C.

Figure 4A:
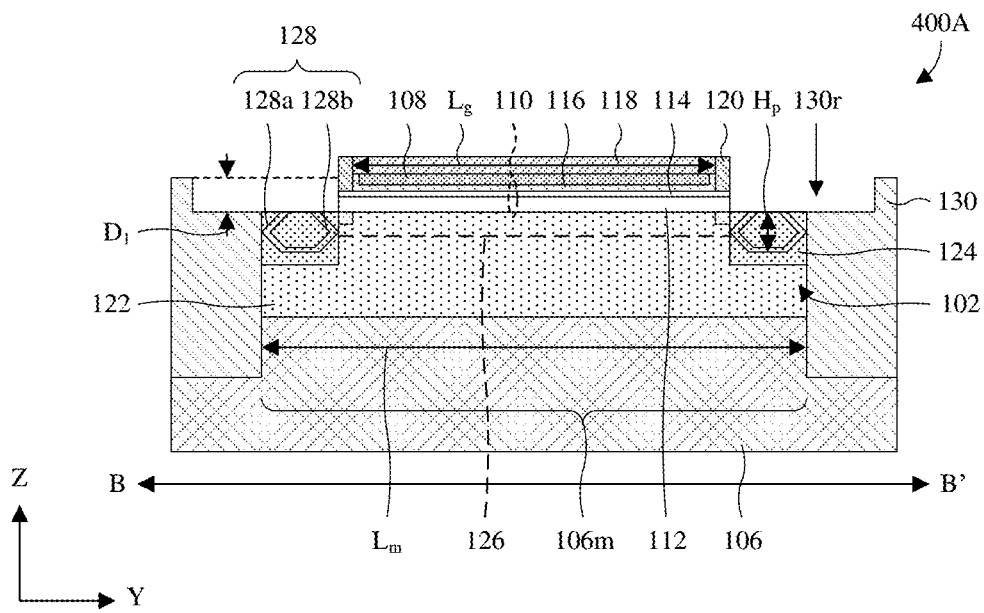
FIGS. 4A and 4B illustrate cross-sectional views of some alternative embodiments of the IC of FIG. 1C.
Figure 4B:
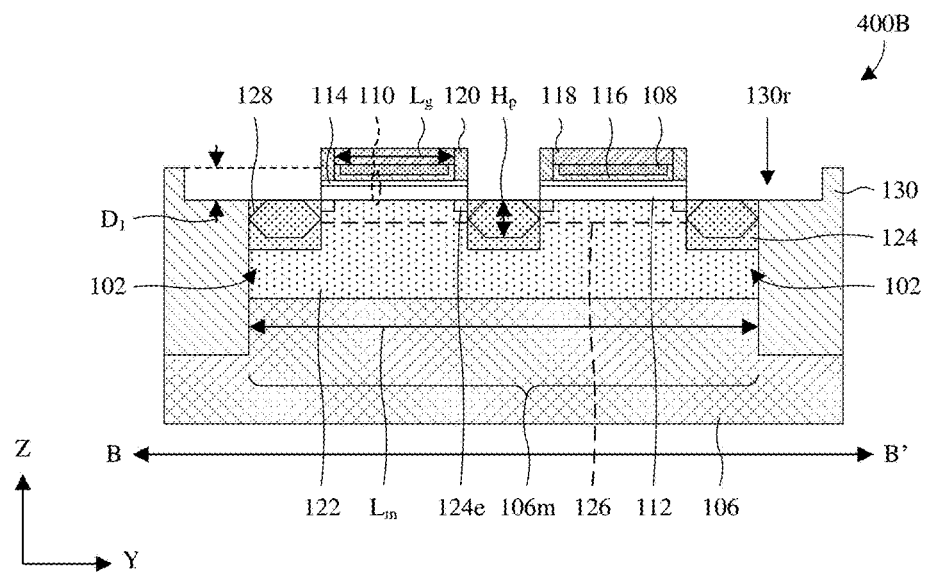

With reference to FIGS. 4A and 4B, cross-sectional views 400A, 400B of some alternative embodiments of the IC of FIGS. 1A-1D is provided. The cross-sectional views 400A and 400B may, for example, be taken along line B-B' in FIG. 1A.

As illustrated by the cross-sectional view 400A of FIG. 4A, the epitaxial structures 128 comprise corresponding first epitaxial layers 128a and corresponding second epitaxial layers 128b. In alternative embodiments, the epitaxial structures 128 comprise more or less epitaxial layers. The first epitaxial layers 128a define a periphery of the epitaxial structures 128 and separate the second epitaxial layers 128b from the semiconductor substrate 106. Further, the first and second epitaxial layers 128a, 128b have different material compositions. By forming the epitaxial structures 128 with multiple epitaxial layers with different material compositions, material compositions of the epitaxial structures 128 may be finely tuned.

As illustrated by the cross-sectional view 400B of FIG. 4B, multiple planar FETs 102 are on the mesa 106m (e.g., instead of a single planar FET). While two planar FETs 102 are illustrated, more planar FETs are amenable. The planar FETs 102 are each as the planar FET 102 of FIG. 1C is illustrated and described, except that the planar FETs 102 share a common one of the device wells 122 and a common one of the source/drain regions 124.

While FIGS. 4A and 4B describe variations to the IC of FIGS. 1A-1D through modification of the cross-sectional view 100C of FIG. 1C, it is to be appreciated that the top and cross-sectional views 100A, 100B, and 100D respectively at FIGS. 1A, 1B, and 1D may be similarly modified. Further, while FIGS. 4A and 4B describe different variations to the IC of FIGS. 1A-1D, it is to be appreciated that combinations of the variations are amenable.

Figure 5:
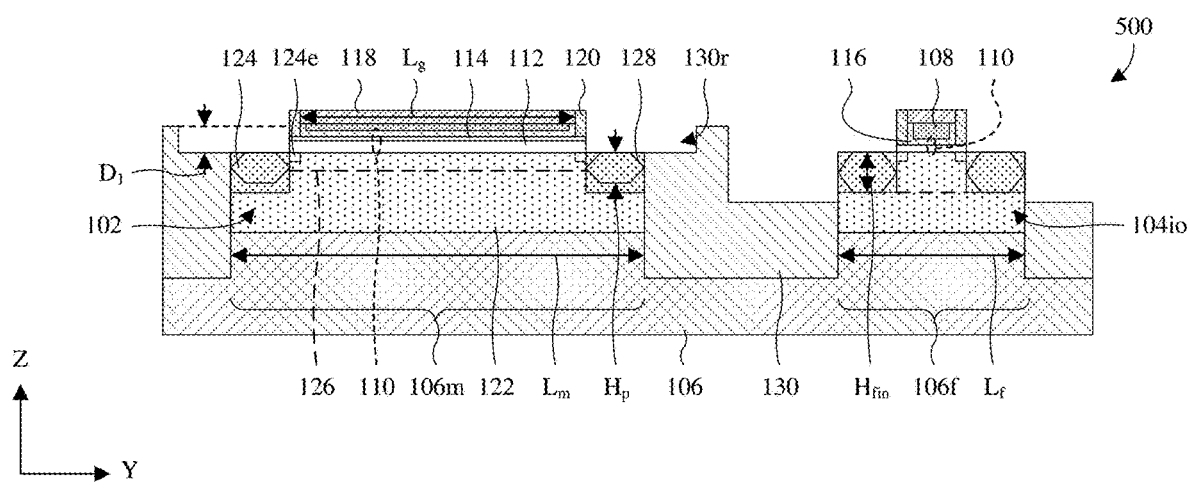
FIG. 5 illustrates a cross-sectional view of some embodiments of an IC comprising a planar FET and a finFET that are spaced from each other in a direction extending along corresponding channel lengths.

With reference to FIG. 5, a cross-sectional view 500 of some embodiments of an IC comprising a planar FET 102 and an IO finFET 104io that are spaced from each other in a direction extending along corresponding channel lengths is provided. The planar FET 102 and the IO finFET 104io are as described and illustrated at FIGS. 1A-1D, except that the planar FET 102 and the IO finFET 104io have different relative positioning.

The epitaxial structures 128 of the planar FET 102 have different profiles and heights than the epitaxial structures 128 of the IO finFET 104io. For example, the epitaxial structures 128 of the planar FET 102 may have a first height $H_p$, whereas the epitaxial structures 128 of the IO finFET 104io may have a second height $H_{fin}$ greater than the first height $H_p$. The different profiles and heights may, for example, be due to different epitaxial loading during formation of the epitaxial structures 128. For example, the epitaxial structures 128 of the planar FET 102 may be concurrently formed with the epitaxial structures 128 of the IO finFET 104io. Because the mesa 106m may be larger than the fin 106f, the feature densities and exposed surface areas may be different at the mesa 106m and the fin 106f. The different feature densities and exposed surface areas may lead to different etch rates while forming openings within which the epitaxial structures 128 are formed. As a result of the different etch rates, the openings within which the epitaxial structures 128 of the planar FET 102 are formed may be shallower than the openings within which the epitaxial structures 128 of the IO finFET 104io are formed.

Figure 6A:
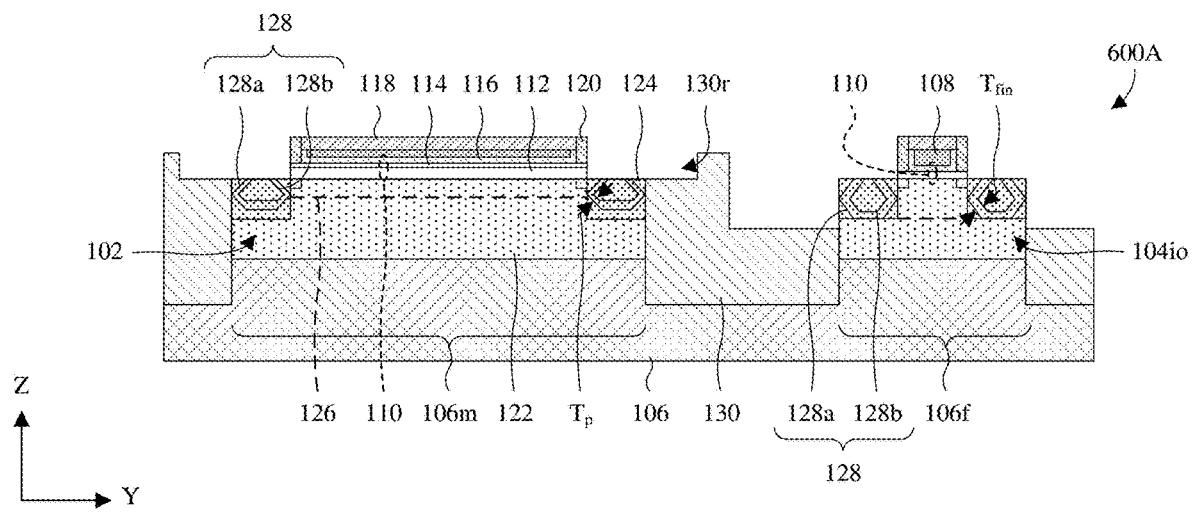
FIGS. 6A and 6B illustrate cross-sectional views of some alternative embodiments of the IC of FIG. 5.
Figure 6B:
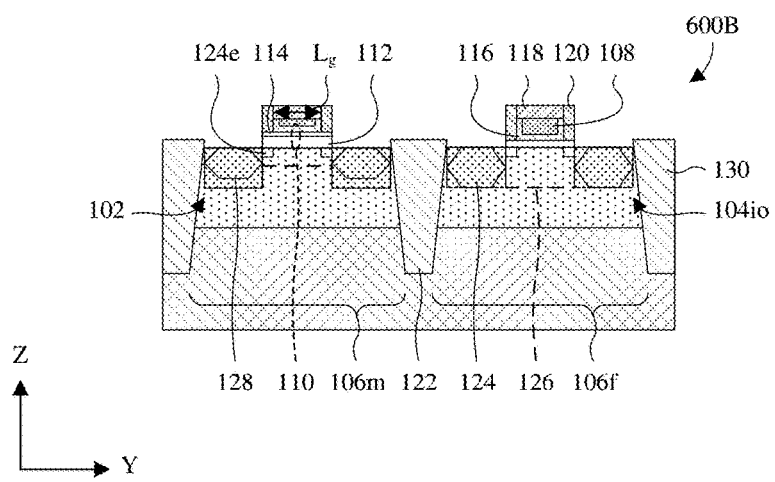

With reference to FIGS. 6A and 6B, cross-sectional views 600A, 600B of some alternative embodiments of the IC of FIG. 5 is provided.

As illustrated by the cross-sectional view 600A of FIG. 6A, the epitaxial structures 128 comprise corresponding first epitaxial layers 128a and corresponding second epitaxial layers 128b. In alternative embodiments, the epitaxial structures 128 comprise more epitaxial layers. The first epitaxial layers 128a define a periphery of the epitaxial structures 128 and separate the second epitaxial layers 128b from the semiconductor substrate 106. Further, the first and second epitaxial layers 128a, 128b have different material compositions. As discussed previously, by forming the epitaxial structures 128 with multiple epitaxial layers with different material compositions, material compositions of the epitaxial structures 128 may be finely tuned.

The first and second epitaxial layers 128a, 128b of the planar FET 102 have different profiles and thicknesses than the IO finFET 104io. For example, the first epitaxial layers 128a of the planar FET 102 may have a first thickness $T_p$ at sidewalls, whereas the first epitaxial layers 128a of the IO finFET 104io may have a second thickness $T_{fin}$ greater than the first thickness $T_p$ at sidewalls. The different profiles and thicknesses may, for example, be due to different epitaxial loading during formation of the epitaxial structures 128. For example, different feature densities and/or pitches around locations of the epitaxial structures 128 may lead to different etch rates while forming openings within which the epitaxial structures 128 are formed. As a result, the openings may have different heights and profiles. The different heights and profiles of the openings may lead to different epitaxial deposition rates while depositing the first and second epitaxial layers 128a, 128b. For example, surfaces with different orientations may have different deposition rates. As a result, the first and second epitaxial layers 128a, 128b of the planar FET 102 may be deposited with different profiles and thicknesses than the IO finFET 104io. In some embodiments, the first and second epitaxial layers 128a, 128b of the planar FET 102 may be deposited with different volumes than the IO finFET 104io.

Because the first and second epitaxial layers 128a, 128b of the planar FET 102 have different profiles and thickness than the IO finFET 104io, the epitaxial structures 128 of the planar FET 102 have a different material compositions than the epitaxial structures 128 of the IO finFET 104io. For example, a ratio between material of the first epitaxial layers 128a to material of the second epitaxial layers 128b may be different at the epitaxial structures 128 of the planar FET 102 than at the epitaxial structures 128 of the IO finFET 104io.

As illustrated by the cross-sectional view 600B of FIG. 6B, the gate length $L_g$ of the planar FET 102 is reduced so it's the same as or substantially the same as that of the IO finFET 104io. Further, the layout of the trench isolation structure 130 is varied.

Figure 7A:
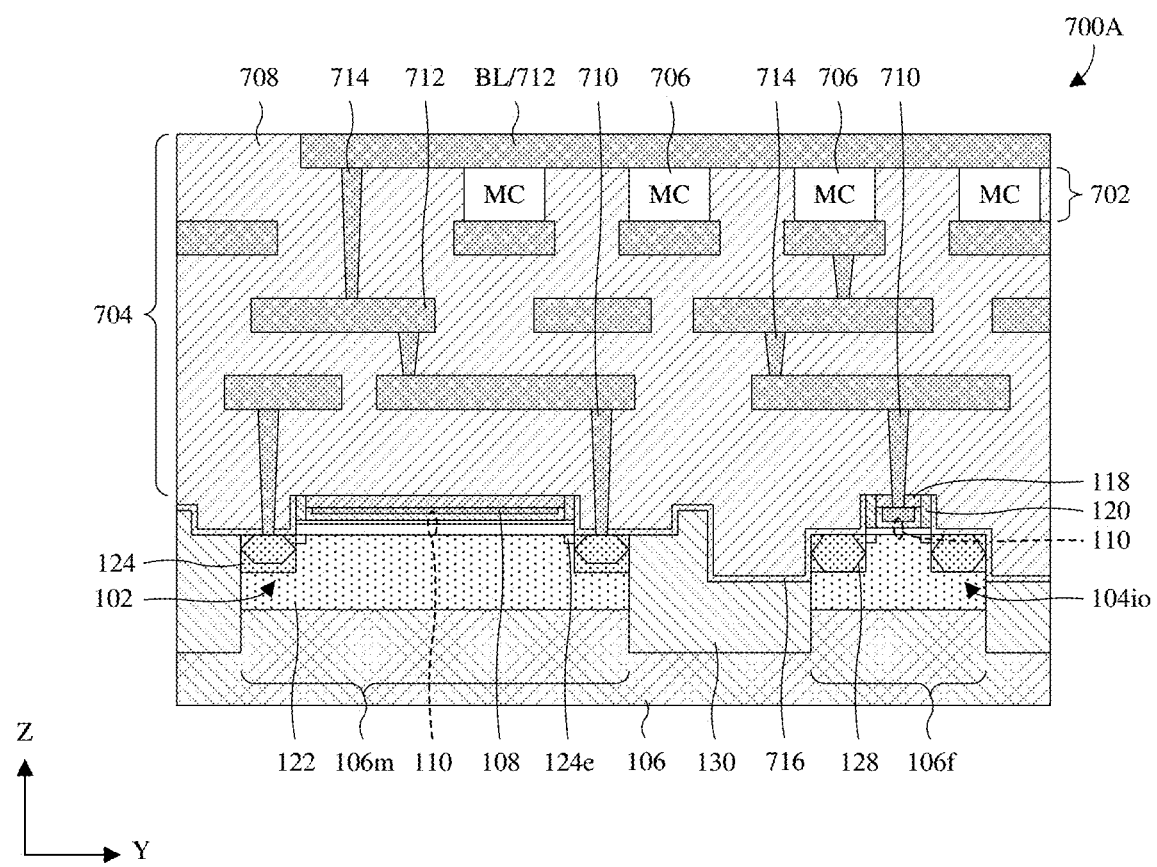
FIGS. 7A and 7B illustrate cross-sectional views of some embodiments of the IC of FIG. 5 in which the IC further comprises an interconnect structure.

With reference to FIG. 7A, a cross-sectional view 700A of some more detailed embodiments of the IC of FIG. 5 is provided in which the IC further comprises a memory array 702 and an interconnect structure 704 electrically coupled to the planar FET 102, the IO finFET 104io, and the memory array 702. The memory array 702 comprises a plurality of memory cells 706. The memory cells 706 are in a plurality of columns and, although not visible in the cross-sectional view 700A, may be in a plurality of rows. The memory cells 706 may, for example, be resistive random-access memory (RRAM) cells, magnetoresistive random-access memory (MRAM) cells, or some other suitable type of memory cells.

The interconnect structure 704 comprises an interconnect dielectric layer 708, and further comprises a plurality of contact vias 710, a plurality of wires 712, and a plurality of interwire vias 714. The interconnect dielectric layer 708 may be or comprise, for example, silicon oxide, a low k dielectric, some other suitable dielectric(s), or any combination of the foregoing. The contact vias 710, the wires 712, and the interwire vias 714 are alternatingly stacked in the interconnect dielectric layer 708 to define conductive paths leading from the planar FETs 102 and the IO finFET 104io. Such a conductive path may extend from a source/drain region of the planar FET 102 to a bit line BL of the memory array 702, which may be defined by one of the wires 712. The contact vias 710, the wires 712, and the interwire vias 714 may, for example, be or comprise metal and/or some other suitable conductive material(s).

A contact etch stop layer (CESL) 716 is between the trench isolation structure 130 and the interconnect structure 704 to provide an etch stop while forming the contact vias 710. For example, the CESL 716 may provide an etch stop while forming contact vias extending to the source/drain regions 124 of the planar FET 102 and the IO finFET 104io. The CESL 716 may, for example, be or comprise silicon nitride and/or some other suitable dielectric(s).

Figure 7B:
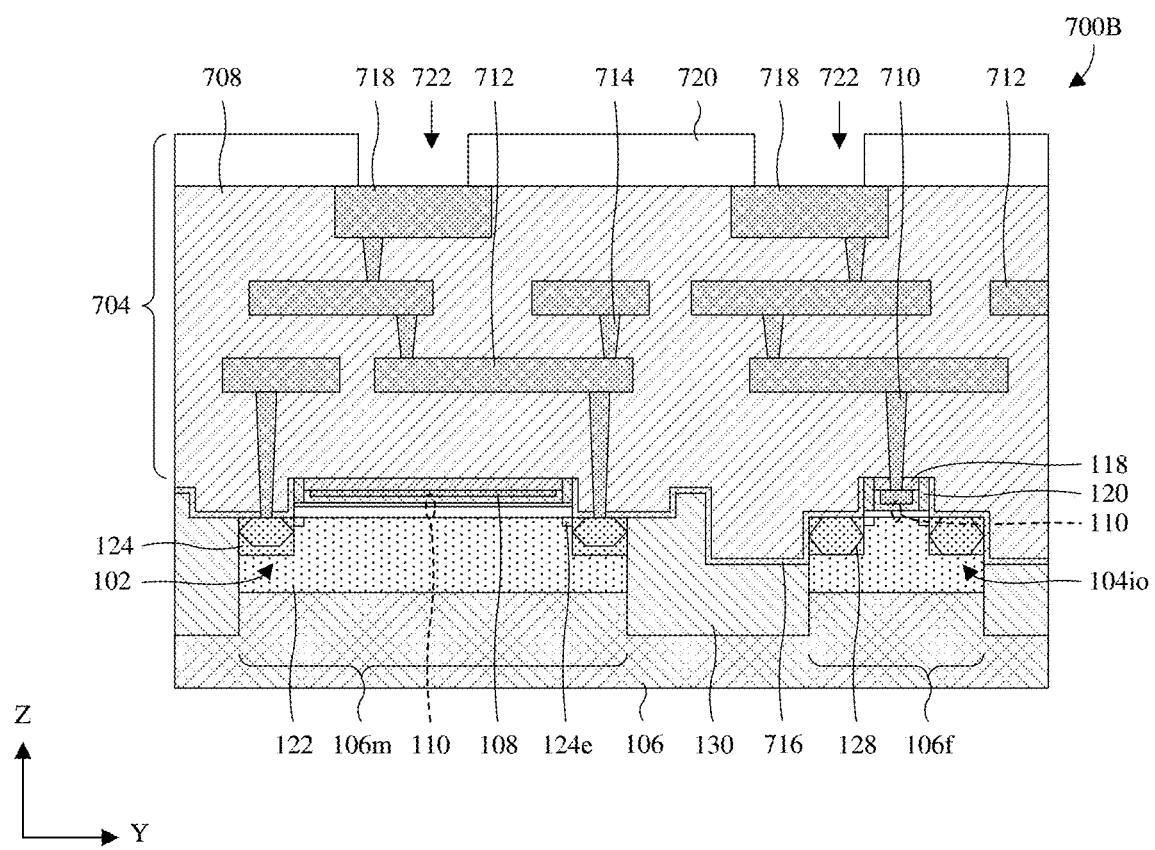

With reference to FIG. 7B, a cross-sectional view 700B of some alternative embodiments of the IC of FIG. 7A is provided in which the memory array 702 is omitted. Further, a plurality of pads 718 and a passivation layer 720 are along a top of the interconnect dielectric layer 708. The pads 718 may, for example, be employed for IO, ground, power, or some other application. The pads 718 are electrically coupled to the planar FET 102 and the IO finFET 104io by the contact vias 710, the wires 712, and the interwire vias 714. The passivation layer 720 overlies the interconnect dielectric layer 708 and defines pad openings 722 exposing the pads 718. The pad openings 722 may, for example, accommodate solder bumps or some other suitable conductive structures electrically coupling the pads 718 to structure external to the IC. The passivation layer 720 may, for example, be or comprise silicon oxide, silicon nitride, some other suitable dielectric(s), or any combination of the foregoing.

While FIGS. 5, 6A, 6B, 7A, and 7B are described with the IO finFET 104io, a core finFET 104c may replace the IO finFET 104io in alternative embodiments. The core finFET 104c may, for example, be as described and illustrated at FIGS. 1A-1D. Further, the planar FET 102 and/or the IO finFET 104io in any one of FIGS. 5, 6A, 6B, 7A, and 7B may be modified as described and illustrated in any one or combination FIGS. 3A-3E, 4A, and 4B in alternative embodiments. Further, the memory array 702 of FIG. 7A may be omitted in alternative embodiments.

With reference to FIGS. 8A and 8B, top and cross-sectional views 800A, 800B of some embodiments of an IC comprising a planar FET 102 and a plurality of finFETs 104 spaced in a direction extending transverse to corresponding channel lengths is provided. The cross-sectional view 800B of FIG. 8B may, for example, be taken along line D-D' in FIG. 8A.

The planar FET 102 and the finFETs 104 are as described at FIGS. 1A-1D except that the finFETs 104 share a gate stack 802 and certain features (e.g., device wells, the trench isolation structure, etc.) are omitted. These omitted features may be present in alternative embodiments. The gate stack 802 comprises a gate dielectric layer (see, e.g., 110 at FIGS. 1A-1D), a gate electrode (see, e.g., 108 at FIGS. 1A-1D) overlying the gate dielectric layer, and a hard mask 118 overlying the gate electrode. In alternative embodiments, at least one of the finFETs 104 has an individual gate stack and/or at least two of the finFETs 104, but less than all of the finFETs 104, share a gate stack 802 with each other but not a remainder of the finFETs 104.

The epitaxial structures 128 of the planar FET 102 (e.g., planar epitaxial structures) have a first height $H_p$, whereas the epitaxial structures 128 of the finFETs 104 (e.g., fin epitaxial structures) have a second height $H_{fin}$ greater than the first height $H_p$. Further, top surfaces of the planar epitaxial structures are recessed relative to top surfaces of the fin epitaxial structures, and bottom surfaces of the planar epitaxial structures are elevated above bottom surfaces of the fin epitaxial structures. As described above, this variation between the epitaxial structures 128 may be due to different epitaxial loads at the planar FET 102 and at the finFETs 104.

Figure 9A:
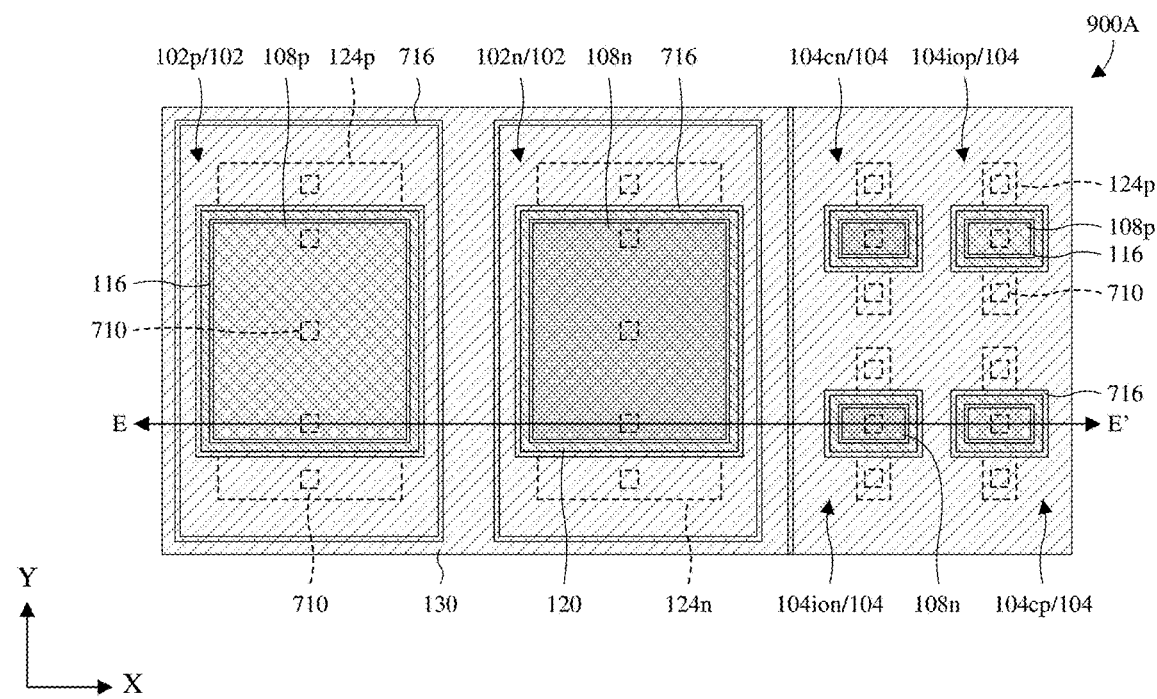
FIGS. 9A and 9B respectively illustrate top and cross-sectional views of some embodiments of an IC comprising a plurality of planar FETs and a plurality of finFETs that are electrically coupled to an interconnect structure.
Figure 9B:
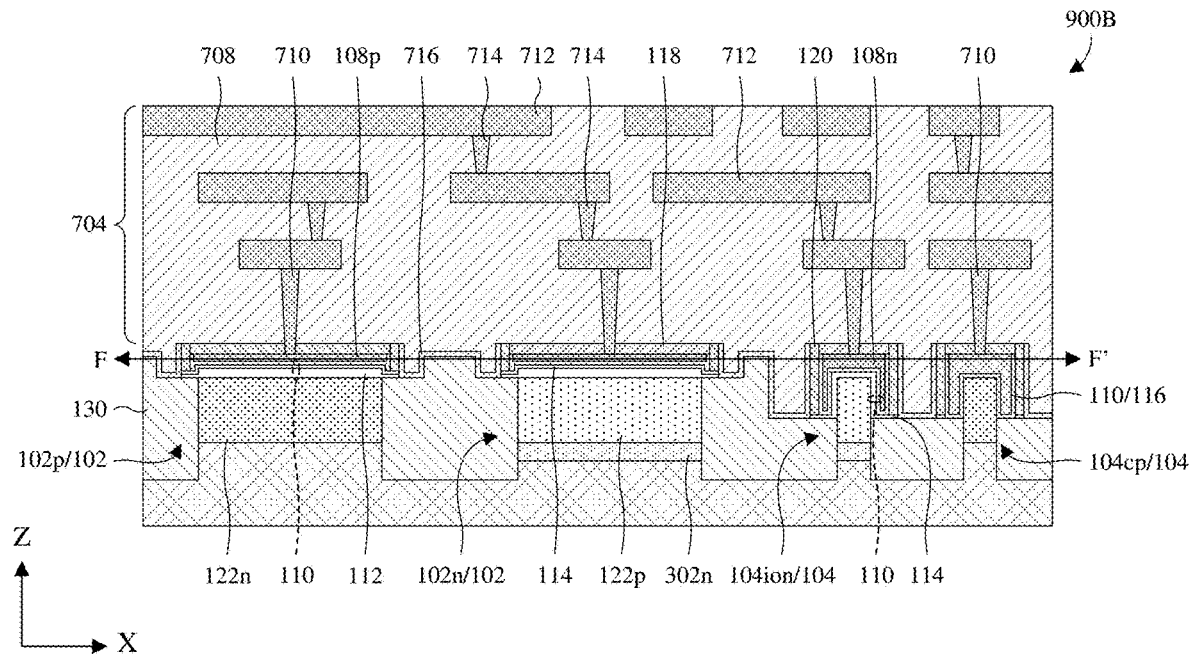

With reference to FIGS. 9A and 9B, top and cross-sectional views 900A, 900B of some embodiments of an IC comprising a plurality of planar FETs 102 and a plurality of finFETs 104 that are electrically coupled to an interconnect structure 704 is provided. The cross-sectional view 900B of FIG. 9B may, for example, be taken along line E-E' in FIG. 9A, whereas the top view 900A of FIG. 9A may, for example, be taken along line F-F' in FIG. 9B.

The plurality of planar FETs 102 comprises an N-type planar FET 102n and a P-type planar FET 102p. Further, the plurality of finFETs 104 comprises an N-type IO finFET 104ion, an N-type core finFET 104cn, a P-type IO finFET 104iop, and a P-type core finFET 104cp. The N-type planar FET 102n, the N-type IO finFET 104ion, and the N-type core finFET 104cn are respectively as the planar FET 102, the IO finFET 104io, and the core finFET 104c are illustrated and described at FIGS. 1A-1D, except that these N-type FETs respectively have N-type gate electrodes 108n and N-type source/drain regions 124n (shown in phantom). Further, these N-type FETs have P-type device wells 122p and deep N wells 302n respectively underlying the P-type device wells 122p. The P-type planar FET 102p, the P-type IO finFET 104iop, and the P-type core finFET 104cp are respectively as the planar FET 102, the IO finFET 104io, and the core finFET 104c are illustrated and described at FIGS. 1A-1D, except that these P-type FETs respectively have P-type gate electrodes 108p and P-type source/drain regions 124p (shown in phantom). Further, these P-type FETs have N-type device wells 122n.

The N-type gate electrodes 108n are gate electrodes having an N-type work function. An n-type work function may, for example, be: 1) a work function within about 0.1 electron volts (eV), about 0.2 eV, or about 0.4 eV of a work function for N-type polycrystalline or monocrystalline silicon; 2) a work function less than about 4.0, about 4.2, or about 4.4 eV; 3) a work function between about 3.5-4.4 eV, about 4.0-4.4 eV, or about 3.8-4.5 eV; 4) some other suitable n-type work function; or 5) any combination of the foregoing. The P-type gate electrodes 108p are gate electrodes having a P-type work function. A P-type work function may, for example, be: 1) a work function within about 0.1, 0.2, or 0.4 eV of a work function for p-type polycrystalline or monocrystalline silicon; 2) a work function greater than about 4.8 eV, about 5.0 eV, or about 5.2 eV; 3) a work function between about 4.8-5.2 eV, about 5.0-5.4 eV, or about 4.6-5.6 eV; 4) some other suitable p-type work function; or 5) any combination of the foregoing. The N-type and P-type gate electrode 108p may, for example, be or comprise metal, doped polysilicon, some other suitable conductive materials, or any combination of the foregoing.

The interconnect structure 704 comprises an interconnect dielectric layer 708, and further comprises a plurality of contact vias 710, a plurality of wires 712, and a plurality of interwire vias 714 stacked in the interconnect dielectric layer 708. Further, the interconnect structure 704 is separated from the trench isolation structure 130 by a CESL 716. The interconnect structure 704 and the CESL 716 may, for example, be as described with regard to FIG. 7A. In some embodiments, the interconnect structure 704 further comprises a passivation layer 720, pads 718, and corresponding pad openings 722 in the passivation layer 720 as illustrated at FIG. 7B. In some embodiments, the pads 718 are electrically coupled to the planar FETs 102 and/or the finFETs 104 by the contact vias 710, the wires 712, and the interwire vias 714.

With reference to FIGS. 10A and 10B through FIGS. 13A and 13B, FIGS. 14A-14C through FIGS. 23A-23C, FIGS. 24A and 24B, FIGS. 25A-25D through FIGS. 28A-28D, FIGS. 29A and 29B through FIGS. 37A and 37B, a series of views of some embodiments of a method for forming an IC comprising a planar FET and a finFET is provided. Figures labeled with a suffix of B illustrate cross-sectional views along line E-E' in like-numbered figures with a suffix of A. For FIGS. 14A-14C through FIGS. 23A-23C, figures labeled with a suffix of C illustrate perspective views of like-numbered figures with suffixes of A and B. For FIGS. 25A-25D through FIGS. 28A-28D, figures labeled with a suffix of C illustrate cross-sectional views along line G-G' or H-H' (whichever is present) in like-numbered figures with a suffix of A. For FIGS. 25A-25D through FIGS. 28A-28D, figures labeled with a suffix of D illustrate cross-sectional views along line I-I', J-J', or K-K' (whichever is present) in like-numbered figures with a suffix of A. The method is illustrated by formation of the IC of FIGS. 9A and 9B, but may also be employed to form the IC in any one or combination of FIGS. 1A-1D, 2, 3A-3E, 4A, 4B, 5, 6A, 6B, 7A, 7B, 8A, and 8B. Further, the method may be employed to form other suitable ICs.

Figure 10A:
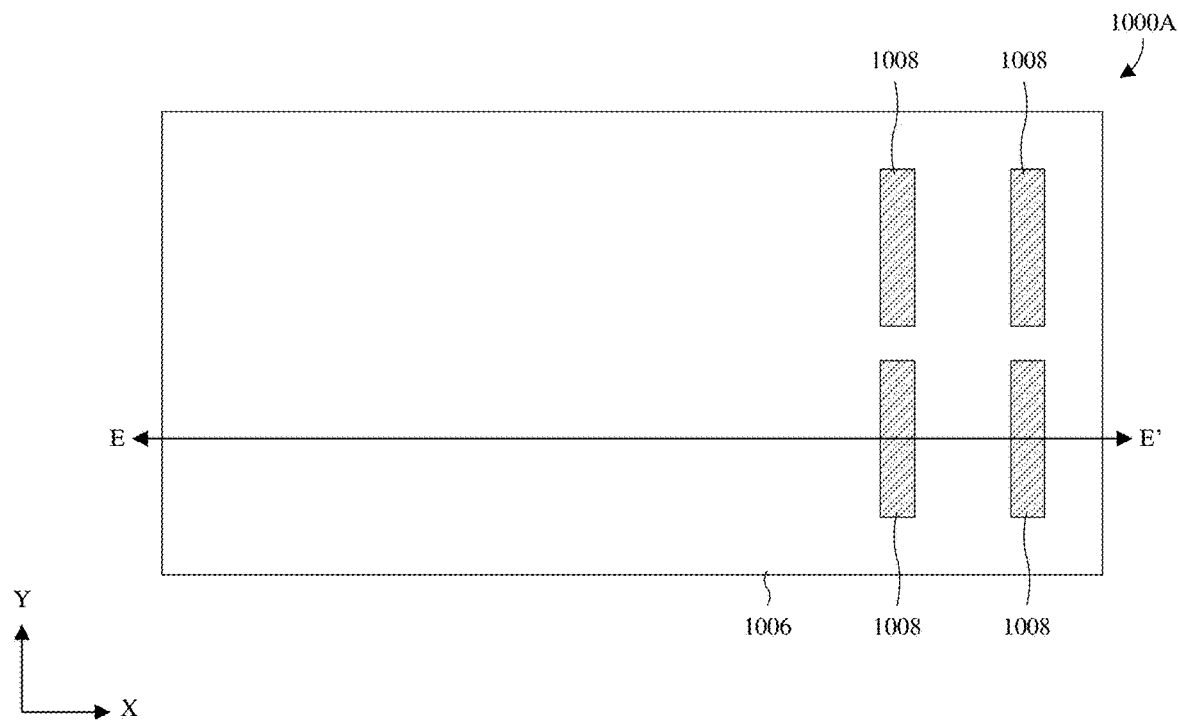
Figure 10B:
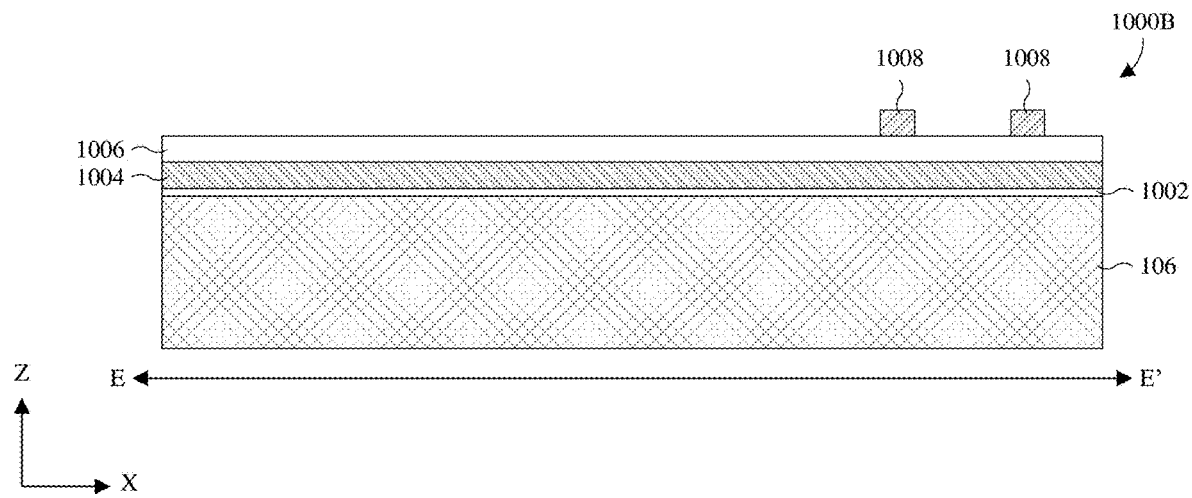

As illustrated by the views 1000A, 1000B of FIGS. 10A and 10B, a first pad layer 1002, a second pad layer 1004, and a first hard mask layer 1006 are deposited over a semiconductor substrate 106. The first pad layer 1002 and/or the first hard mask layer 1006 may, for example, be or comprise silicon oxide and/or some other suitable dielectric(s). The second pad layer 1004 may, for example, be or comprise silicon nitride and/or some other suitable dielectric(s). In some embodiments, the first pad layer 1002 and the first hard mask layer 1006 are or comprise silicon oxide, and the second pad layer 1004 is or comprise silicon nitride.

Also illustrated by the views 1000A, 1000B of FIGS. 10A and 10B, a second hard mask layer 1008 is deposited over the first hard mask layer 1006 and patterned with a pattern for fins hereafter formed. The second hard mask layer 1008 may, for example, be or comprise silicon nitride and/or some other suitable dielectric(s). In some embodiments, the second hard mask layer 1008 is or comprise the same material as the second pad layer 1004.

Figure 11A:
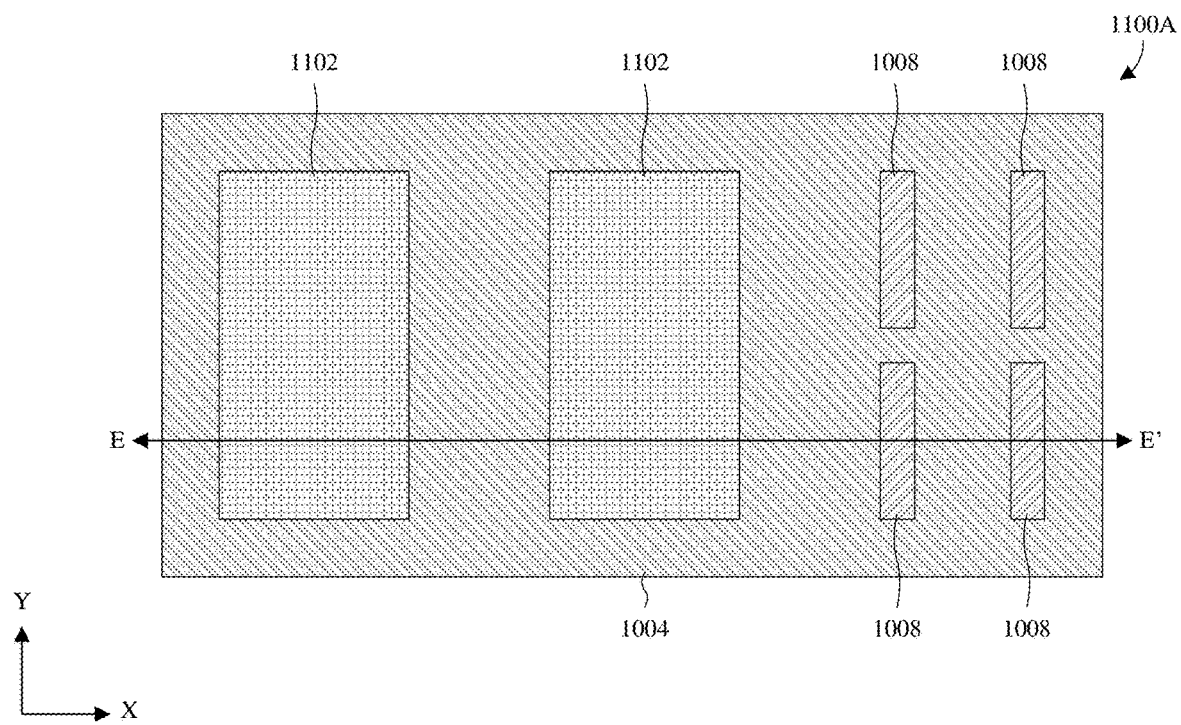
Figure 11B:
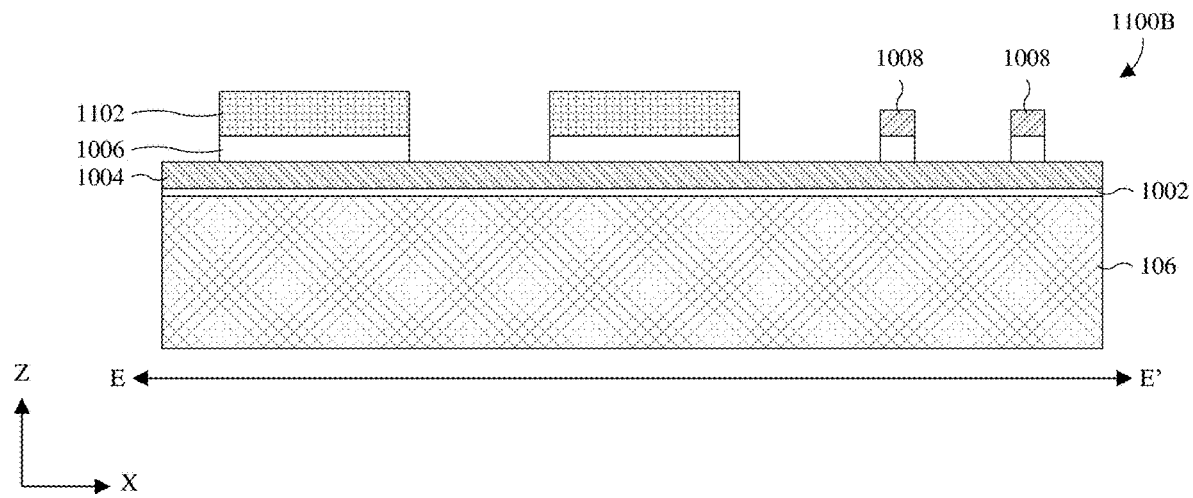

As illustrated by the views 1100A, 1100B of FIGS. 11A and 11B, the first hard mask layer 1006 is patterned with a pattern for fins and mesas hereafter formed. Such patterning may, for example, comprise: 1) forming a photoresist mask 1102 having a pattern for the mesas using photolithography; 2) performing an etch into the first hard mask layer 1006 using the photoresist mask 1102 and the second hard mask layer 1008 as a mask; and 3) removing the photoresist mask 1102. Other suitable patterning processes are, however, amenable.

Figure 12A:
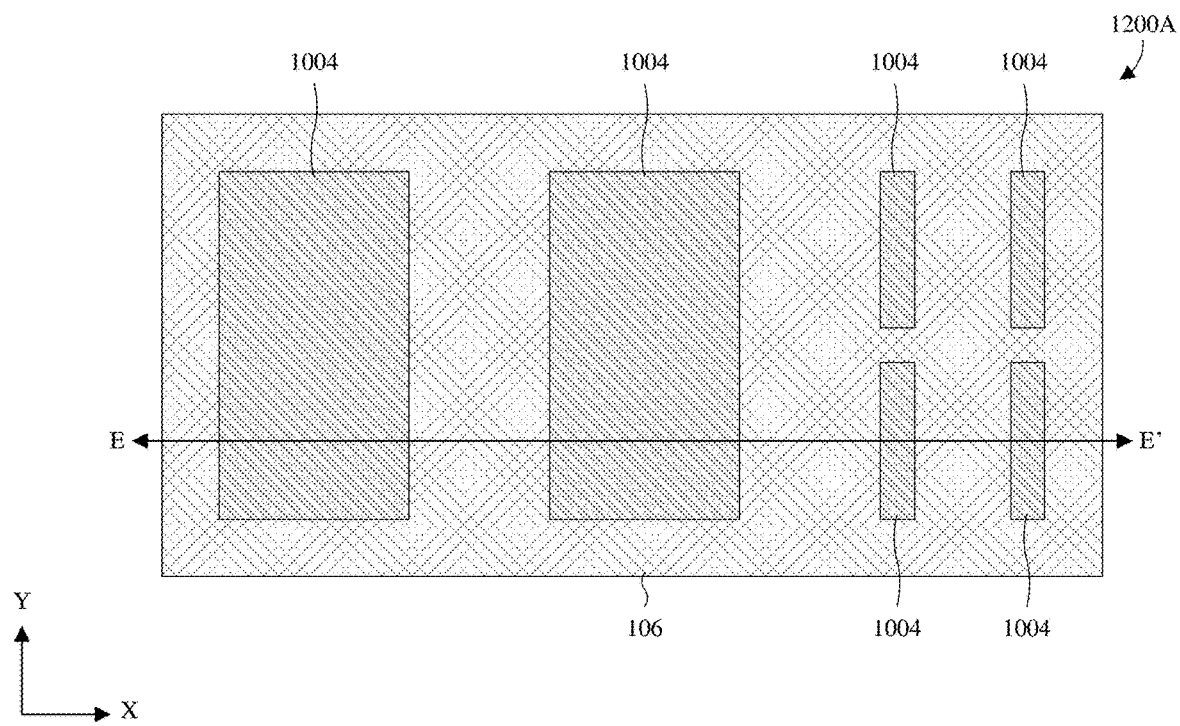
Figure 12B:
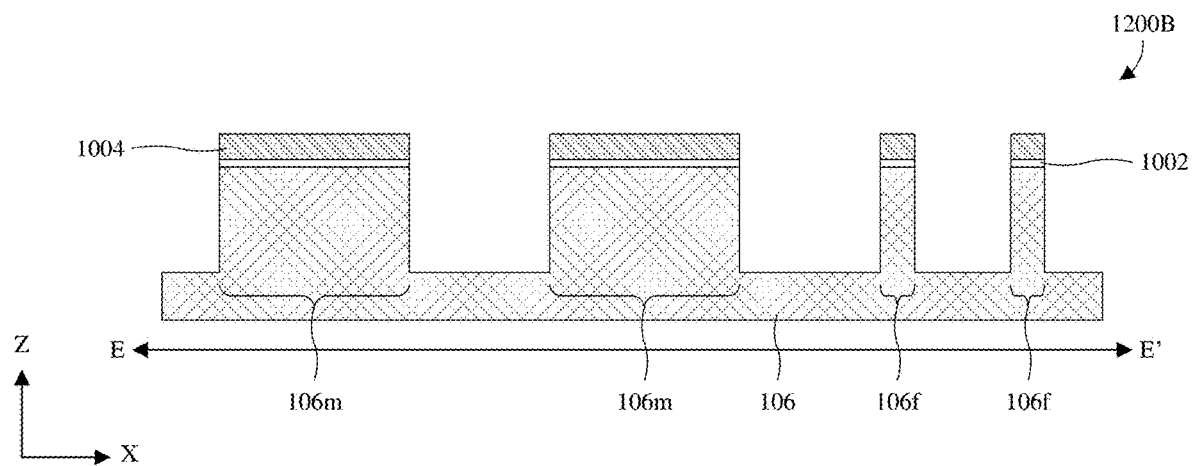

As illustrated by the views 1200A, 1200B of FIGS. 12A and 12B, a first etch is performed into the semiconductor substrate 106 and the first and second pad layers 1002, 1004 with the first and second hard mask layers 1006, 1008 (see, e.g., FIGS. 11A and 11B) in place to form a plurality of mesas 106m and a plurality of fins 106f. As seen hereafter, the mesas 106m correspond to an N-type planar FET and a P-type planar FET being formed. Further, the fins 106f correspond to an N-type IO finFET, an N-type core finFET, a P-type IO finFET, and a P-type core finFET being formed. In alternative embodiments, the mesas 106m and/or the fins 106f correspond to different device types and/or combinations of device types. For example, the mesas 106m may correspond to N-type planar FETs, but not P-type planar FETs, in alternative embodiments.

Also illustrated by the views 1200A, 1200B of FIGS. 12A and 12B, the first and second hard mask layers 1006, 1008 (see, e.g., FIGS. 11A and 11B) are removed. The removal may, for example, be performed as part of the first etch. Alternatively, the removal may, for example, be performed independent of and after the first etch.

Figure 13A:
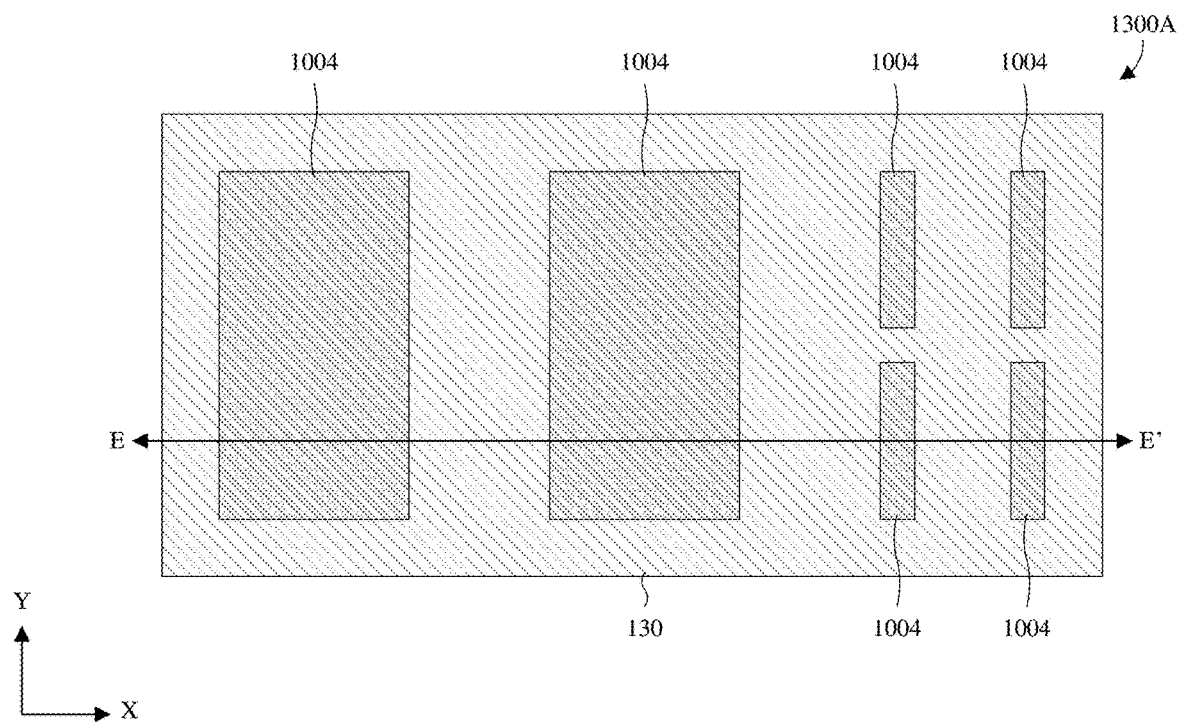
Figure 13B:
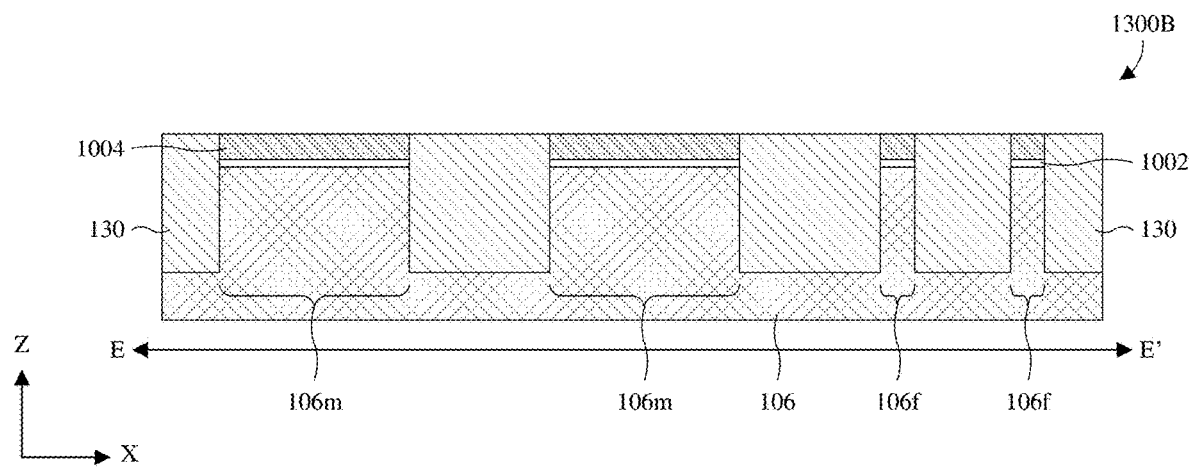

As illustrated by the views 1300A, 1300B of FIGS. 13A and 13B, a trench isolation structure 130 is formed around the mesas 106m and the fins 106f. A process for forming the trench isolation structure 130 may, for example, comprise: 1) depositing a dielectric layer covering and surrounding the mesas 106m and the fins; and 2) performing a planarization into the dielectric layer until a top surface of the dielectric layer is about even with a top surface of the second pad layer 1004. Other suitable processes are, however, amenable.

Figure 14A:
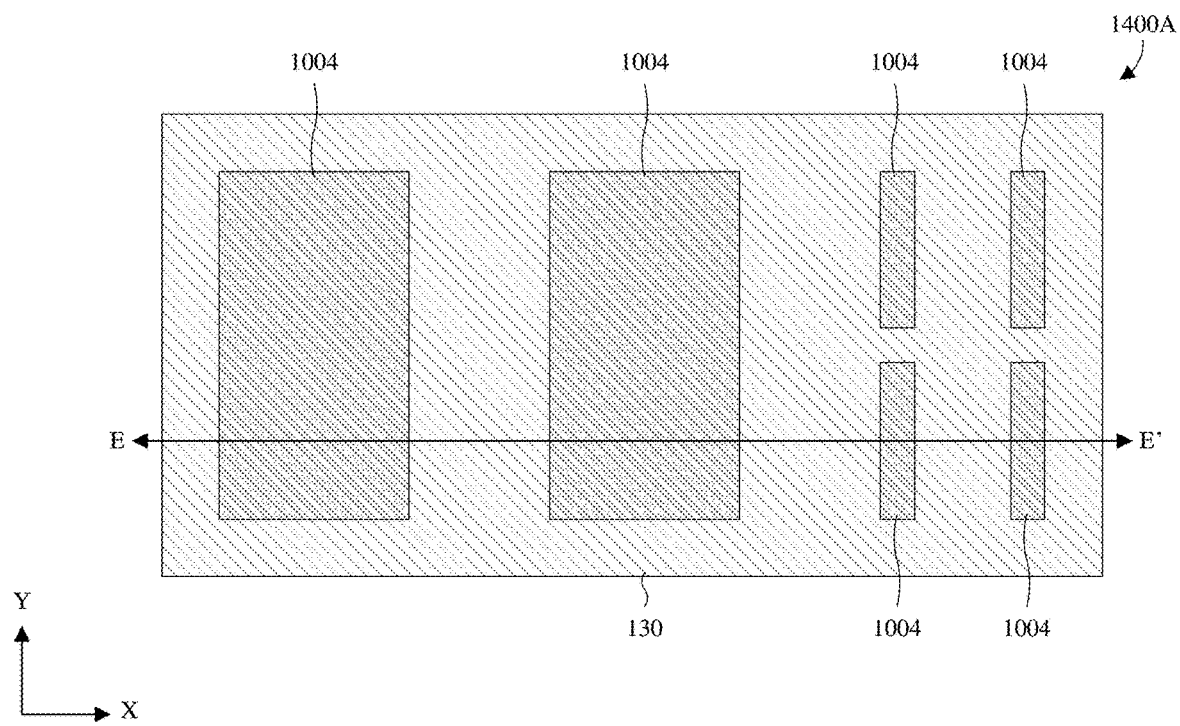
Figure 14B:
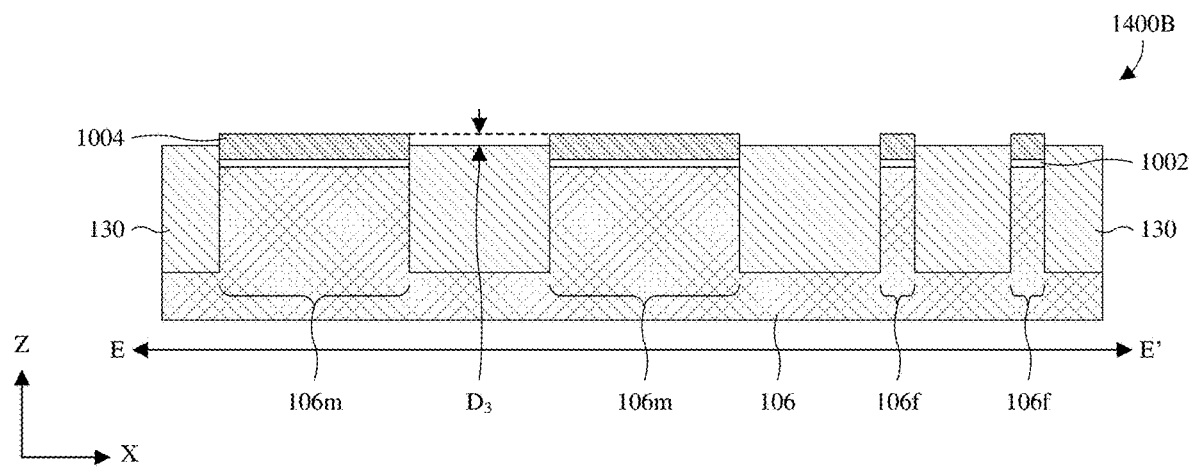
Figure 14C:
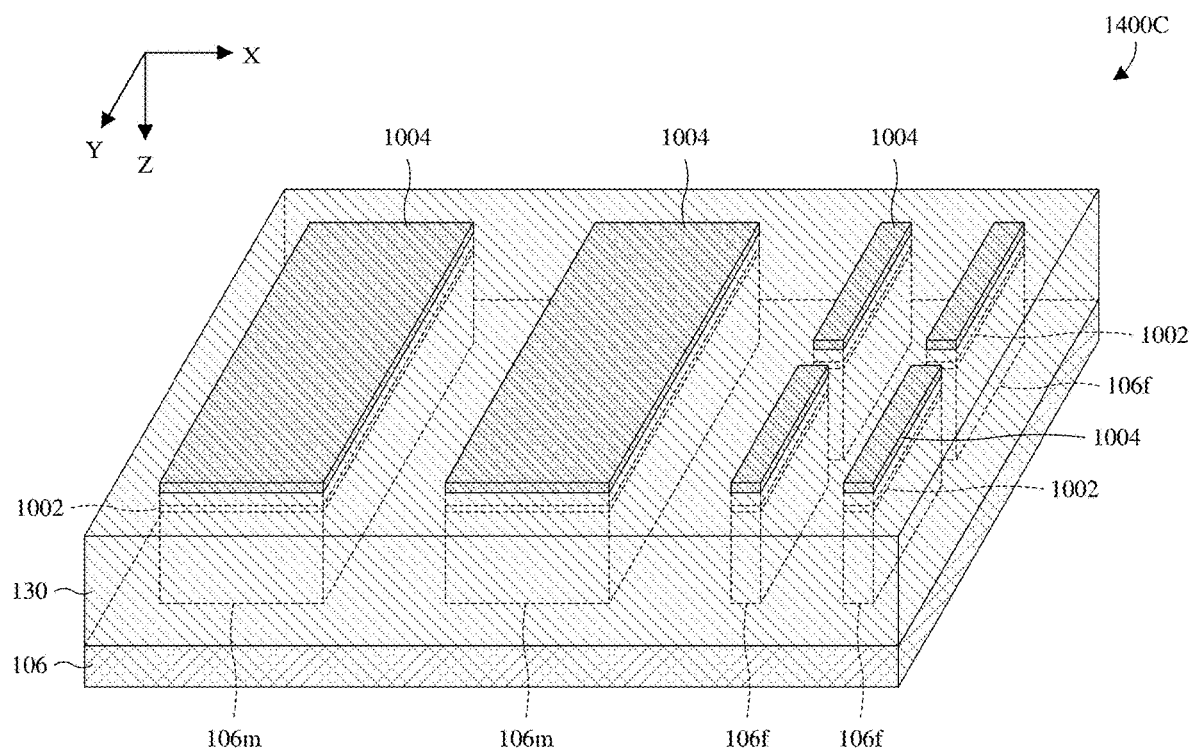

As illustrated by the views 1400A-1400C of FIGS. 14A-14C, a second etch is performed into the trench isolation structure 130 to recess a top surface of the trench isolation structure 130 relative to a top surface of the second pad layer 1004 by a distance $D_3$. The recessing may, for example, enhance subsequent removal of second pad layer 1004 by exposing sidewalls of the second pad layer 1004 to etchants used for the removal. The second etch may, for example, be performed by a non-plasma dry etch and/or some other suitable etch type. In some embodiments, but not all embodiments, the second etch is anisotropic.

Figure 15A:
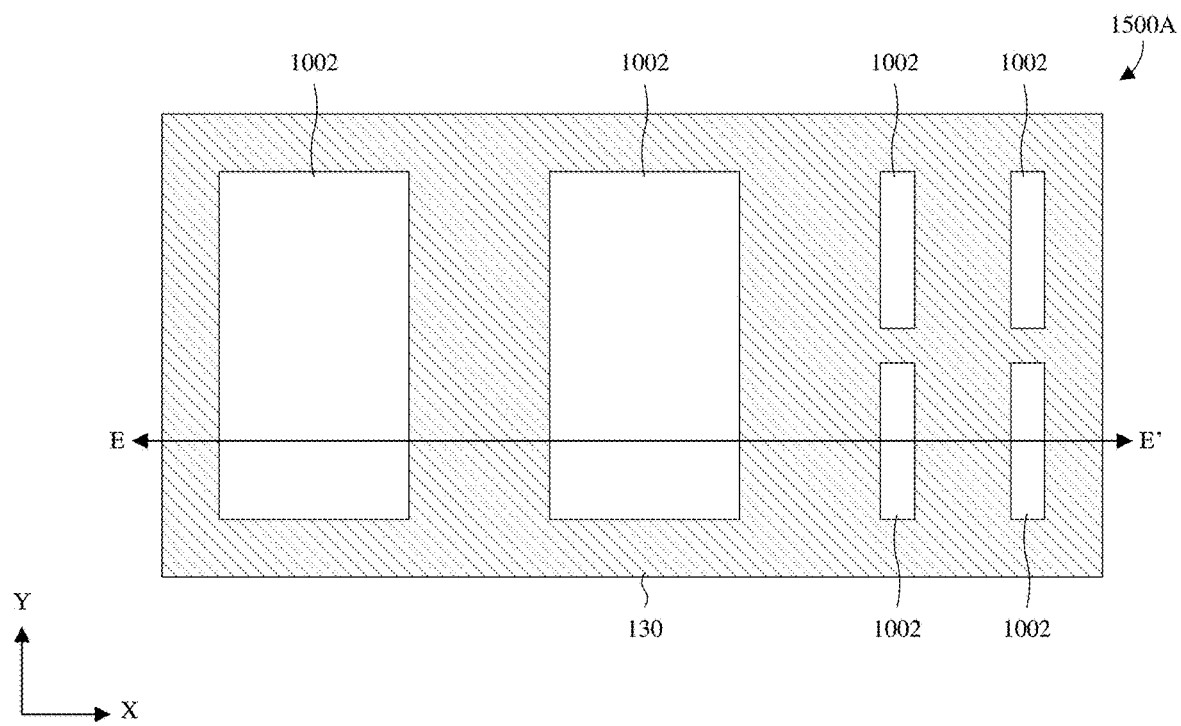
Figure 15B:
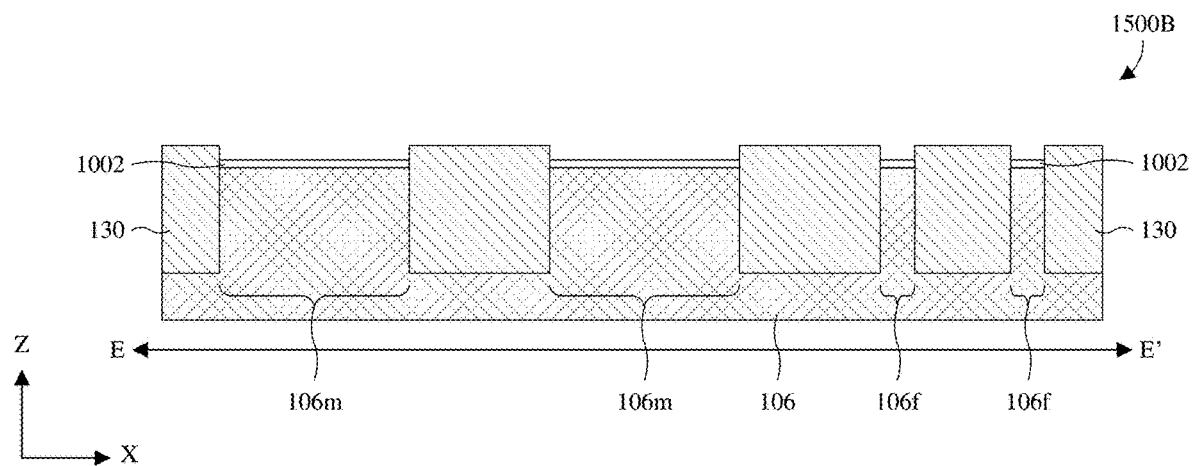
Figure 15C:
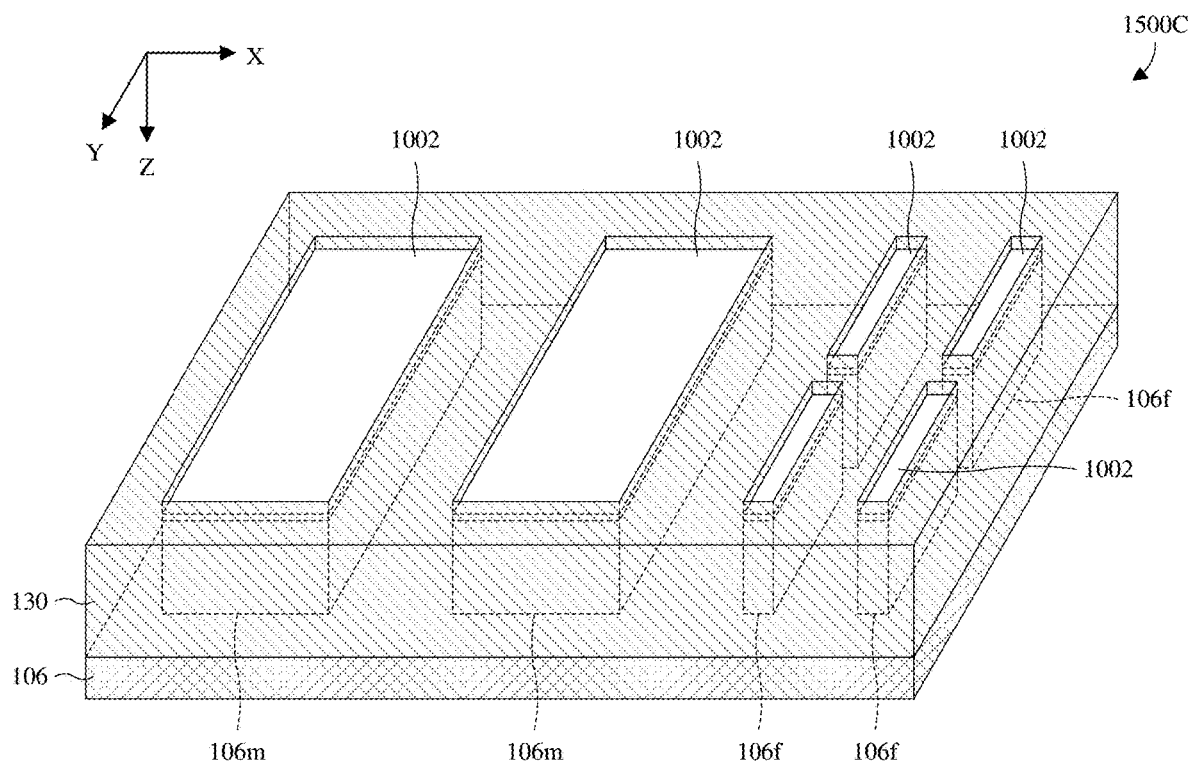

As illustrated by the views 1500A-1500C of FIGS. 15A-15C, a third etch is performed into the second pad layer 1004 (see, e.g., FIGS. 14A-14C) to remove the second pad layer 1004 and to expose the first pad layer 1002. The third etch may, for example, be performed by a wet etch or some other suitable type of etch.

Figure 16A:
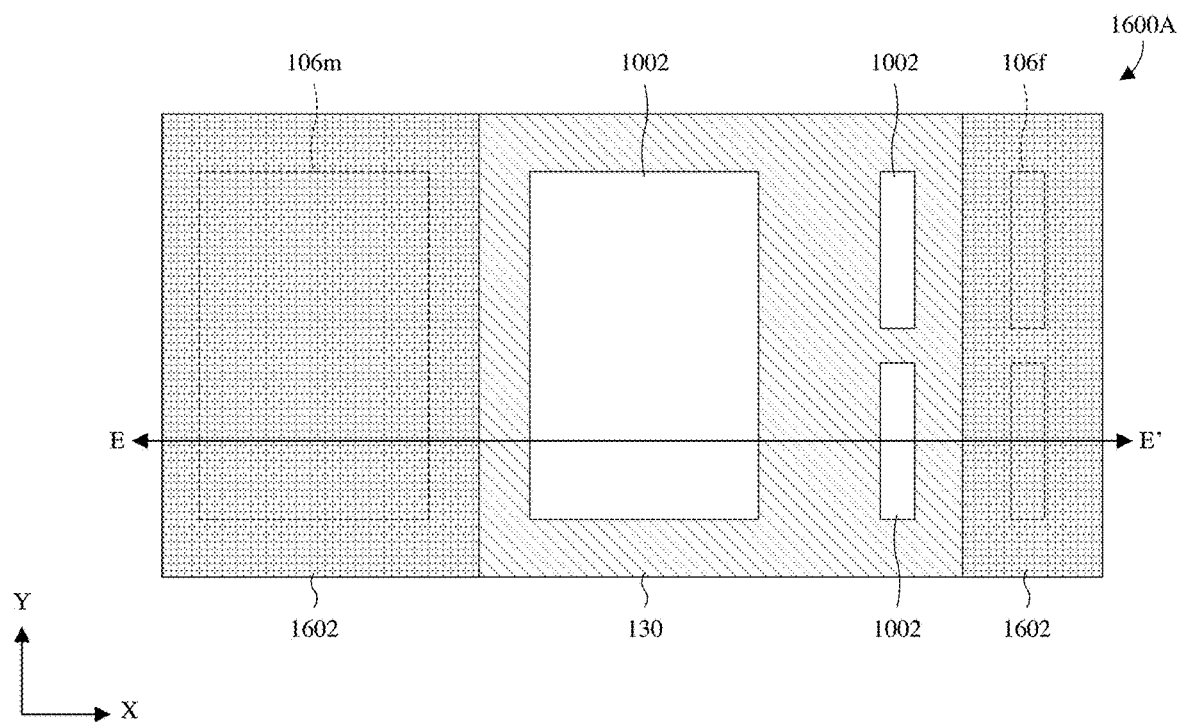
Figure 16B:
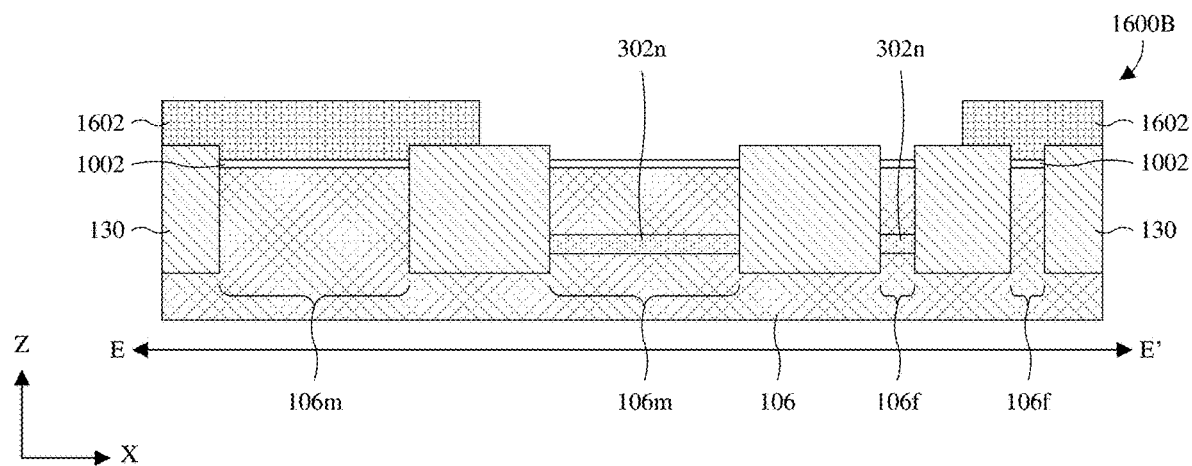
Figure 16C:
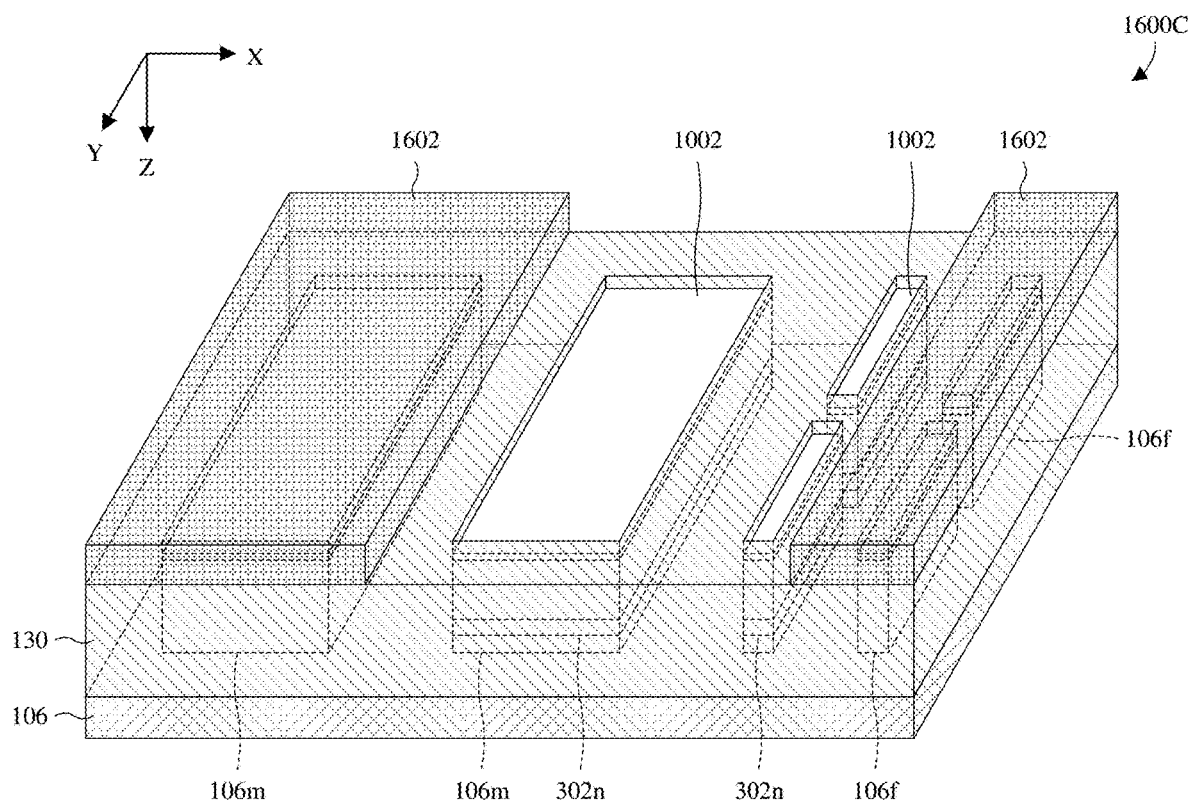

As illustrated by the views 1600A-1600C of FIGS. 16A-16C, deep N wells 302n are formed respectively in the fins 106f for the N-type finFETs being formed and the mesa 106m for the N-type planar FET being formed. In alternative embodiments, the deep N wells 302n are not formed. A process for forming the deep N wells 302n may, for example, comprise: 1) forming a photoresist mask 1602 masking the fins 106f for the P-type finFETs being formed and the mesa 106m for the P-type planar FET being formed using photolithography; 2) implanting dopants into the semiconductor substrate 106 with the photoresist mask 1602 in place; 3) removing the photoresist mask 1602; and 4) activating the dopants by annealing. Other suitable processes are, however, amenable. In some embodiments, the process is preceded by a photoresist cleaning process. The photoresist cleaning process and/or the removing of the photoresist mask 1602 may, for example, be performed by a Caro's acid strip or some other suitable process.

Figure 17A:
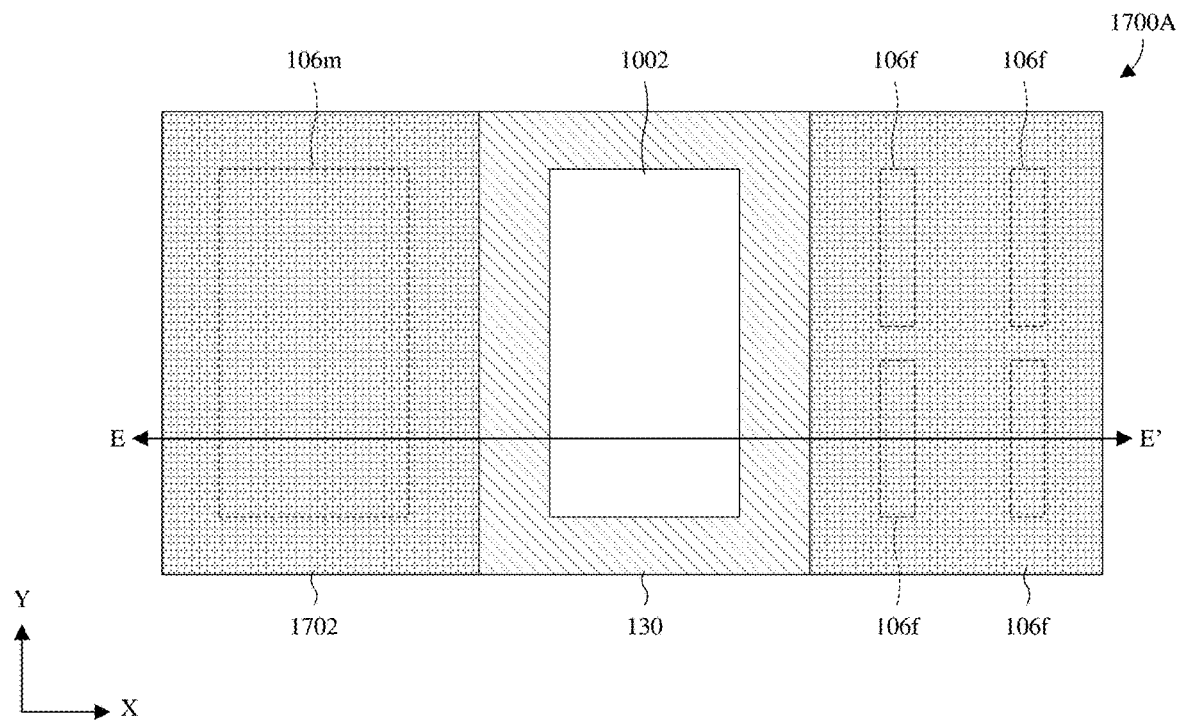
Figure 17B:
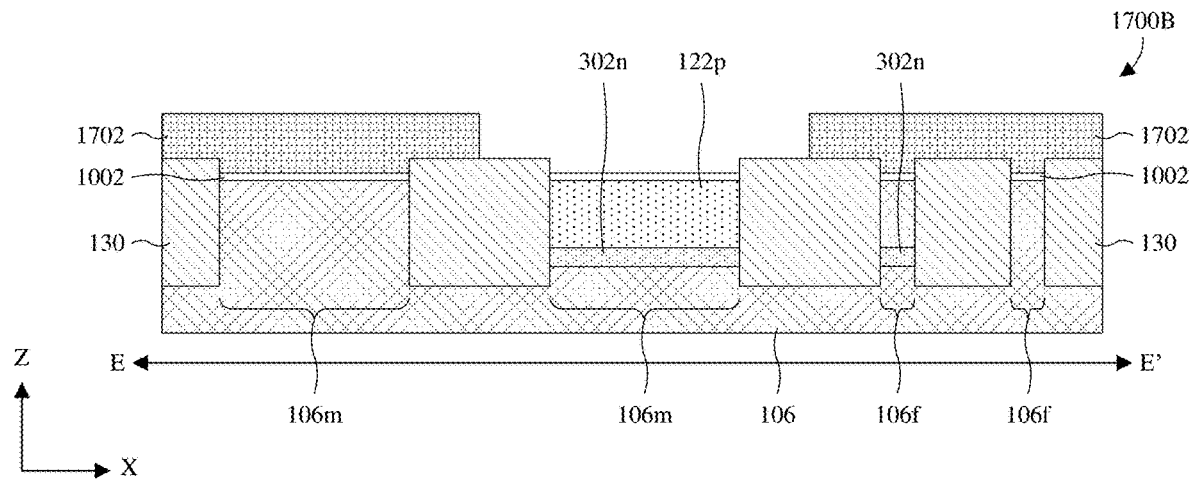
Figure 17C:
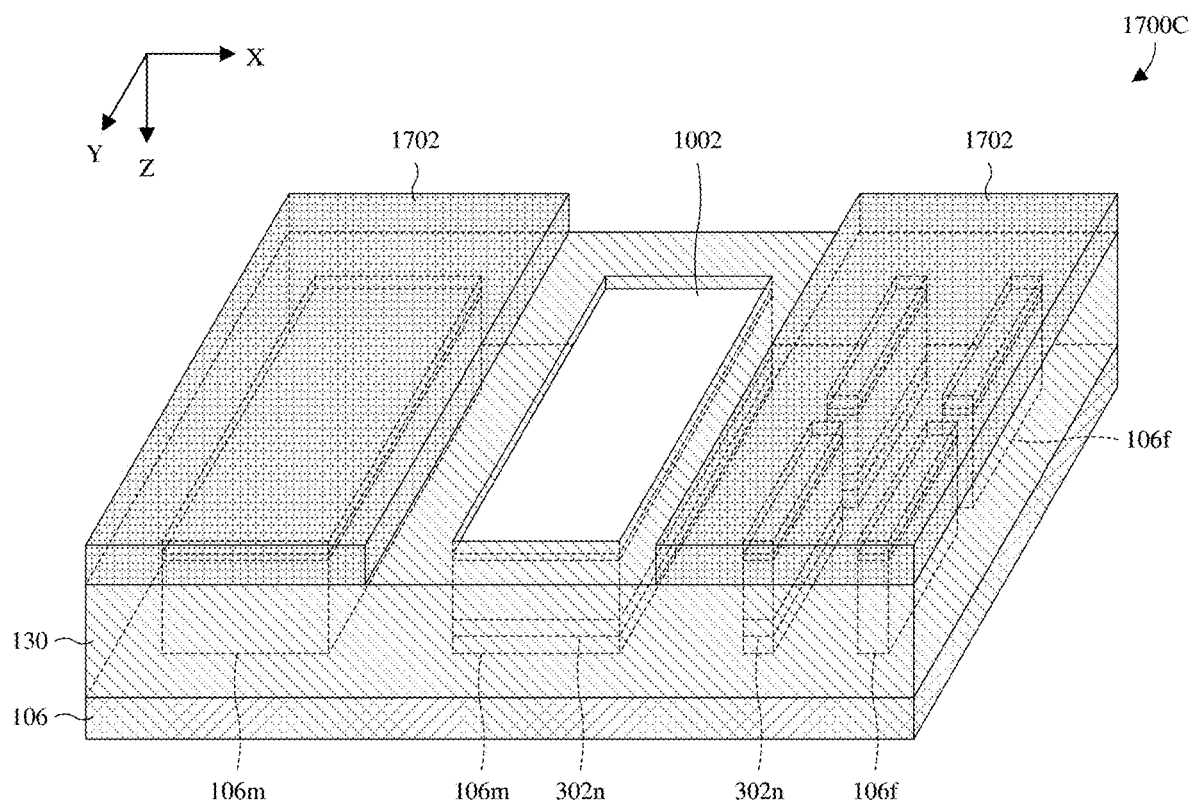

As illustrated by the views 1700A-1700C of FIGS. 17A-17C, a P-type device well 122p is formed overlying a corresponding deep N well 302n in the mesa 106m for the N-type planar FET being formed. A process for forming the P-type device well 122p may, for example, comprise: 1) forming a photoresist mask 1702 masking the fins 106f and the mesa 106m for the P-type planar FET being formed using photolithography; 2) implanting dopants into the semiconductor substrate 106 with the photoresist mask 1702 in place; and 3) removing the photoresist mask 1702. Other suitable processes are, however, amenable. The photoresist mask 1702 may, for example, be removed using a Caro's acid strip or some other suitable process.

Figure 18A:
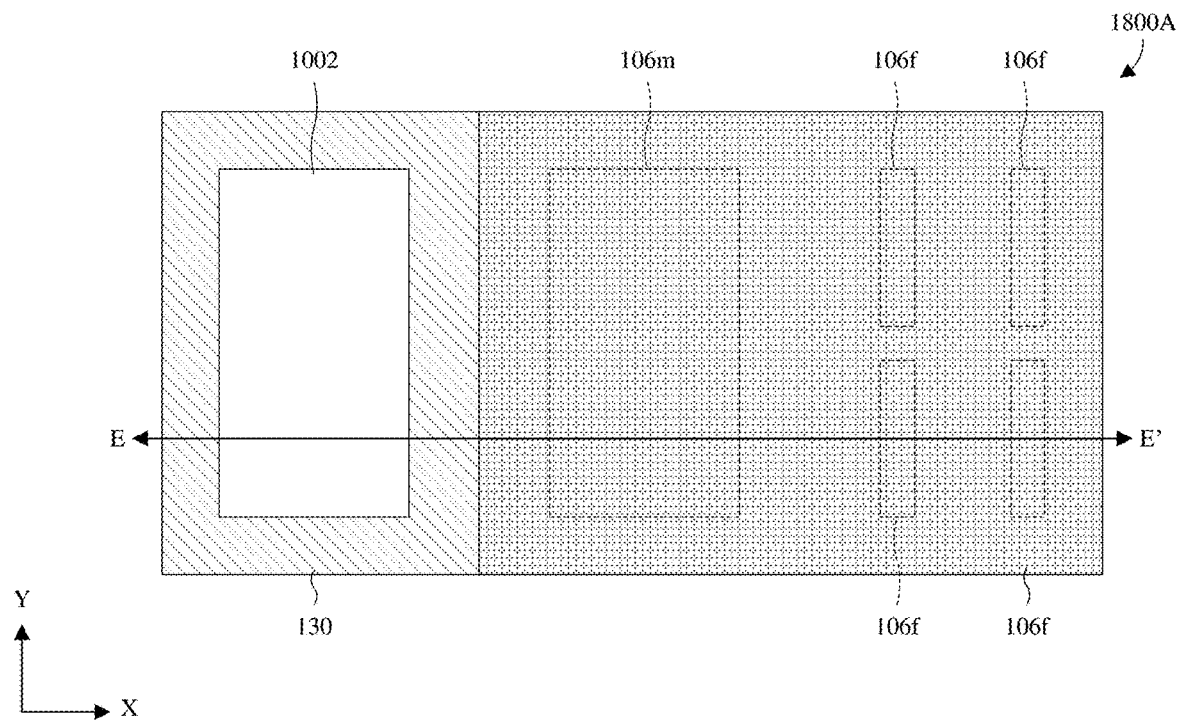
Figure 18B:
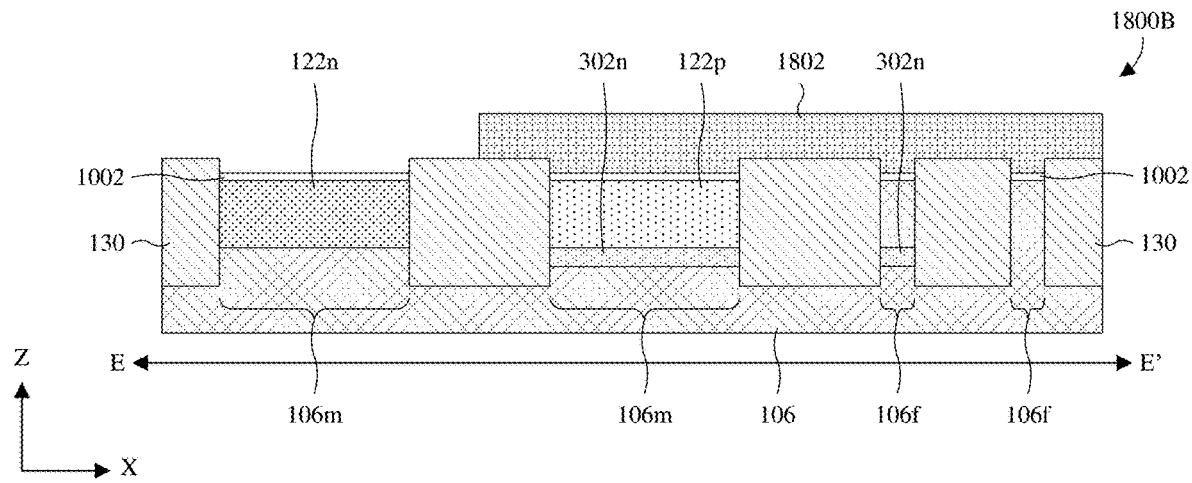
Figure 18C:
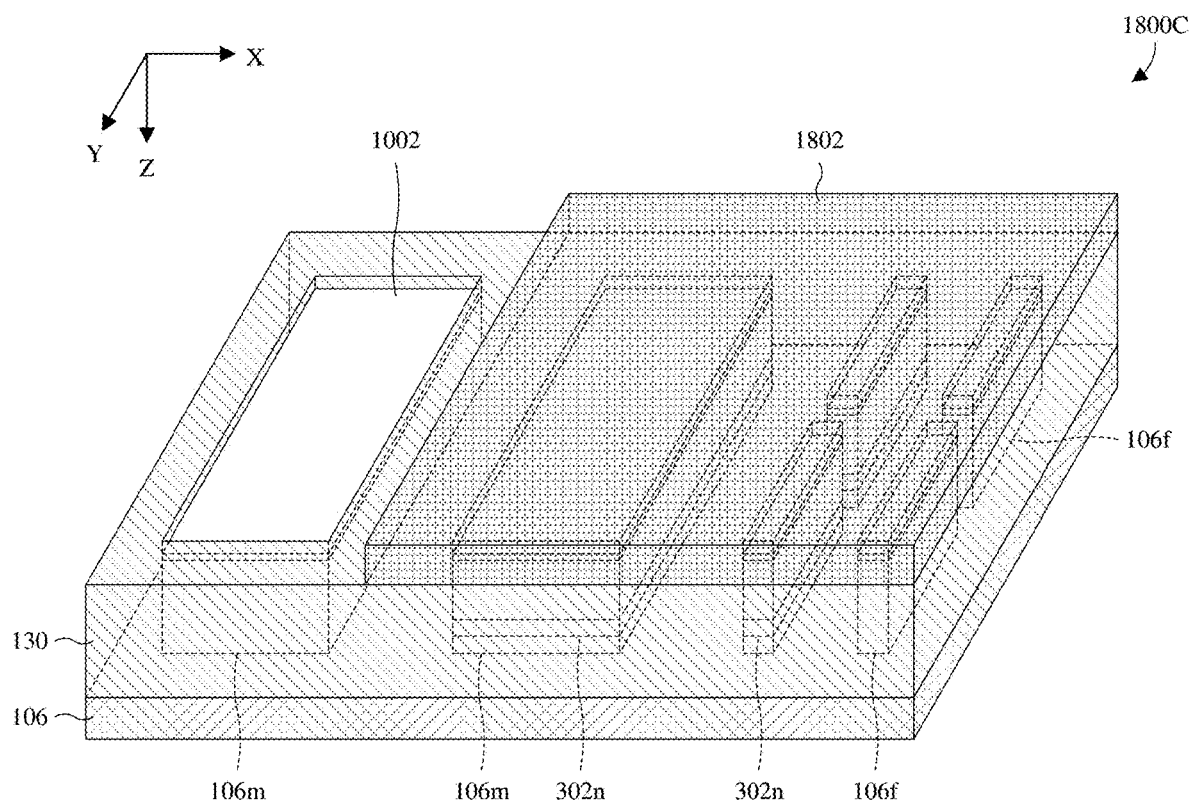

As illustrated by the views 1800A-1800C of FIGS. 18A-18C, an N-type device well 122n is formed in the mesa 106m for the P-type planar FET. A process for forming the N-type device well 122n may, for example, comprise: 1) forming a photoresist mask 1802 masking the fins 106f and the mesa 106m for the N-type planar FET being formed using photolithography; 2) implanting dopants into the semiconductor substrate 106 with the photoresist mask 1802 in place; and 3) removing the photoresist mask 1802. Other suitable processes are, however, amenable. The photoresist mask 1802 may, for example, be removed using a Caro's acid strip or some other suitable process.

Figure 19A:
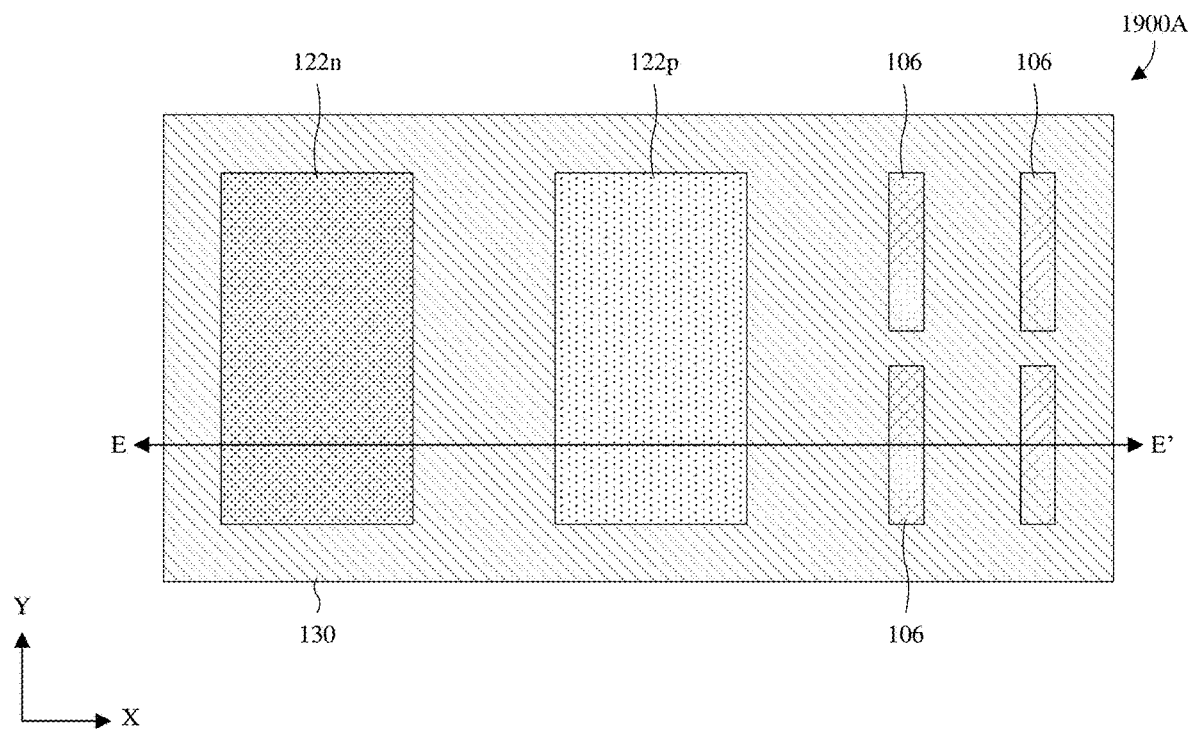
Figure 19B:
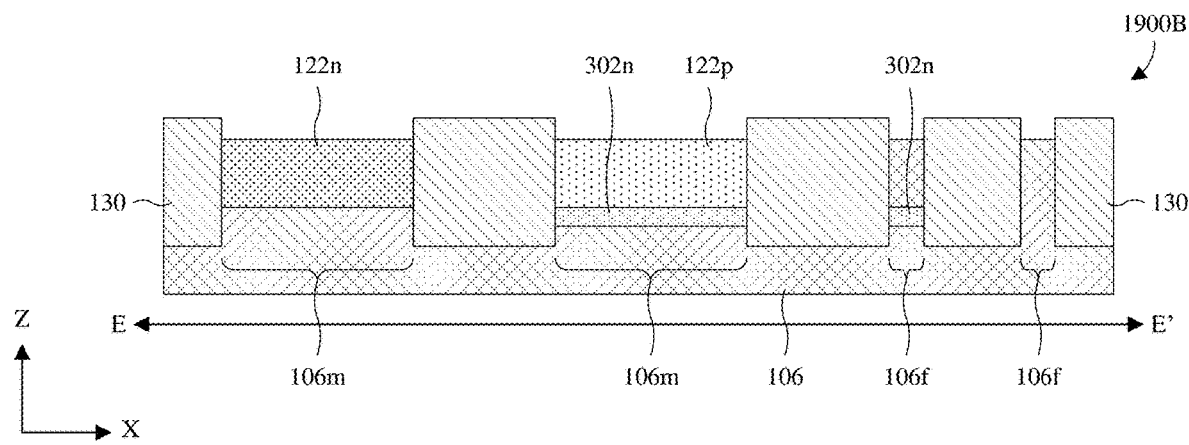
Figure 19C:
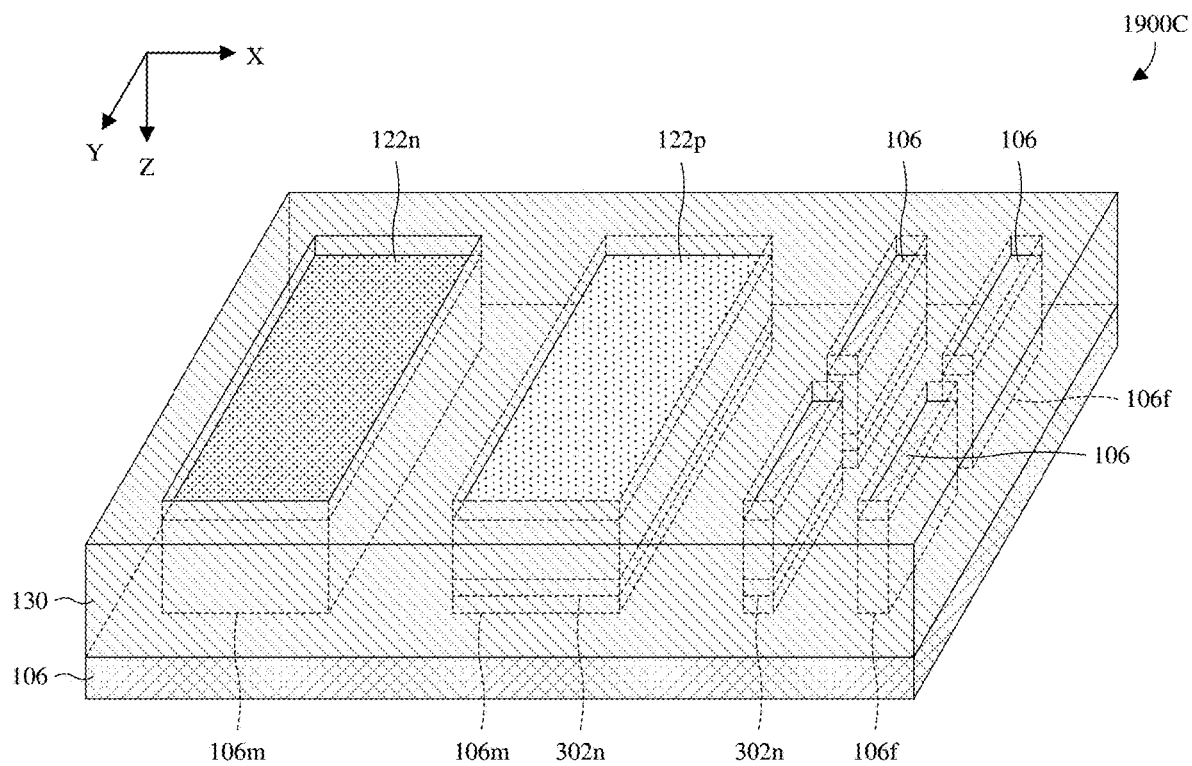

As illustrated by the views 1900A-1900C of FIGS. 19A-19C, a fourth etch is performed into the first pad layer 1002 (see, e.g., FIGS. 18A-18C) to remove the first pad layer 1002. The fourth etch may, for example, be performed by a dry etch or some other suitable type of etch.

Figure 20A:
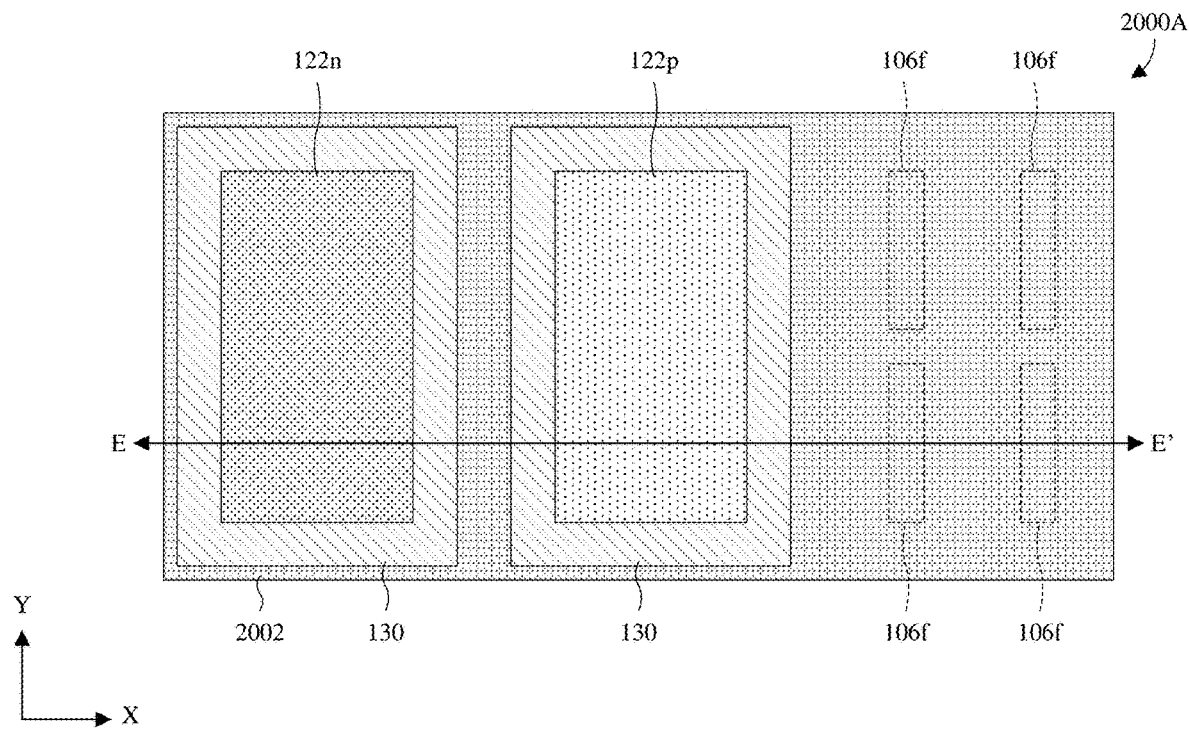
Figure 20B:
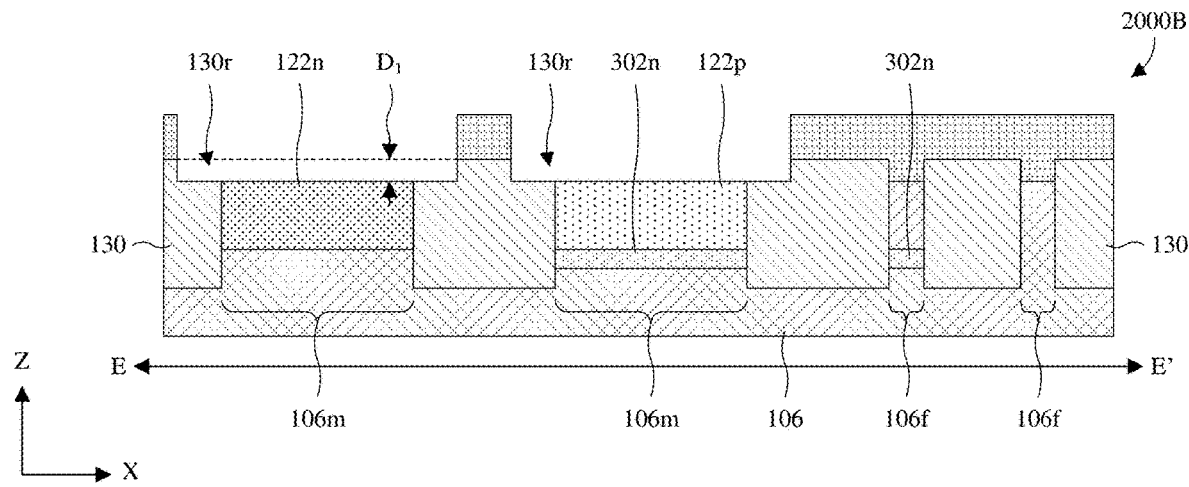
Figure 20C:
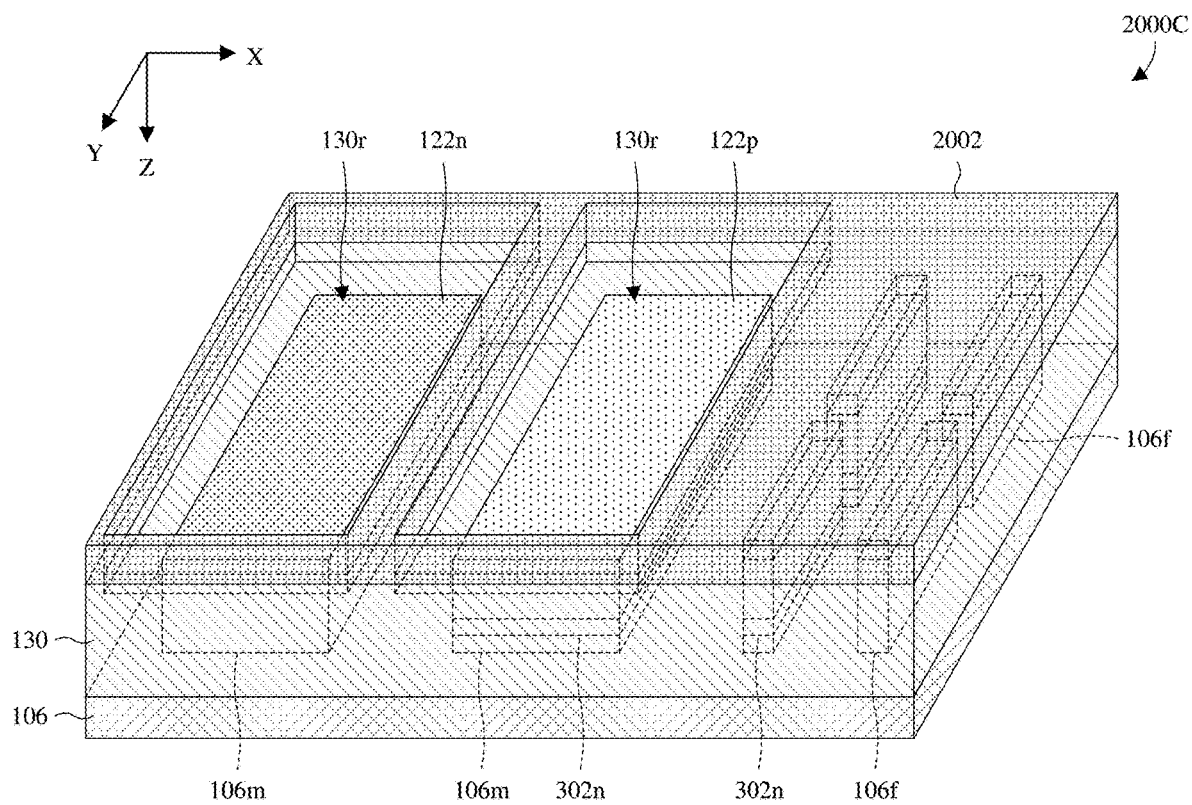

As illustrated by the views 2000A-2000C of FIGS. 20A-20C, the trench isolation structure 130 is patterned to form recesses 130r that extend in closed paths respectively along peripheries of the mesa 106m. The recesses 130r are formed so top surfaces of the mesas 106m are even with or about even with recessed top surface portions of the trench isolation structure 130 and sidewalls of the trench isolation structure 130 that adjoin the mesas 106m have top edges even with or about even with the top surfaces of the mesas 106m. It has been appreciated this may, for example, enhance performance of the planar FETs being formed on the mesas 106m. For example, edges of the mesas 106m extending along channel lengths of the planar FETs may have a high concentration of defects that negatively affect the saturation current and off current for the planar FETs. The recesses 130r change the structure at the edges to at least partially mitigate the effect of the defects and to enhance the saturation current and off current for the planar FETs. This may, in turn, enhance reliability of the planar FETs.

In some embodiments, a distance $D_1$ from the top surfaces of the mesas 106m to the top surface of the trench isolation structure 130 is greater than about 4 nanometers, about 6 nanometers, or some other suitable value. In alternative embodiments, the distance $D_1$ is less than or equal to about 4 nanometers, about 6 nanometers, or some other suitable value. In at least some of such embodiments, the patterning and the resulting recesses 130r may be omitted because of a minimal performance improvement. This may lead to a cost savings.

The patterning may, for example, comprise: 1) forming a photoresist mask 2002 having a pattern for the recesses 130r using photolithography; 2) performing an etch into the trench isolation structure 130 with the photoresist mask 2002 in place; and 3) removing the photoresist mask 2002. Other suitable patterning processes are, however, amenable. The etch may, for example, be performed by a wet etch or some other suitable type of etch. The photoresist mask 2002 may, for example, be removed using a Caro's acid strip or some other suitable process.

Figure 21A:
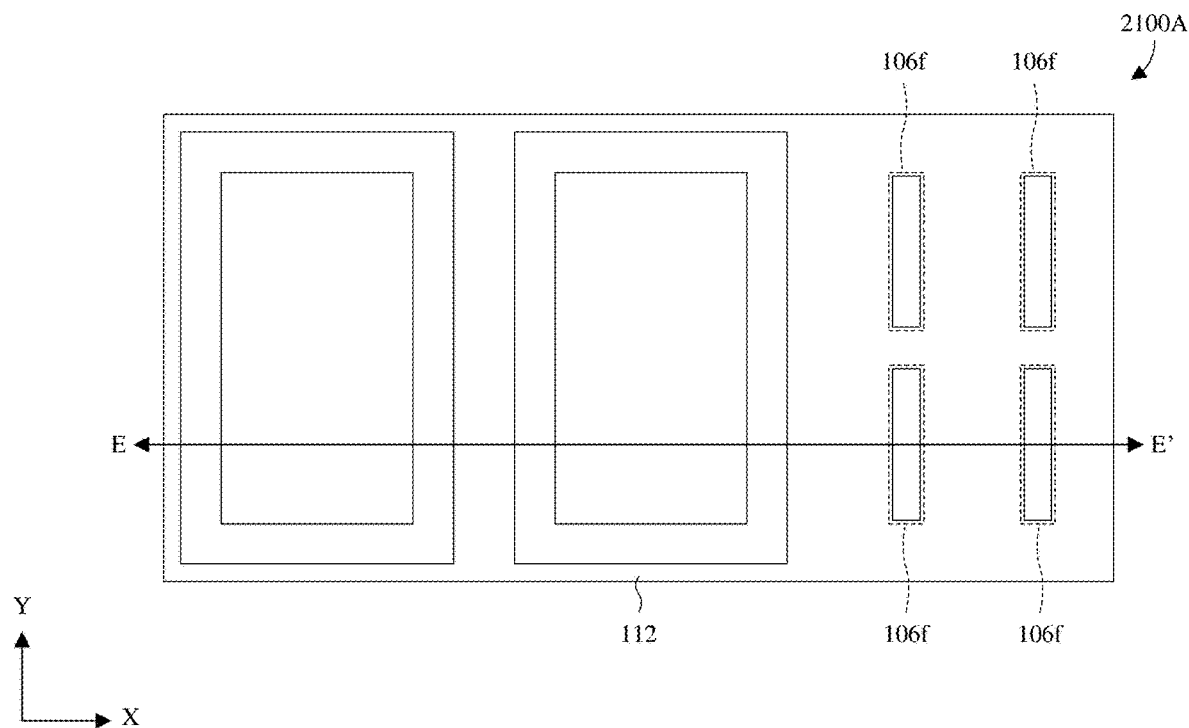
Figure 21B:
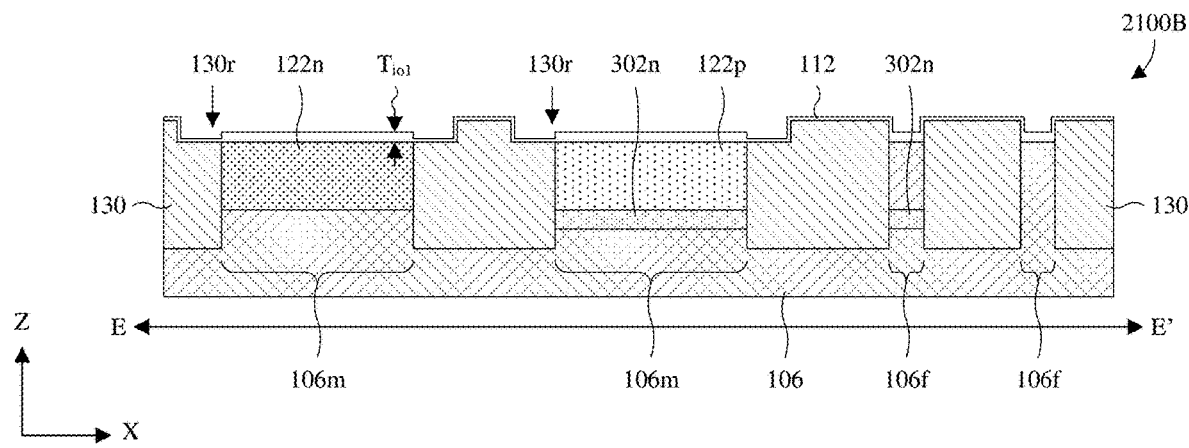
Figure 21C:
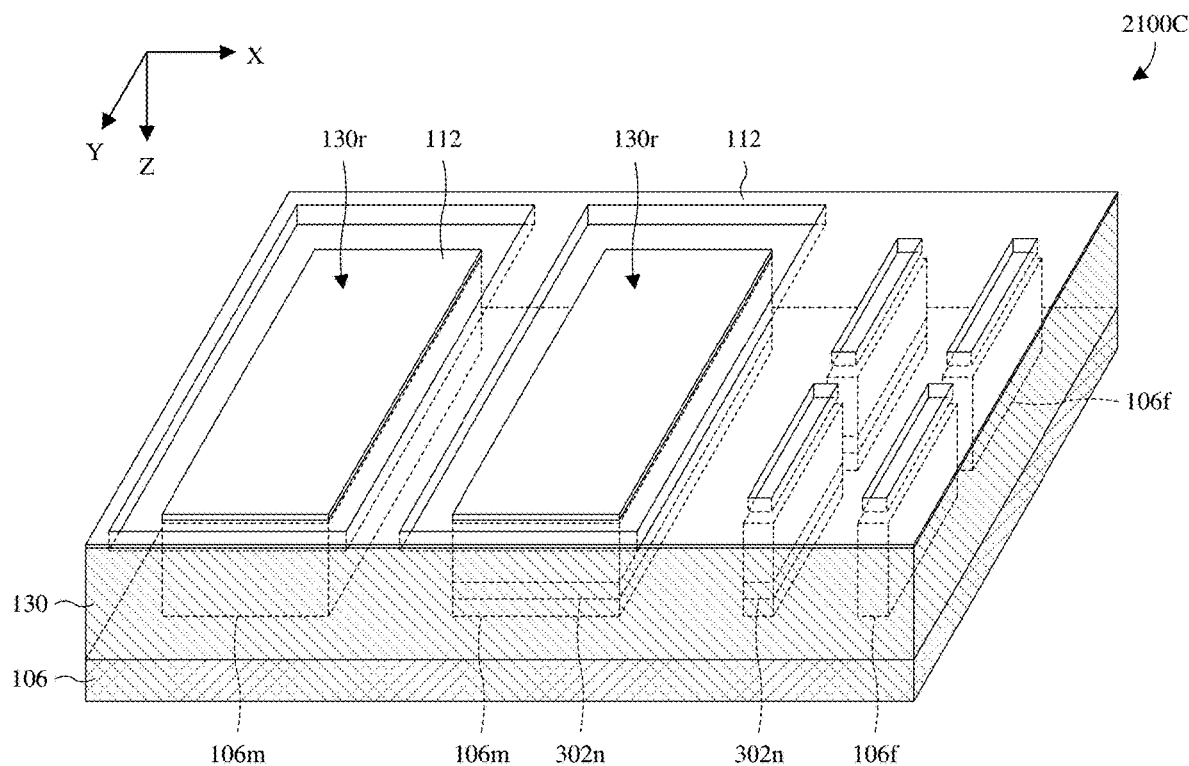

As illustrated by the views 2100A-2100C of FIGS. 21A-21C, a first IO dielectric layer 112 is deposited over and lining the trench isolation structure 130 and the semiconductor substrate 106. As seen hereafter, the first IO dielectric layer 112 may, for example, substantially define gate dielectric layers for planar FETs being formed on the mesas 106m.

In some embodiments, the first IO dielectric layer 112 is deposited by in situ steam generated (ISSG) oxidation or some other suitable thermal oxidation process. In alternative embodiments, the first IO dielectric layer 112 is deposited without thermal oxidation by a vapor deposition process or some other suitable process. In some embodiments, the deposition is preceded by a B clean or some other suitable cleaning process. In at least some embodiments in which the first IO dielectric layer 112 is deposited by a thermal oxidation process, a thickness $T_{io1}$ of the first IO dielectric layer 112 is greater on the semiconductor substrate 106 than on the trench isolation structure 130. In some embodiments, the thickness $T_{io1}$ of the first IO dielectric layer 112 is about 50-70 angstroms, about 60 angstroms, or some other suitable value where the first IO dielectric layer 112 is on the semiconductor substrate 106.

Figure 22A:
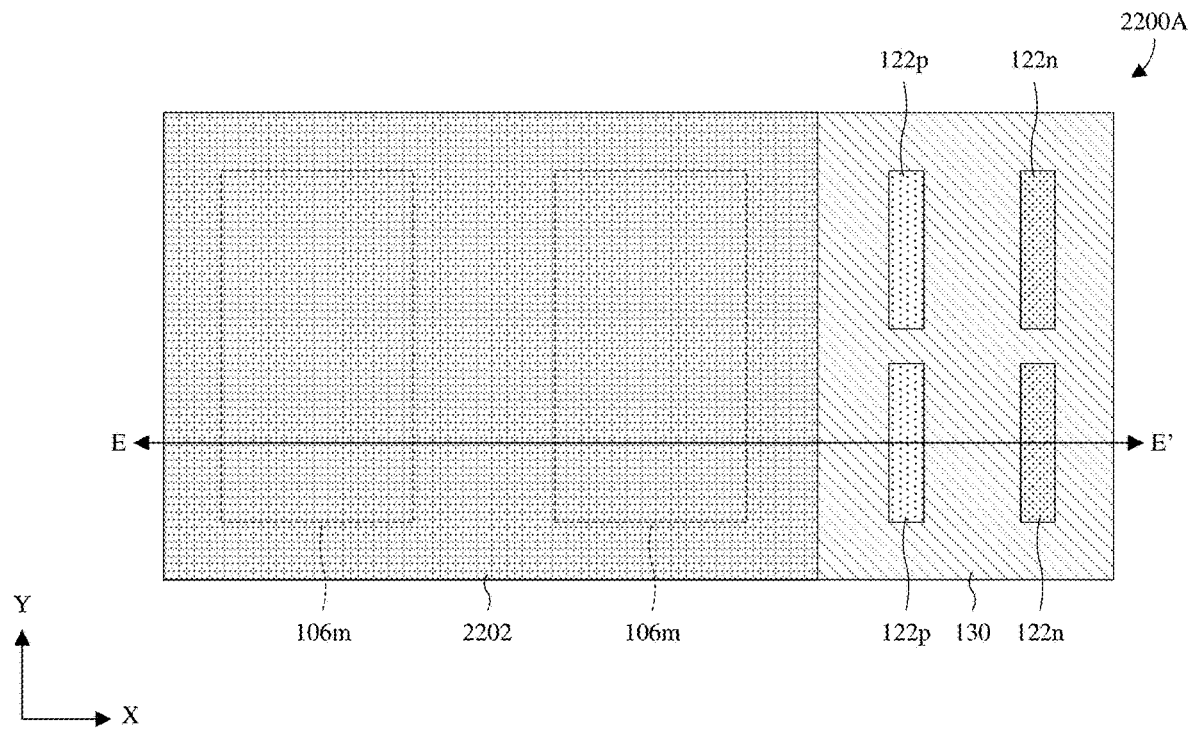
Figure 22B:
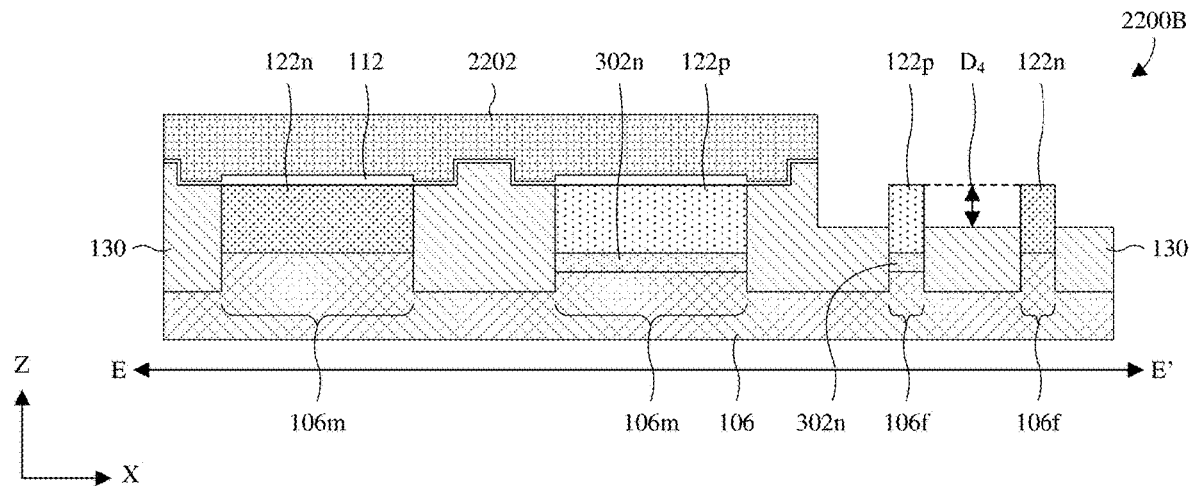
Figure 22C:
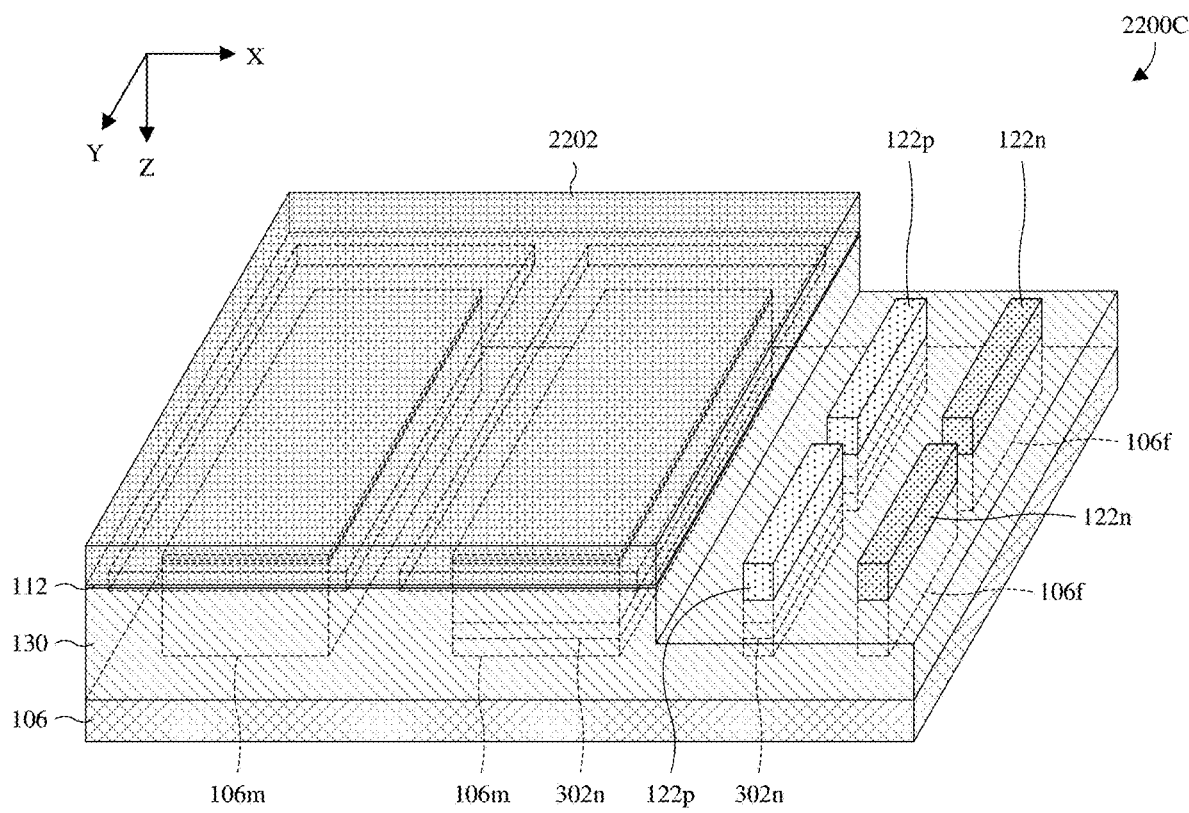

As illustrated by the views 2200A-2200C of FIGS. 22A-22C, additional P-type device wells 122p are formed overlying corresponding deep N wells 302n in the fins 106f for the N-type finFET being formed. Further, additional N-type device wells 122n are formed in the fins 106f for the P-type finFETs being formed. The additional P-type device wells 122p may, for example, be formed as illustrated and described at FIGS. 17A-17C using an appropriately patterned photoresist mask, whereas the additional N-type device wells 122n may, for example, be formed as illustrated and described at FIGS. 18A-18C using an appropriately patterned photoresist mask.

Also illustrated by the views 2200A-2200C of FIGS. 22A-22C, the first IO dielectric layer 112 and the trench isolation structure 130 are patterned to clear the first IO dielectric layer 112 from the fins 106f and to recess the trench isolation structure 130 around the fins. As a result, the fins 106f extend above a top surface of the trench isolation structure 130 by a distance $D_4$. The patterning may, for example, comprise: 1) forming a photoresist mask 2202 covering the mesas 106m and neighboring portions of the trench isolation structure 130 using photolithography; 2) performing an etch into the first IO dielectric layer 112 and the trench isolation structure 130 with the photoresist mask 2202 in place; and 3) removing the photoresist mask 2202. Other suitable patterning processes are, however, amenable. The etch may, for example, be performed by a dry etch or some other suitable type of etch. The photoresist mask 2202 may, for example, be removed using a Caro's acid strip or some other suitable process. In some embodiments, a B clean or some other suitable cleaning process is performed after removing the photoresist mask 2202.

While not illustrated, dopants may be further implanted into semiconductor substrate to tune parameters of FETs being formed on the semiconductor substrate 106. The tuned FETs may, for example, be or comprise the FETs being formed on the mesas 106m and/or the fins 106f. Further, the tuned FETs may, for example, be or comprise other finFETs and/or other planar FETs that are not shown. The other finFETs may, for example, define an SRAM array or some other suitable functional block of the IC.

As seen hereafter, the first IO dielectric layer 112 substantially defines gate dielectric layers for planar FETs being formed. Further, in some embodiments, but not all embodiments, the first IO dielectric layer 112 is only used for the gate dielectric layers of the planar FETs. By forming the first dielectric layer before the recessing of the trench isolation structure 130 around the fins 106f, the first IO dielectric layer 112 may be formed without negatively impacting doping profiles of the tuned FETs. For example, the first IO dielectric layer 112 may be formed by thermal oxidation for high quality and low leakage. Thermal oxidation may consume the semiconductor substrate 106 at the fins 106f and the mesas 106m, as well as at other locations on the semiconductor substrate 106. If the first IO dielectric layer 112 was formed after the recessing and after the tuning, thermal oxidation may consume portions of the semiconductor substrate 106 at which dopants are implanted for the tuning. This, in turn, may change doping profiles of the tuned FETs and may hence change the threshold voltages and/or other suitable parameters. Because the first IO dielectric layer 112 may be formed without negatively impacting doping profiles, the first IO dielectric layer 112 and hence the planar FETs being formed may be formed without negatively impacting yields for the tuned FETs. Further, the planar FETs may be integrated with existing finFET process flows without impacting yields.

Figure 23A:
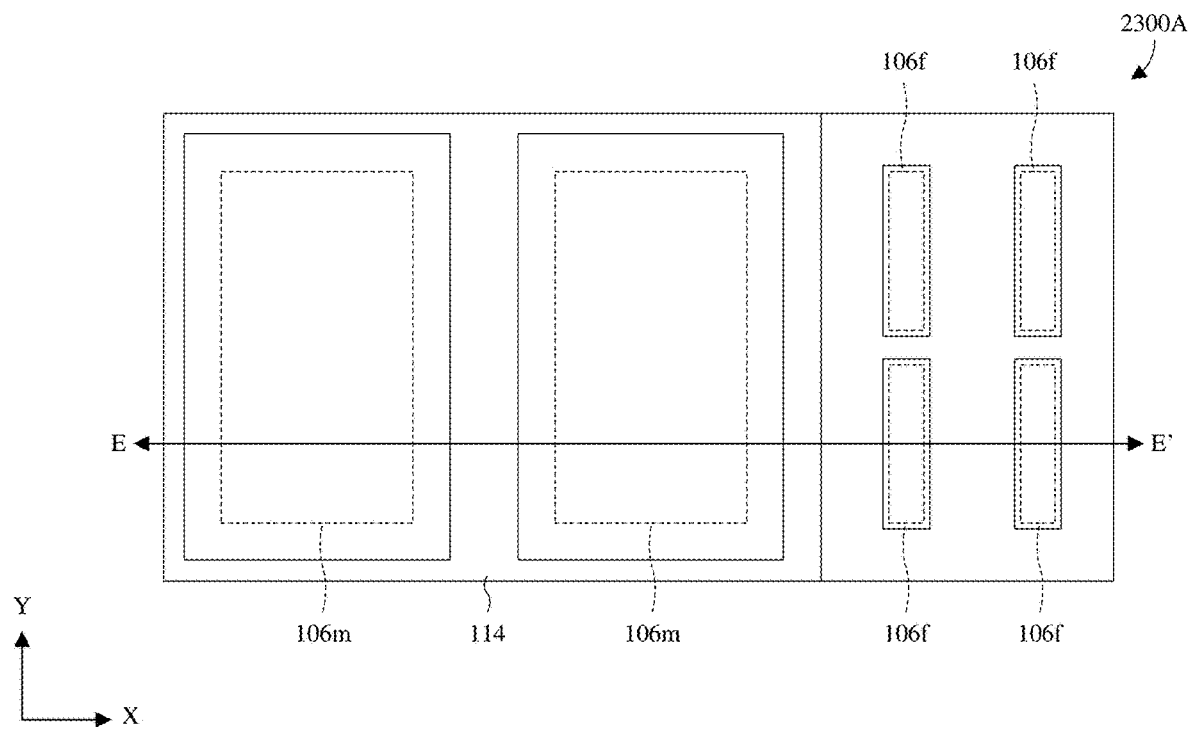
Figure 23B:
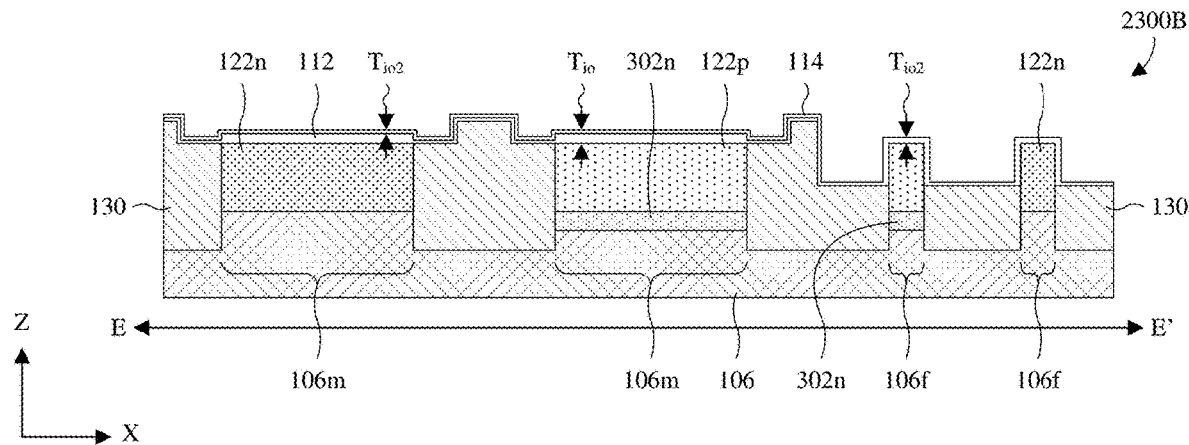
Figure 23C:
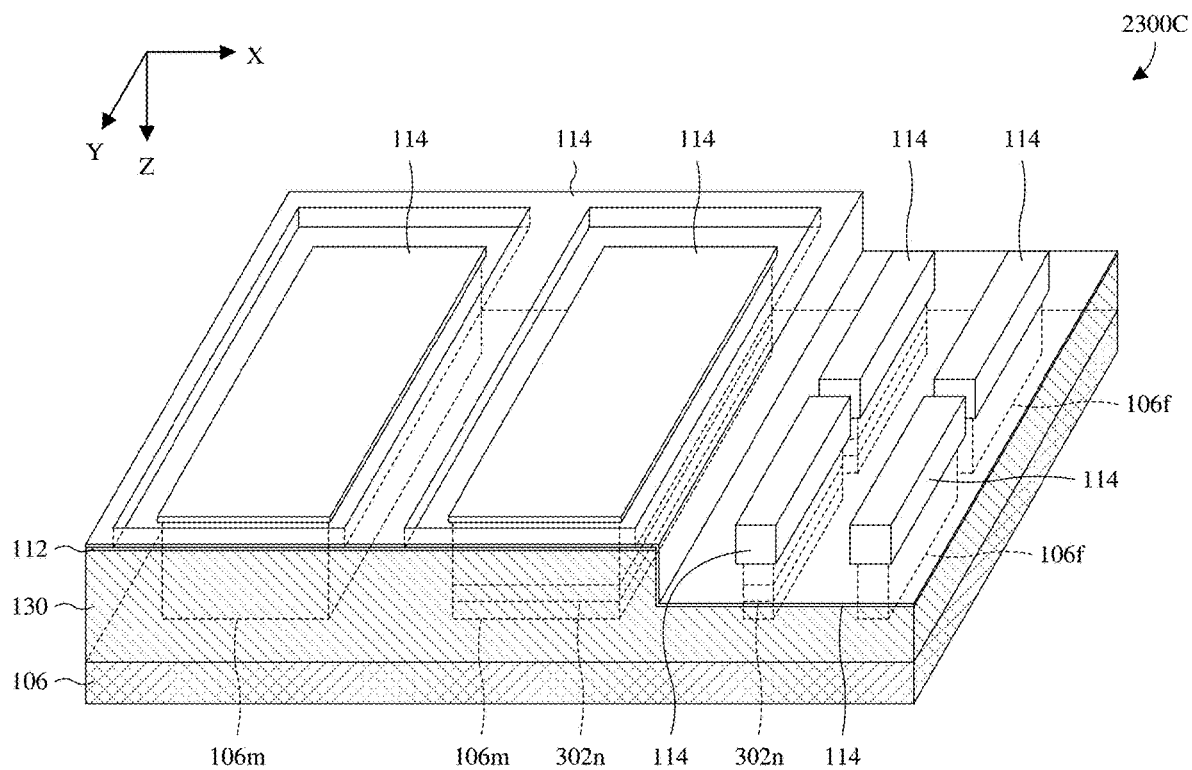

As illustrated by the views 2300A-2300C of FIGS. 23A-23C, a second IO dielectric layer 114 is deposited lining the trench isolation structure 130 and the semiconductor substrate 106 over the first IO dielectric layer 112. As seen hereafter, the second IO dielectric layer 114 may, for example, substantially or wholly define gate dielectric layers for IO finFETs being formed. Further, the second IO dielectric layer 114 may, for example, partially define gate dielectric layers for planar FETs being formed on the mesas 106m.

In some embodiments, the second IO dielectric layer 114 is deposited by wet oxidation or some other suitable thermal oxidation process. In alternative embodiments, the second IO dielectric layer 114 is deposited without thermal oxidation by a vapor deposition process or some other suitable process. In at least some embodiments in which the second IO dielectric layer 114 is deposited by a thermal oxidation process, a thickness $T_{io2}$ of the second IO dielectric layer 114 is greater on the semiconductor substrate 106 than on the trench isolation structure 130 and on the first IO dielectric layer 112. In some embodiments, the thickness $T_{io2}$ of the second IO dielectric layer 114 is about 30-50 angstroms, about 38 angstroms, or some other suitable value where the second IO dielectric layer 114 is on the semiconductor substrate 106. In some embodiments, the thickness $T_{io2}$ of the second IO dielectric layer 114 is about 1-10 angstroms, about 3 angstroms, or some other suitable value where the second IO dielectric layer 114 is on the trench isolation structure 130 and/or on the first IO dielectric layer 112. In some embodiments, a combined thickness $T_{io}$ of the first and second IO dielectric layers 112, 114 is about 60-70 angstroms, about 63 angstroms, or some other suitable value at the mesas 106m.

In some embodiments, the deposition is preceded by a B clean or some other suitable cleaning process. In some embodiments, the deposition is proceeded by decoupled plasma nitridation (DPN) and a post nitridation annealing (PNA). The nitridation and corresponding annealing may, for example, suppress dopant diffusion through the first and/or second IO dielectric layers 114 to reduce gate leakage current and/or increase reliability of FETs being formed. In some embodiments, because of the DPN and the PNA, the second IO dielectric layer 114 has a higher concentration of nitrogen than the first IO dielectric layer 112.

Figure 24A:
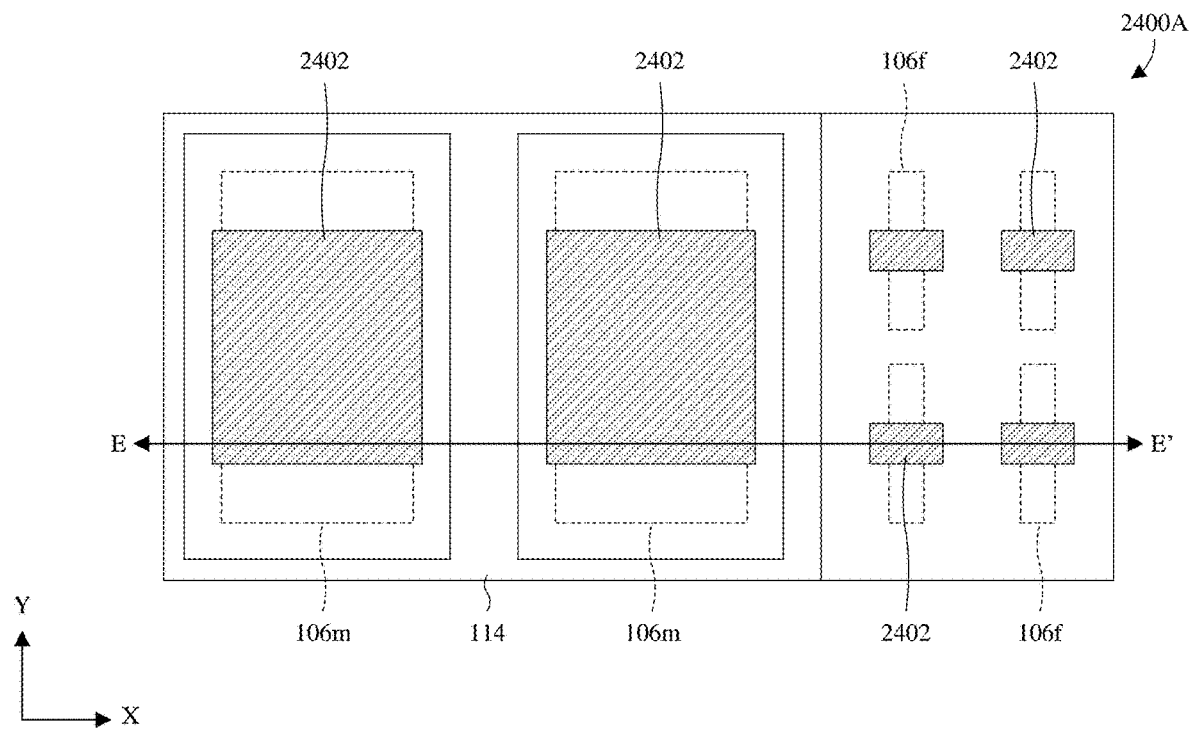
Figure 24B:
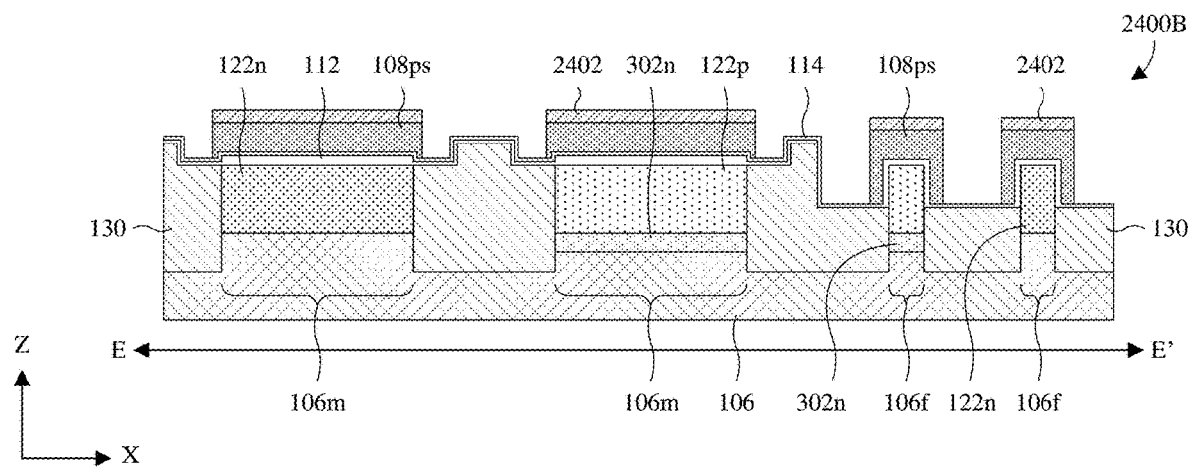
Figure 25A:
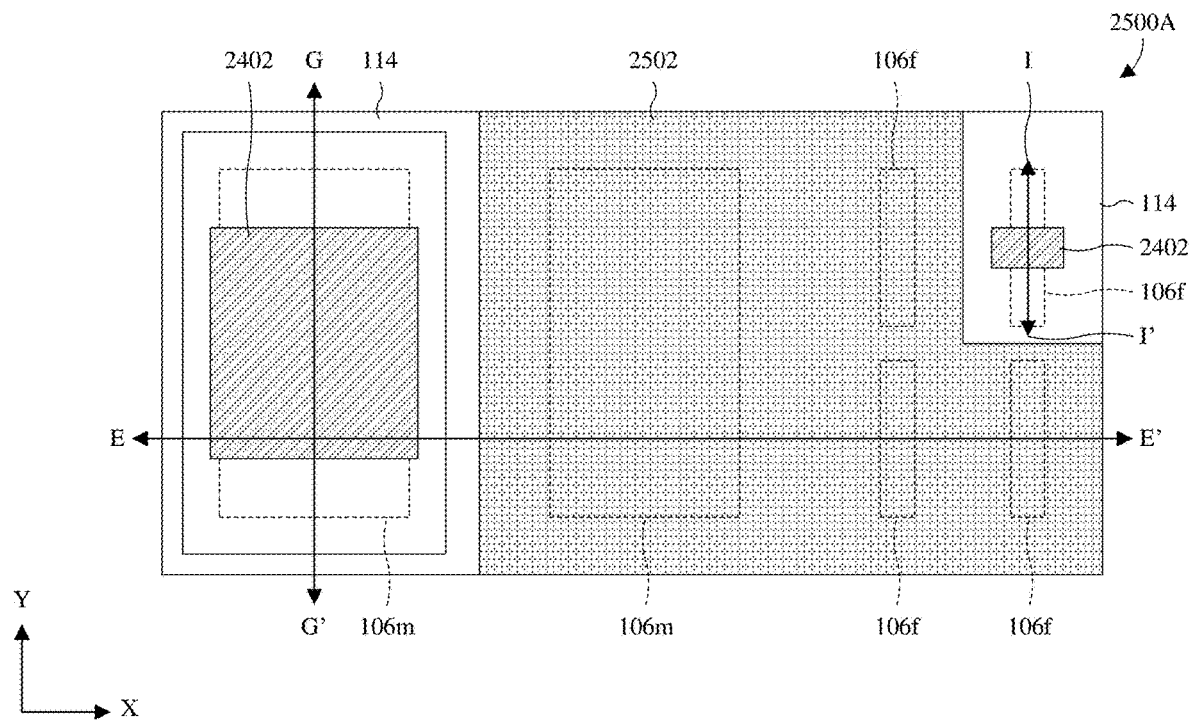
Figure 25B:
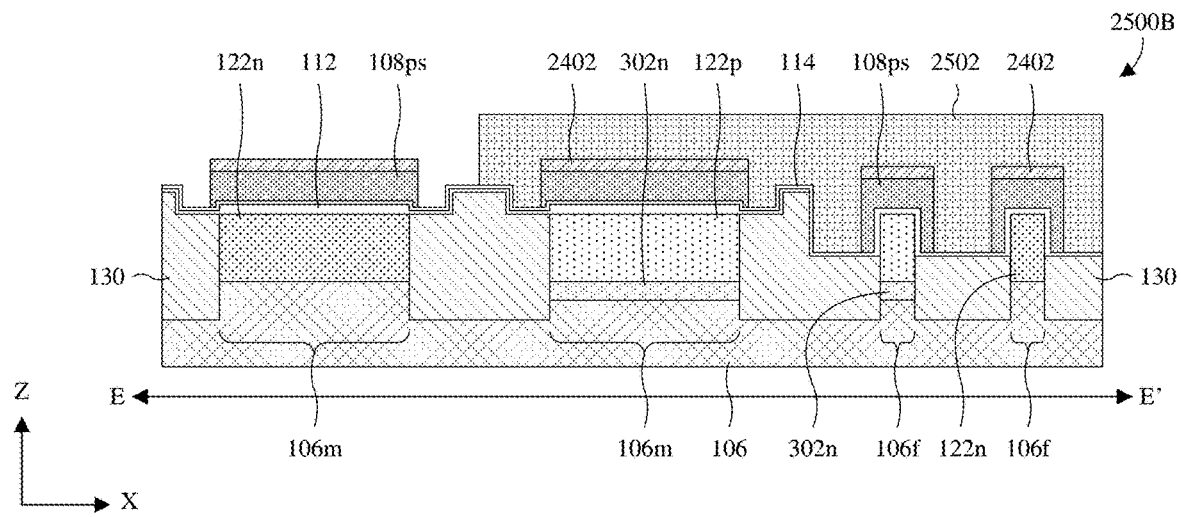
Figure 25C:
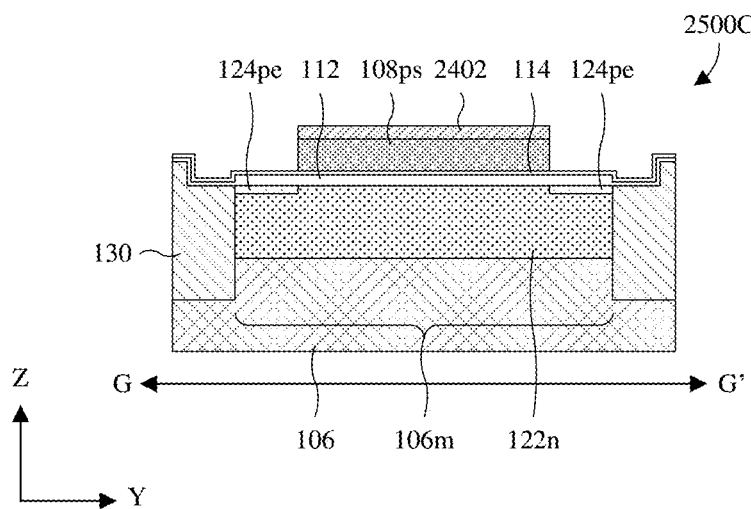
Figure 25D:
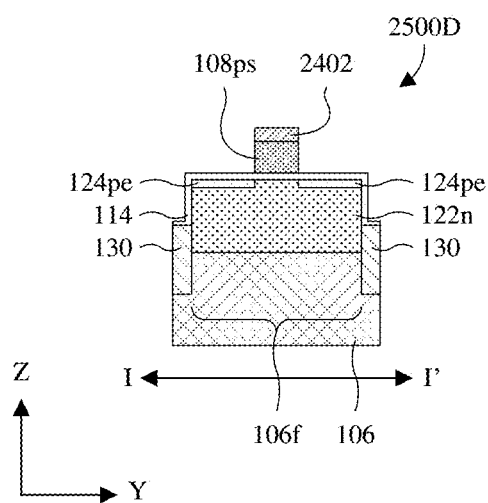
Figure 26A:
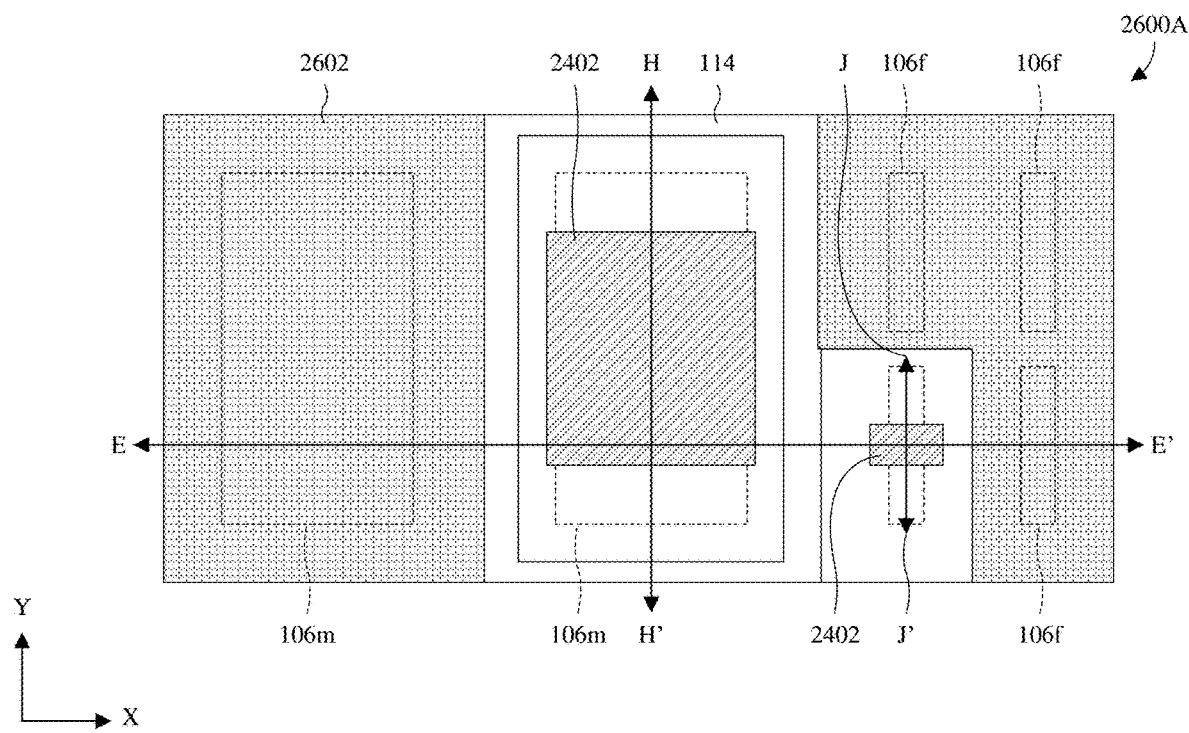
Figure 26B:
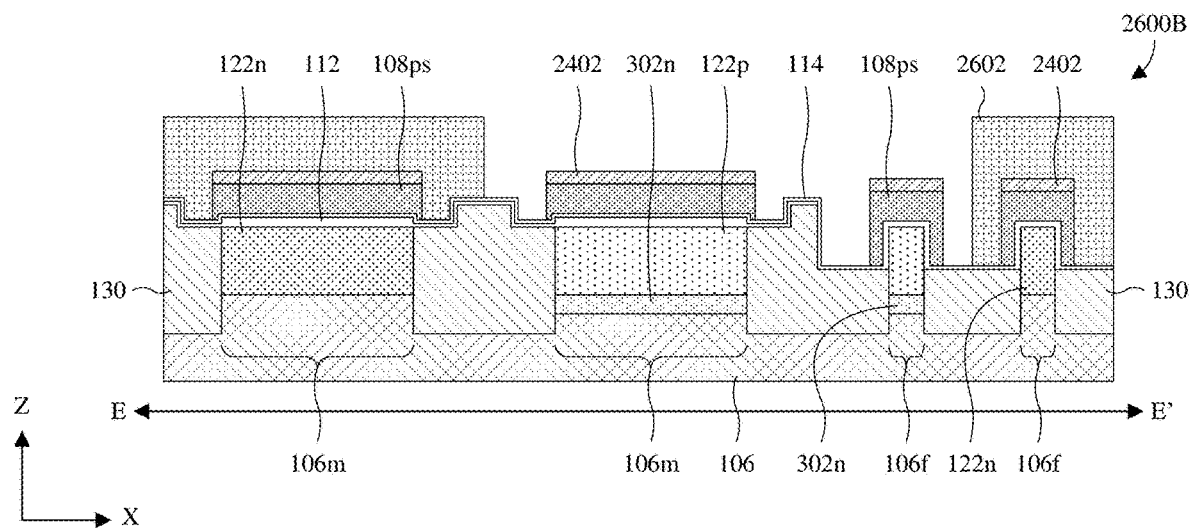
Figure 26C:
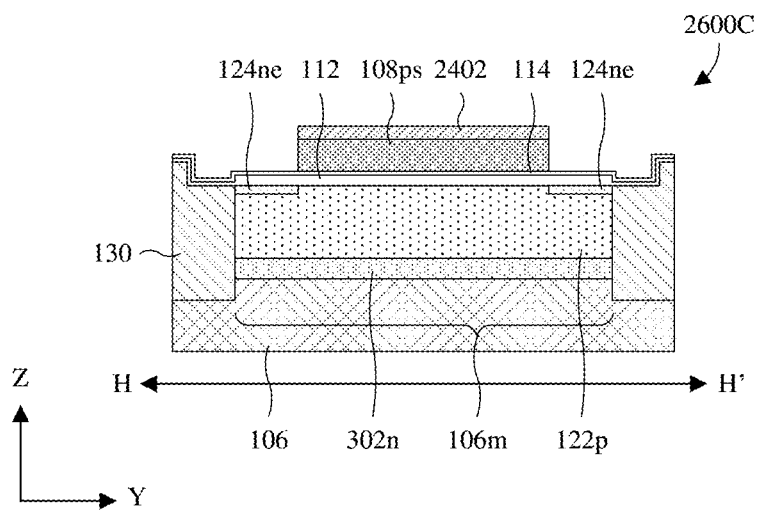
Figure 26D:
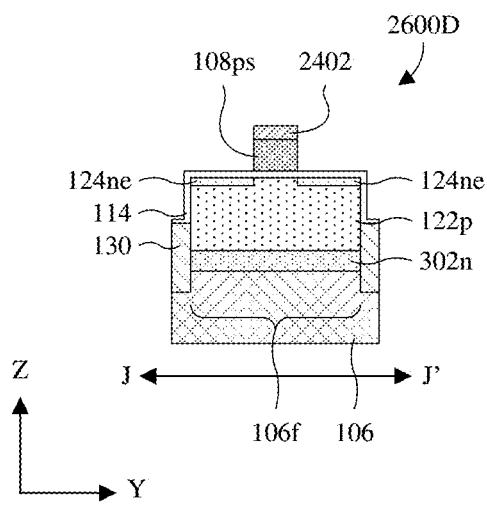
Figure 27A:
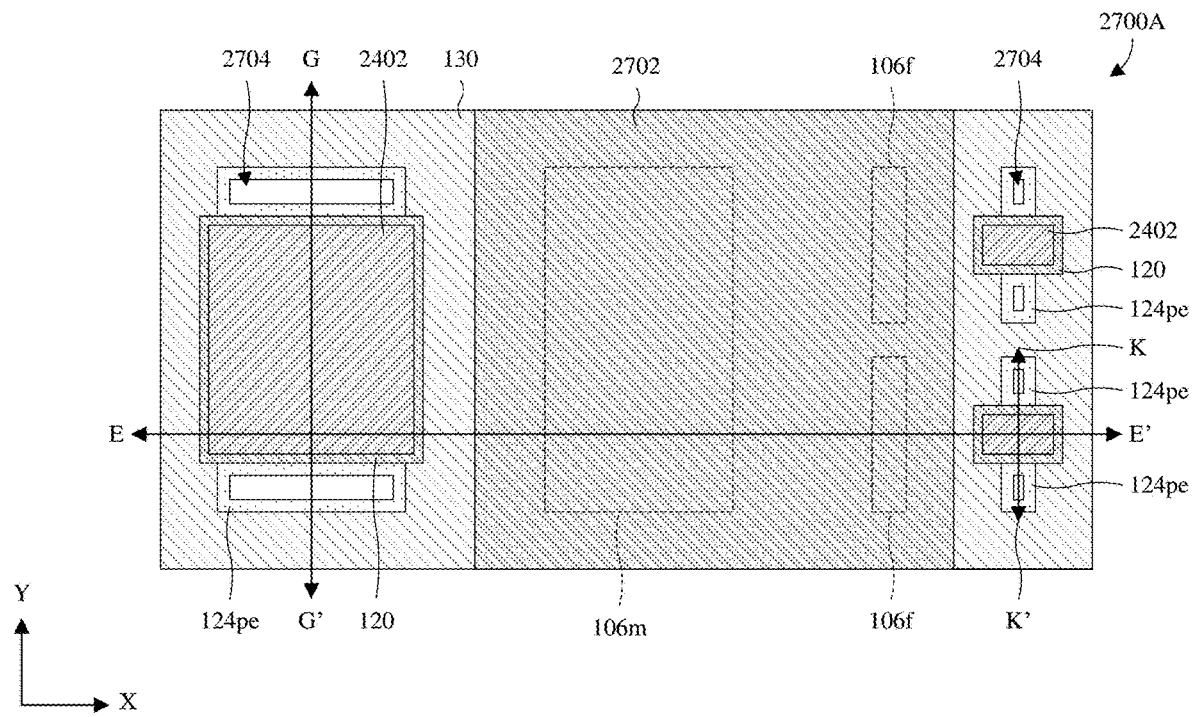
Figure 27B:
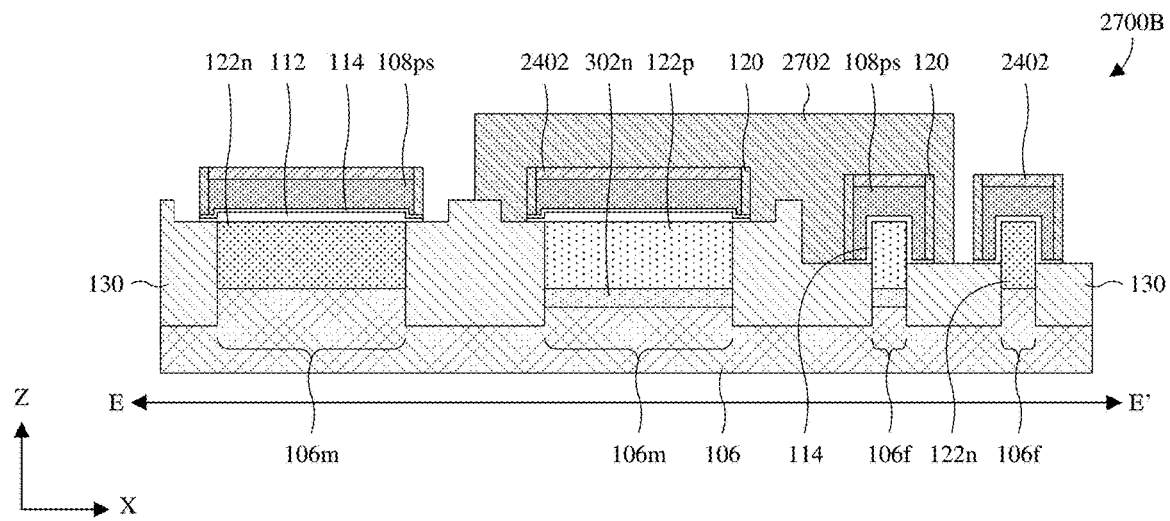
Figure 27C:
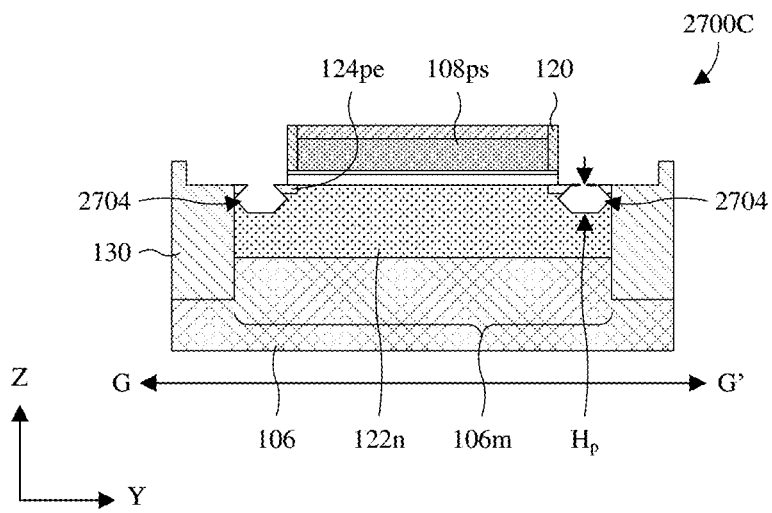
Figure 27D:
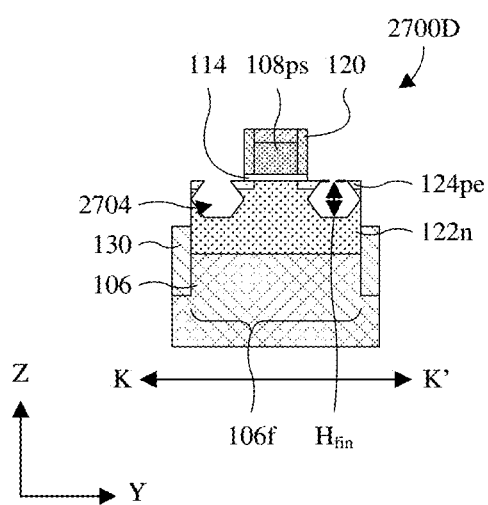
Figure 28A:
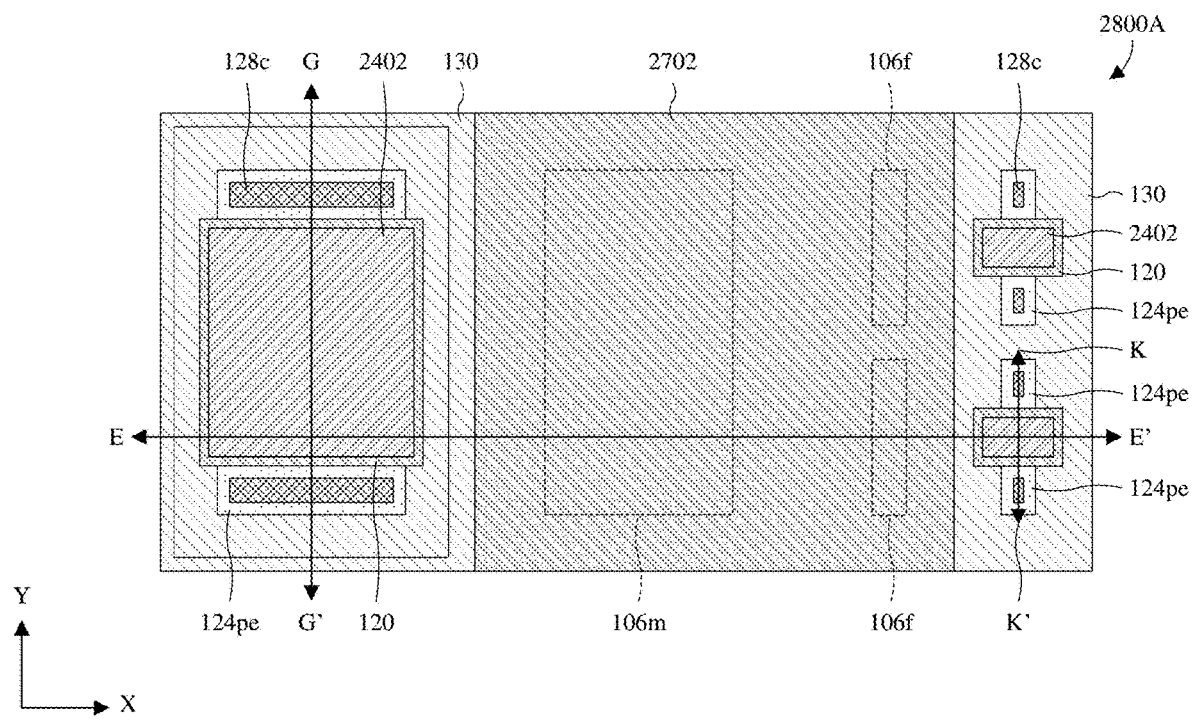
Figure 28B:
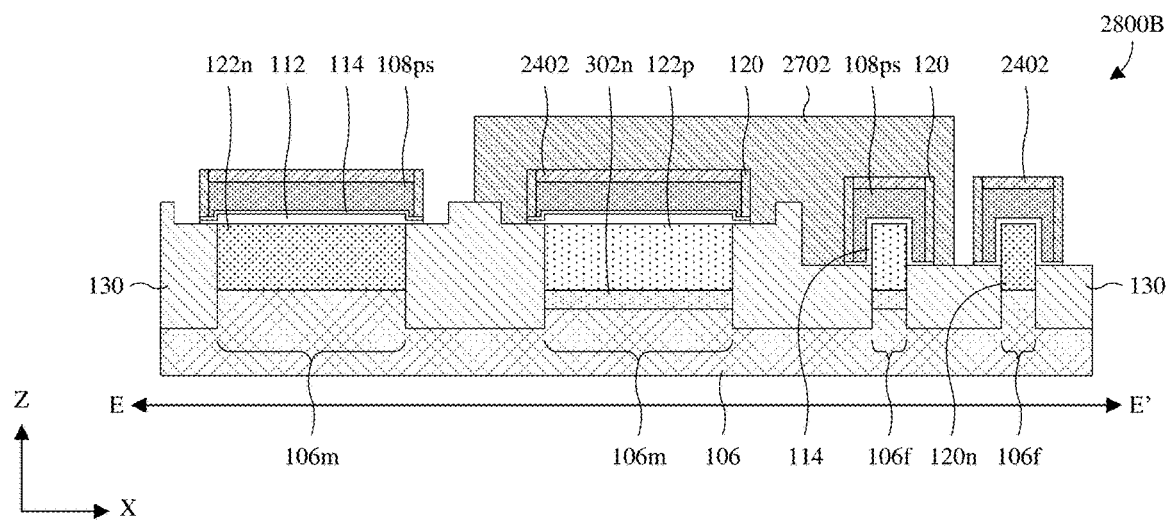
Figure 28C:
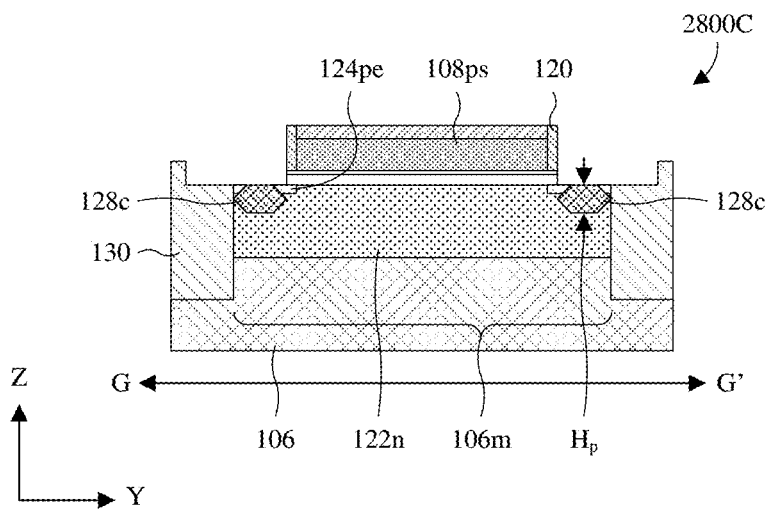
Figure 28D:
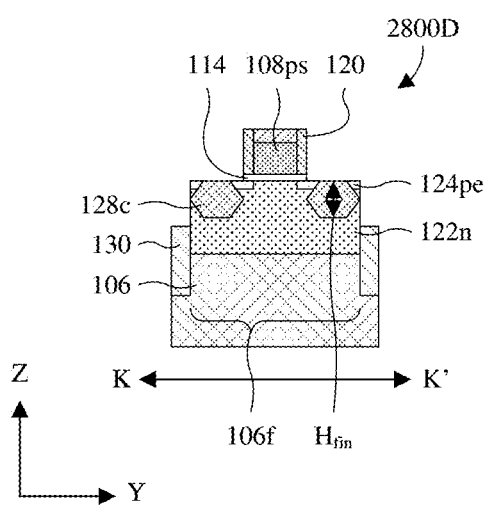

As illustrated by the views 2400A, 2400B of FIGS. 24A and 24B, polysilicon gate electrodes 108ps and corresponding hard masks 2402 are formed respectively on the mesas 106m and the fins 106f. In alternative embodiments, gate electrodes being or comprising a material other than polysilicon are used in place of the polysilicon gate electrodes 108ps. A process for forming the polysilicon gate electrodes 108ps and the hard masks 2402 may, for example, comprise: 1) depositing a polysilicon layer covering the first and second IO dielectric layers 112, 114; 2) depositing a hard mask layer covering the polysilicon layer; and 3) patterning the polysilicon layer and the hard mask layer by a photolithography/etching process. Other suitable processes are, however, amenable.

As illustrated by the views 2500A-2500D of FIGS. 25A-25D, P-type source/drain extensions 124pe are formed respectively in the mesa 106m for the P-type planar FET being formed and the fin 106f for the P-type IO finFET being formed. The P-type source/drain extensions 124pe are formed, such that polysilicon gate electrodes 108ps for the P-type planar FET and the P-type IO finFET being formed are each sandwiched between two of the P-type source/drain extensions 124pe. A process for forming the P-type source/drain extensions 124pe may, for example, comprise: 1) forming a photoresist mask 2502 masking the fins 106f and the mesa 106m for the remaining FETs being formed using photolithography; 2) implanting dopants into the semiconductor substrate 106 using the photoresist mask 2502 and the hard masks 2402 as a mask; and 3) removing the photoresist mask 2502. Other suitable processes are, however, amenable. For example, the P-type source/drain extensions 124pe for the P-type planar FET and the P-type source/drain extensions 124pe for the P-type IO finFET may be formed separately using different photoresist masks. As another example, the P-type source/drain extensions 124pe for the P-type IO finFET, but not the P-type planar FET, may be omitted.

As illustrated by the views 2600A-2600D of FIGS. 26A-26D, N-type source/drain extensions 124ne are formed respectively in the mesa 106m for the N-type planar FET being formed and the fin 106f for the N-type IO finFET being formed. The N-type source/drain extensions 124ne may, for example, be formed by the same process used for the P-type source/drain extensions 124pe (see, e.g., FIGS. 25A-25D), except that a photoresist mask 2602 may instead be used in place of the photoresist mask 2502 (see, e.g., FIGS. 25A-25D). Other suitable processes are, however, amenable. For example, the N-type source/drain extensions 124ne for the N-type planar FET and the N-type source/drain extensions 124ne for the N-type IO finFET may be formed separately using different photoresist masks.

As illustrated by the views 2700A-2700D of FIGS. 27A-27D, additional P-type source/drain extensions 124pe are formed in the fin 106f for the P-type core finFET being formed. Further, additional N-type source/drain extensions 124ne are formed in the fin 106f for the N-type core finFET being formed. Note that the additional N-type source/drain extensions 124ne are not visible within FIGS. 27A-27D but may be seen in FIGS. 29A-29D. The additional P-type source/drain extensions 124pe may, for example, be formed as illustrated and described at FIGS. 25A-25D using an appropriately patterned photoresist mask, whereas the N-type source/drain extensions 124ne may, for example, be formed as illustrated and described at FIGS. 26A-26D using an appropriately patterned photoresist mask.

Also illustrated by the views 2700A-2700D of FIGS. 27A-27D, sidewall spacers 120 are formed on sidewalls of the polysilicon gate electrodes 108ps. A process for forming the sidewall spacers 120 may, for example, comprise: 1) depositing a spacer layer; and 2) etching back the spacer layer to remove horizontal segments of the spacer layer but not vertical segments of the spacer layer. Other suitable processes are, however, amenable.

Also illustrated by the views 2700A-2700D of FIGS. 27A-27D, an N-type device mask 2702 is formed covering N-type FETs being formed. The N-type device mask 2702 may, for example, be or comprise silicon nitride and/or some other suitable dielectric(s). A process for forming the N-type device mask 2702 may, for example, comprise depositing a mask layer and patterning the mask layer into the N-type device mask 2702 by a photolithography/etching process. Other suitable processes are, however, amenable.

Also illustrated by the views 2700A-2700D of FIGS. 27A-27D, the semiconductor substrate 106 is patterned with the N-type device mask 2702 in place to form SSD openings 2704 respectively overlapping with the P-type source/drain extensions 124pe. The patterning may, for example, be performed by a photolithography/etching process or some other suitable patterning process. The photolithography/etching process may, for example, comprise: forming a photoresist mask with a layout of the SSD openings 2704 using photolithography; etching the semiconductor substrate 106 with both the photoresist mask and the N-type device mask 2702 in place; and removing the photoresist mask. Other suitable processes are, however, amenable. The etching may, for example, be performed by dry etching or some other suitable type of etching. Further, the etching may, for example, be performed with an etchant having a high selectivity (e.g., a high etch rate) for the semiconductor substrate 106 relative to the trench isolation structure 130, the N-type device mask 2702, or any combination of the foregoing.

The patterning forms the SSD openings 2704 at the mesas 106m with different heights and profiles than the SSD openings 2704 at the fins 106f. For example, the SSD openings 2704 at the mesas 106m may have a first height $H_p$, whereas the SSD openings 2704 at the fins 106f may have a second height $H_{fin}$ greater than the first height $H_p$. The different profiles and heights may, for example, be due to different epitaxial loading during the patterning. Because the mesas 106m may be larger than the fins 106f and/or have a larger pitch than the fins 106f, feature density may different at and around the mesas 106m than at and around the fins 106f. The different feature densities may lead to different etch rates while forming the SSD openings 2704. As a result of the different etch rates, the SSD openings 2704 at the mesas 106m may be shallower than the SSD openings 2704 at the fins 106f. In some embodiments, the SSD openings 2704 at the mesas 106m also have a smaller volume than the SSD openings 2704 at the fins 106f.

As illustrated by the views 2800A-2800D of FIGS. 28A-28D, compressive epitaxial structures 128c are formed in the SSD openings 2704 (see, e.g., FIGS. 27A-27D) for the P-type FETs being formed. The compressive epitaxial structures 128c may, for example, be or comprise silicon germanium and/or some other suitable material.

The compressive epitaxial structures 128c compress channel regions for the P-type FETs being formed to increase carrier mobility and hence to improve performance. Further, the compressive epitaxial structures 128c fill the SSD openings 2704 for the P-type FETs. Therefore, the compressive epitaxial structures 128c may at least partially take on the heights and/or profiles of corresponding SSD openings 2704. Because of this, and because the SSD openings 2704 at the mesas 106m have different heights and profiles than the SSD openings 2704 at the fins 106f, the compressive epitaxial structures 128c at the mesas 106m may have different heights and profiles than the compressive epitaxial structures 128c at the fins 106f.

Epitaxial deposition rates may vary based on the heights and/or profiles of the SSD openings 2704. Because of this, and because the SSD openings 2704 at the mesas 106m have different heights and profiles than the SSD openings 2704 at the fins 106f, the compressive epitaxial structures 128c at the mesas 106m may have different deposition rates than the compressive epitaxial structures 128c at the fins 106f. The different deposition rates may further lead to the compressive epitaxial structures 128c at the mesas 106m having different heights and profiles than the compressive epitaxial structures 128c at the fins 106f. Further, when the compressive epitaxial structures 128c have multiple different materials, the different deposition rates may lead to the compressive epitaxial structures 128c at the mesas 106m having different material compositions than the compressive epitaxial structures 128c at the fins 106f.

A process for forming the compressive epitaxial structures 128c may, for example, comprise epitaxially depositing the compressive epitaxial structures 128c. Other suitable processes are, however, amenable.

Figure 29A:
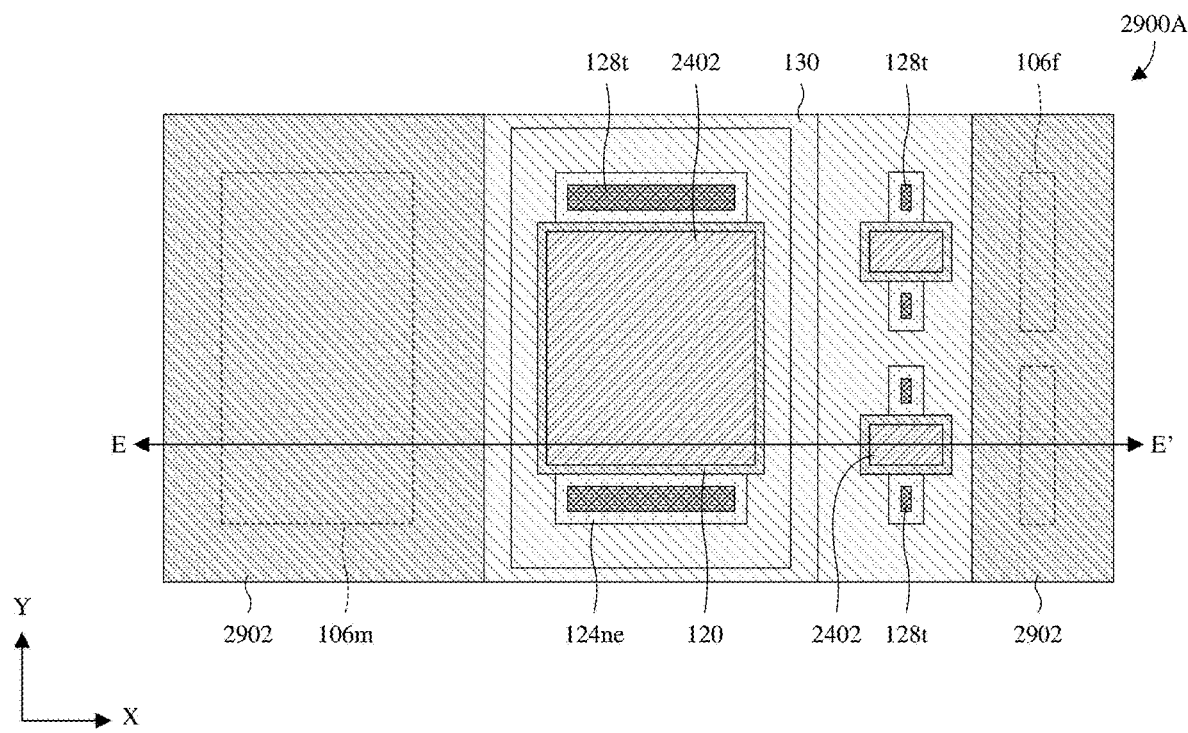
Figure 29B:
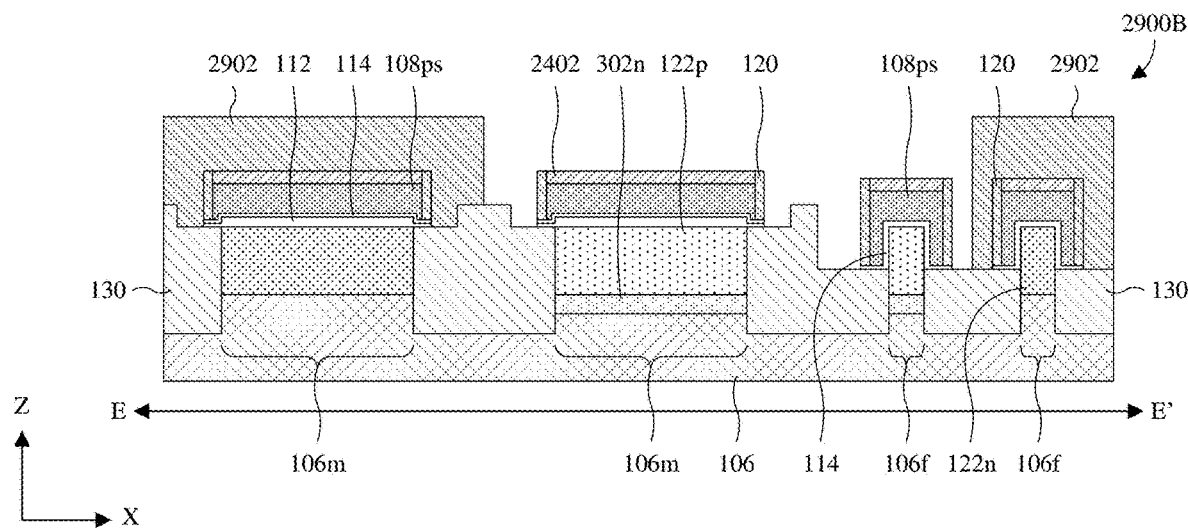

As illustrated by the views 2900A, 2900B of FIGS. 29A and 29B, the N-type device mask 2702 is removed and a P-type device mask 2902 is formed covering P-type FETs being formed. The removal may, for example, be performed by an etch or some other suitable type of removal process. The P-type device mask 2902 may, for example, be or comprise silicon nitride and/or some other suitable dielectric(s). A process for forming the P-type device mask 2902 may, for example, comprise depositing a mask layer and patterning the mask layer into the P-type device mask 2902 by a photolithography/etching process. Other suitable processes are, however, amenable.

Also illustrated by the view 2900A of FIG. 29A, tensile epitaxial structures 128t are formed respectively overlapping with the N-type source/drain extensions 124ne. The tensile epitaxial structures 128t may, for example, be or comprise silicon carbide and/or some other suitable material. The tensile epitaxial structures 128t impose tensile stress on channel regions for the N-type FETs being formed to increase carrier mobility and hence to improve performance. In some embodiments, the tensile epitaxial structures 128t are formed overlapping with the N-type source/drain extensions 124ne by a same or similar process as that described and illustrated for the compressive epitaxial structures 128c. Such a process may, for example, comprise: 1) patterning the semiconductor substrate 106 with the P-type device mask 2902 in place to form additional SSD openings using the process illustrated and described at FIGS. 27A-27D; and 2) forming the tensile epitaxial structures 128t in the additional SSD openings using the process illustrated and described at FIGS. 28A-28D. In other embodiments, the tensile epitaxial structures 128t are formed by other suitable processes.

The tensile epitaxial structures 128t at the mesas 106m may have different heights and profiles than the tensile epitaxial structures 128t at the fins 106f for the same reasons discussed with regard to the compressive epitaxial structures 128c at FIGS. 28A-28D. Similarly, the tensile epitaxial structures 128t at the mesas 106m may have different material compositions and/or volumes than the tensile epitaxial structures 128t at the fins 106f for the same reasons discussed with regard to the compressive epitaxial structures 128c at FIGS. 28A-28D.

While FIGS. 27A-27D, 28A-28D, 29A, and 29B illustrate formation of the compressive and tensile epitaxial structures 128c, 128t, the compressive and tensile epitaxial structures 128c, 128t may not be formed in alternative embodiments of the method being illustrated. Hence, the method may proceed from formation of the sidewall spacers 120 at FIGS. 27A-27D to the acts at FIGS. 30A and 30B (hereafter described) without forming the compressive and tensile epitaxial structures 128c, 128t. Further, while the tensile epitaxial structures 128t are formed after the compressive epitaxial structures 128c, the tensile epitaxial structures 128t may be formed before the compressive epitaxial structures 128c in alternative embodiments.

Figure 30A:
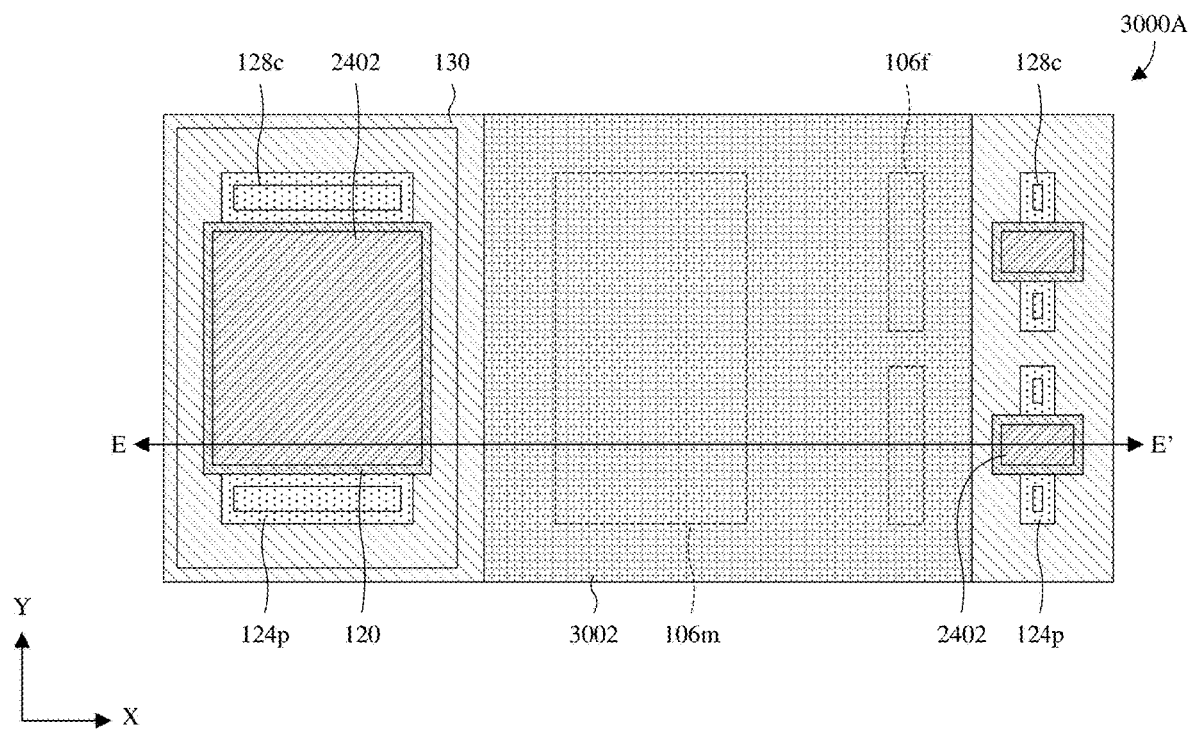
Figure 30B:
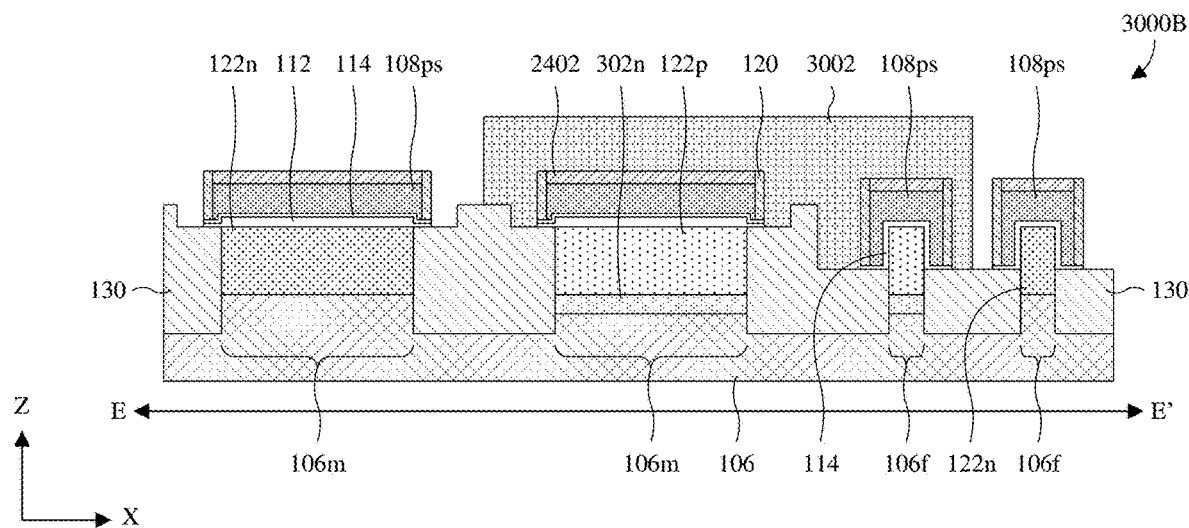

As illustrated by the views 3000A, 3000B of FIGS. 30A and 30B, the P-type device mask 2902 is removed. The removal may, for example, be performed by an etch or some other suitable type of removal process.

Also illustrated by the views 3000A, 3000B of FIGS. 30A and 30B, P-type source/drain regions 124p are formed respectively in the mesa 106m for the P-type planar FET being formed and the fins 106f for the P-type finFETs being formed. The P-type source/drain regions 124p are formed overlapping respectively with the P-type source/drain extensions 124pe and respectively with the compressive epitaxial structures 128c. A process for forming the P-type source/drain regions 124p may, for example, comprise: 1) forming a photoresist mask 3002 masking the fins 106f and the mesa 106m for the N-type FETs being formed using photolithography; 2) implanting dopants into the semiconductor substrate 106 and the compressive epitaxial structures 128c using the photoresist mask 3002 and the hard masks 2402 as a mask; and 3) removing the photoresist mask 3002. Other suitable processes are, however, amenable. For example, the P-type source/drain regions 124p for the P-type planar FET, the P-type IO finFET, the P-type core finFET, or any combination of the foregoing may be formed separately using different photoresist masks.

Figure 31A:
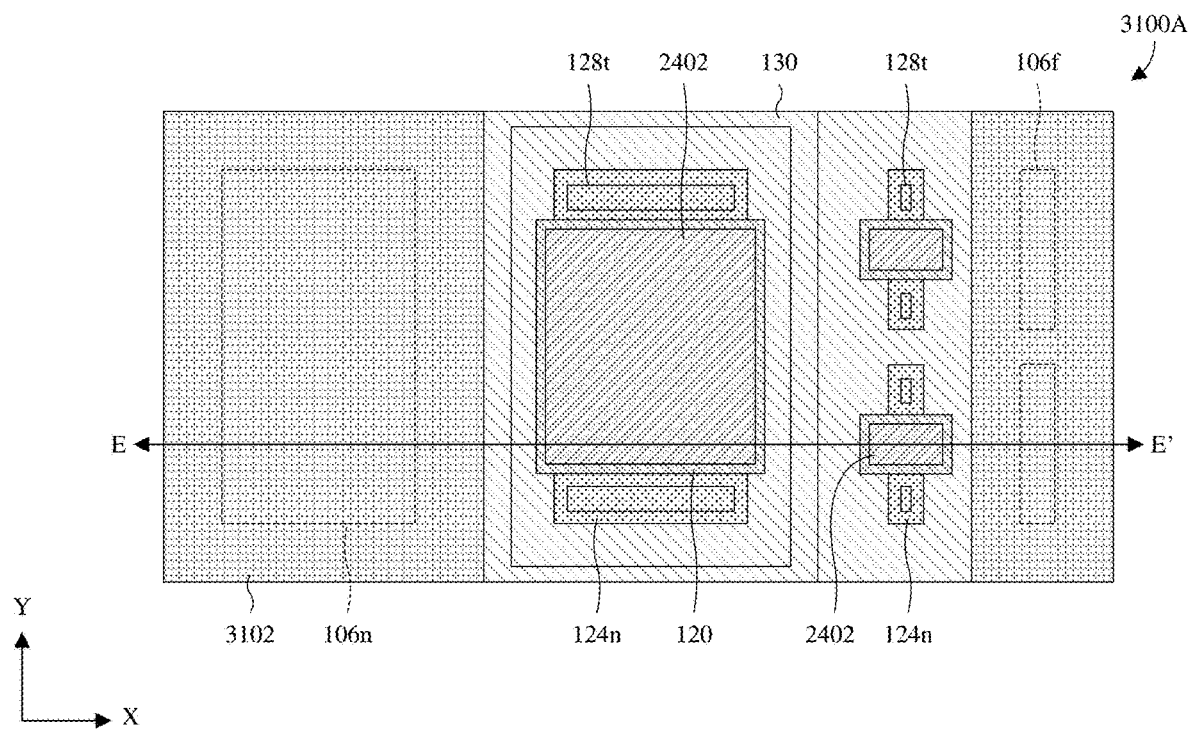
Figure 31B:
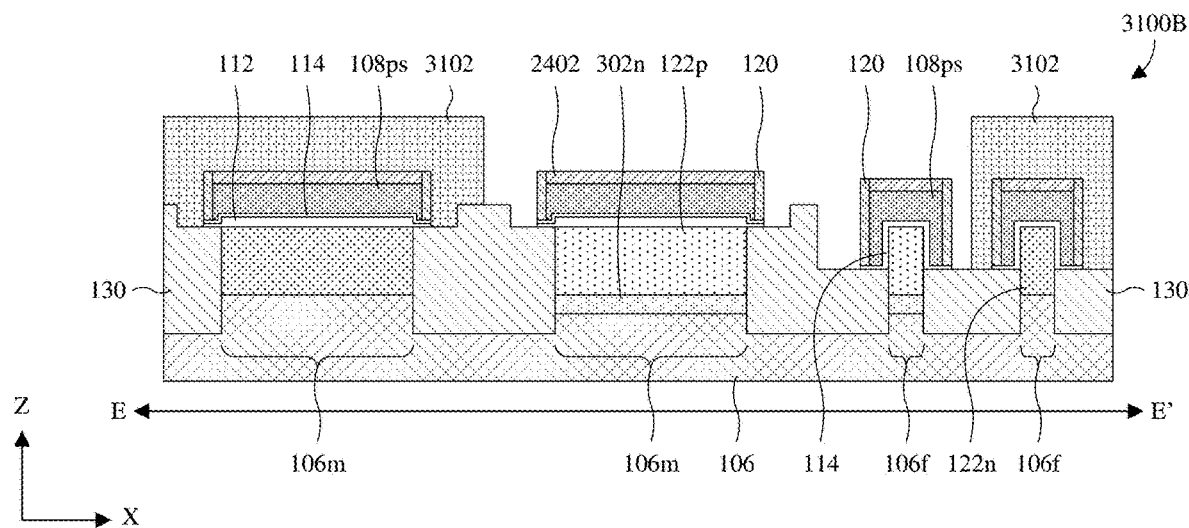

As illustrated by the views 3100A, 3100B of FIGS. 31A and 31B, N-type source/drain regions 124n are formed respectively in the mesa 106m for the N-type planar FET being formed and the fins 106f for the N-type finFETs being formed. The N-type source/drain regions 124n may, for example, be formed by the same process used for the P-type source/drain regions 124p (see, e.g., FIGS. 30A and 30B), except that a photoresist mask 3102 may instead be used in place of the photoresist mask 3002 (see, e.g., FIGS. 30A and 30B). Other suitable processes are, however, amenable. For example, the N-type source/drain regions 124n for the N-type planar FET, the N-type IO finFET, the N-type core finFET, or any combination of the foregoing may be formed separately using different photoresist masks.

Figure 32A:
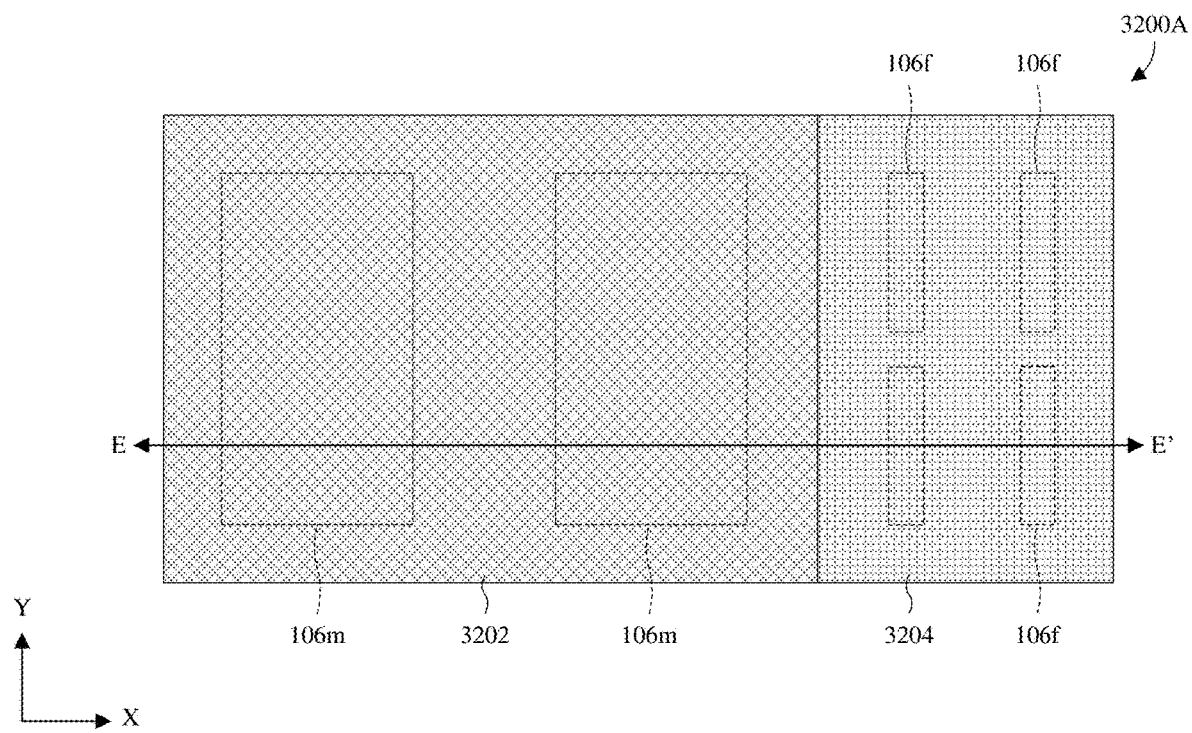
Figure 32B:
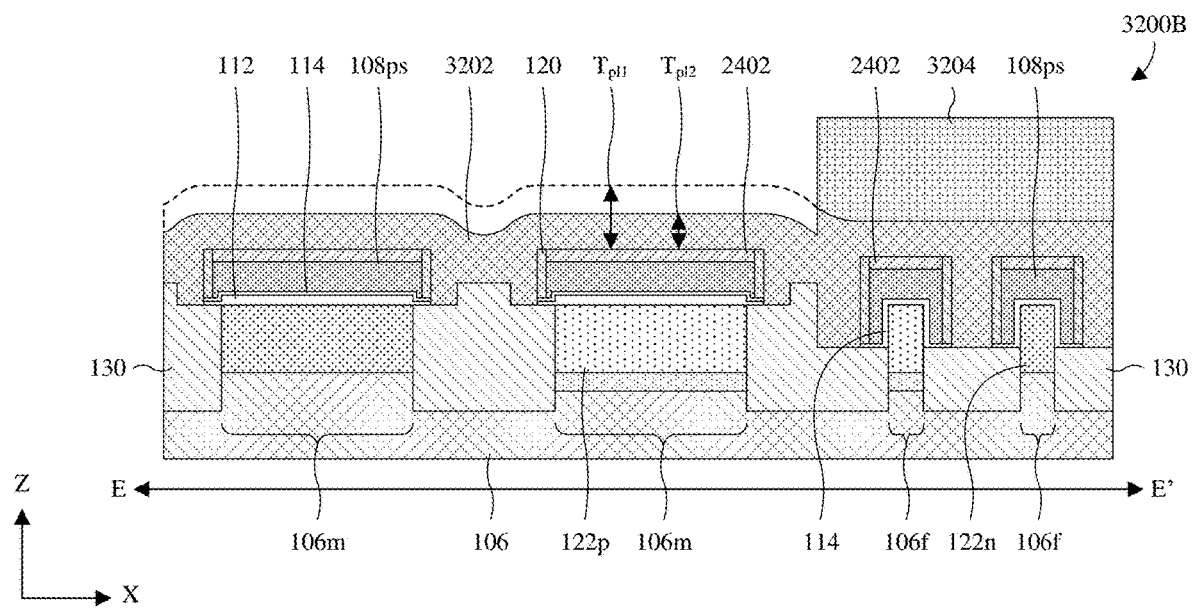

As illustrated by the views 3200A, 3200B of FIGS. 32A and 32B, a planarization layer 3202 is deposited over the hard masks 2402 and the trench isolation structure 130. The planarization layer 3202 may, for example, be a bottom antireflective coating (BARC) or some other suitable material. Further, the planarization layer 3202 may, for example, be deposited by spin on coating or some other suitable deposition process.

Because the mesas 106m have a larger top surface area compared to the fins 106f, the planarization layer 3202 may accumulate to a greater extent over the mesas 106m than over the fins 106f. As such, the planarization layer 3202 may initially have a greater thickness $T_{pl1}$ over the mesas 106m than over the fins 106f. Note that the as-deposited profile of the planarization layer 3202 is shown in phantom at the mesas 106m.

Also illustrated by the views 3200A, 3200B of FIGS. 32A and 32B, the planarization layer 3202 is thinned at the mesas 106m, but not the fins 106f, so the planarization layer 3202 has a thickness $T_{pl2}$ at the mesas 106m that is about the same as that at the fins 106f. As seen hereafter, by evening out the thickness of the planarization layer 3202 across the mesas 106m and the fins 106f, a subsequent etch to remove the hard masks 2402 is more uniform across the mesas 106m and the fins 106f. A process for performing the thinning may, for example, comprise: 1) forming a photoresist mask 3204 masking the fins 106f using photolithography; 2) etching the planarization layer 3202 with the photoresist mask 3204 in place; and 3) removing the photoresist mask 3204. Other suitable processes are, however, amenable.

Figure 33A:
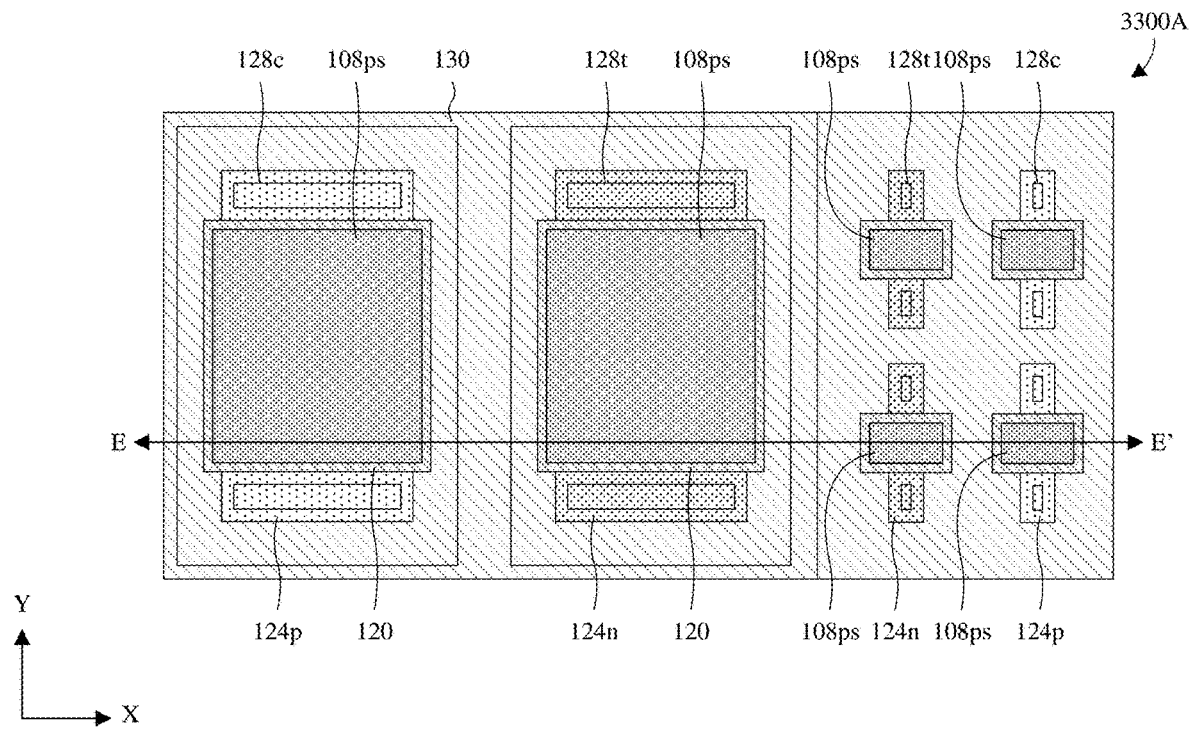
Figure 33B:
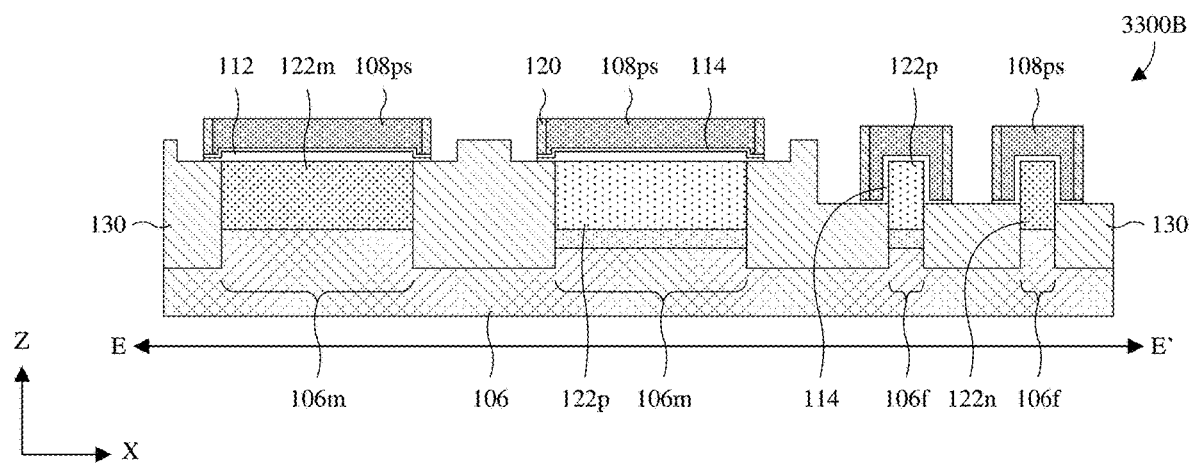

As illustrated by the views 3300A, 3300B of FIGS. 33A and 33B, a fifth etch is performed into the planarization layer 3202 (see, e.g., FIGS. 32A and 32B) and the hard masks 2402 (see, e.g., FIGS. 32A and 32B) to remove the hard mask 2402. Particularly, the fifth etch etches back the planarization layer 3202 until the hard masks 2402 are exposed and then etches back the planarization layer 3202 and the hard masks 2402 in parallel. This persists at least until the hard masks 2402 are removed. The fifth etch may, for example, be a non-selective etch, such that it has substantially the same etch rates for the planarization layer 3202 and the hard masks 2402. However, other suitable etches are amenable.

Also illustrated by the views 3300A, 3300B of FIGS. 33A and 33B, the planarization layer 3202 is removed. The removal may, for example, be performed as part of the fifth etch. Alternatively, the removal may, for example, be performed independent of and after the fifth etch.

Figure 34A:
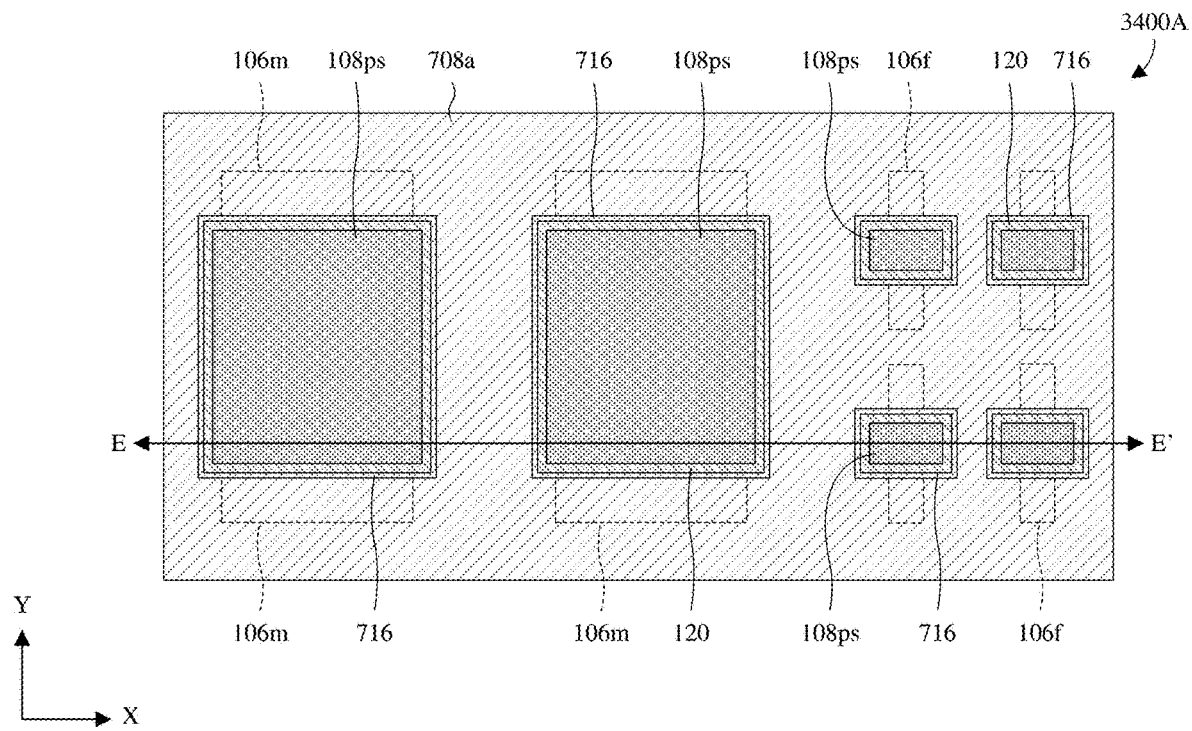
Figure 34B:
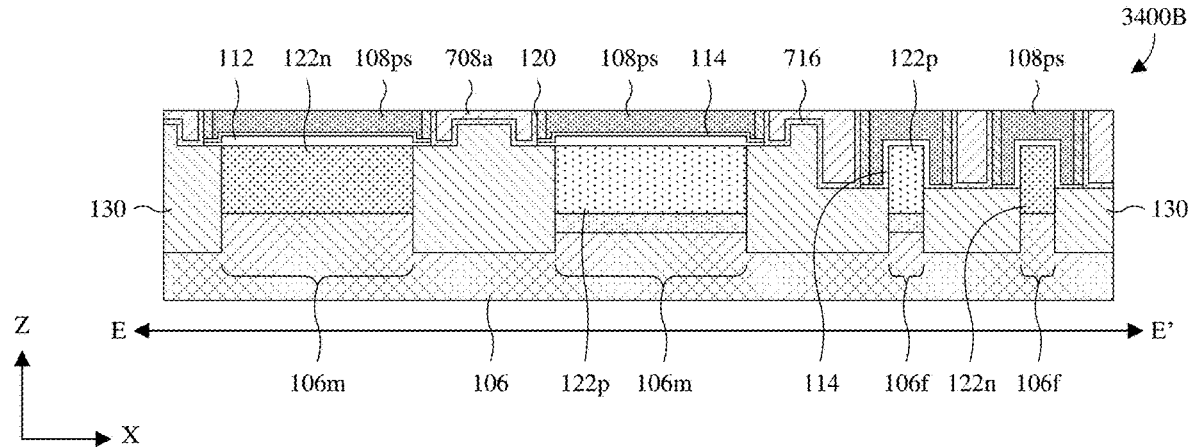

As illustrated by the views 3400A, 3400B of FIGS. 34A and 34B, top surfaces of the polysilicon gate electrodes 108ps are co-planarized. Further, a CESL 716 and a first interconnect dielectric layer 708a are formed between the polysilicon gate electrodes 108ps and with top surfaces that are co-planarized with the top surfaces of the polysilicon gate electrodes 108ps. The first interconnect dielectric layer 708a may, for example, also be referred to as a zeroth interlayer dielectric (ILD) layer. A process for forming the CESL 716 and the first interconnect dielectric layer 708a, as well as performing the co-planarization, may, for example, comprise: 1) depositing the CESL 716 over the trench isolation structure 130 and the polysilicon gate electrodes 108ps; 2) depositing the first interconnect dielectric layer 708a over the CESL 716; and 3) performing a planarization into the CESL 716, the first interconnect dielectric layer 708a, and the polysilicon gate electrodes 108ps. Other suitable processes are, however, amenable. The planarization may, for example, be performed by a chemical mechanical polish (CMP) or some other suitable process.

Figure 35A:
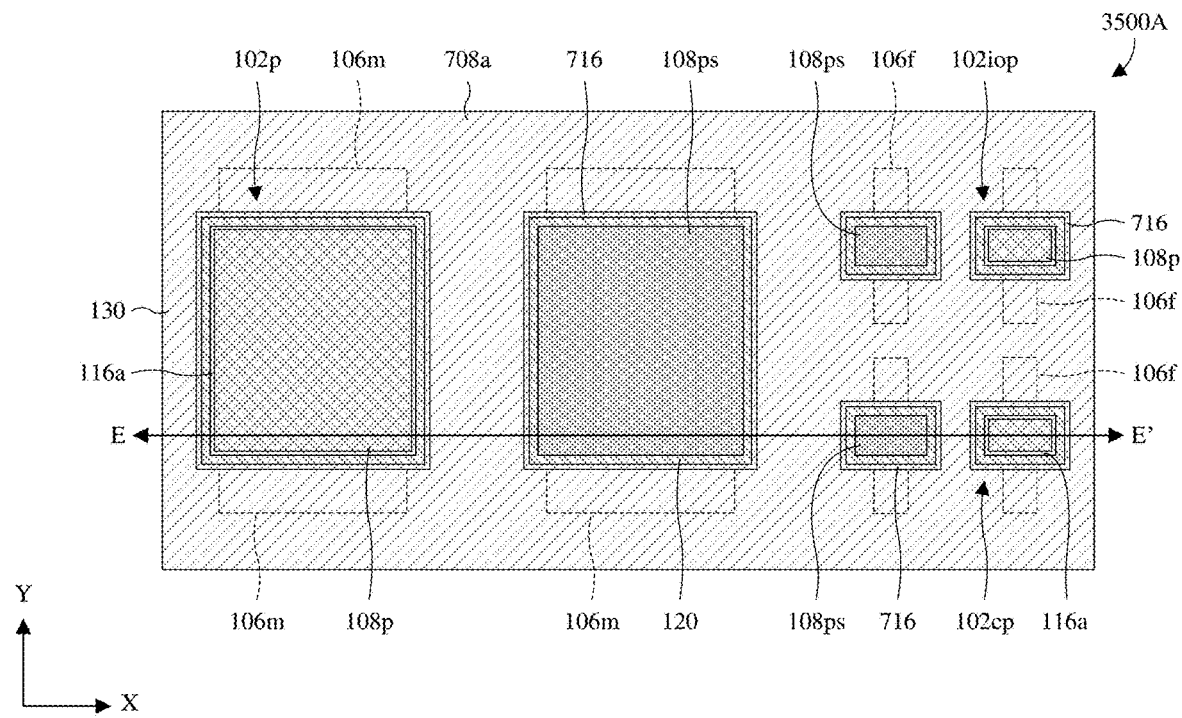
Figure 35B:
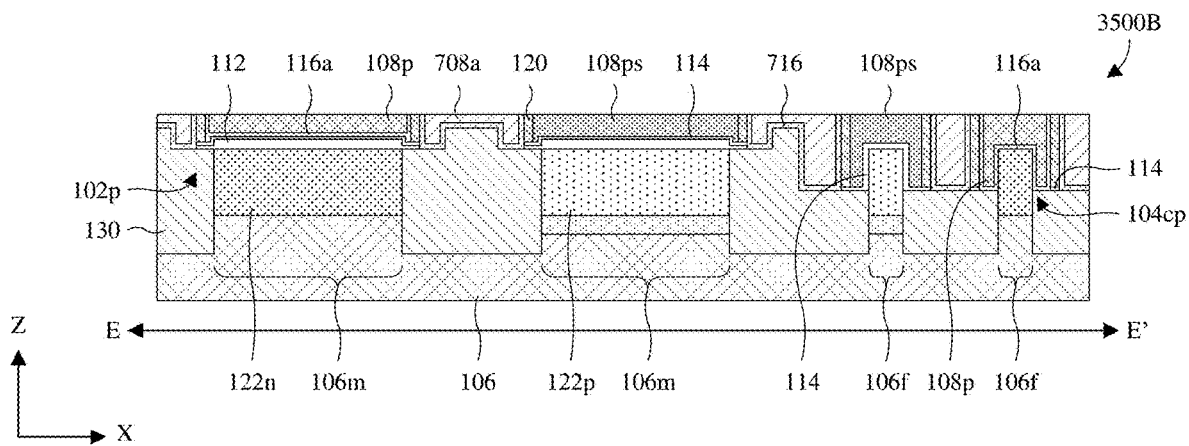

As illustrated by the views 3500A, 3500B of FIGS. 35A and 35B, the polysilicon gate electrodes 108ps for the P-type FETs being formed are replaced with P-type gate electrodes 108p and corresponding portions of a first core dielectric layer 116a, thereby defining a P-type planar FET 102p, a P-type IO finFET 104iop, and a P-type core finFET 104cp. Further, in the case of the P-type core finFET 104cp, but not the P-type IO finFET 104iop and the P-type planar FET 102p, portions of the second IO dielectric layer 114 directly under the corresponding polysilicon gate electrode 108ps are removed.

Figure 36A:
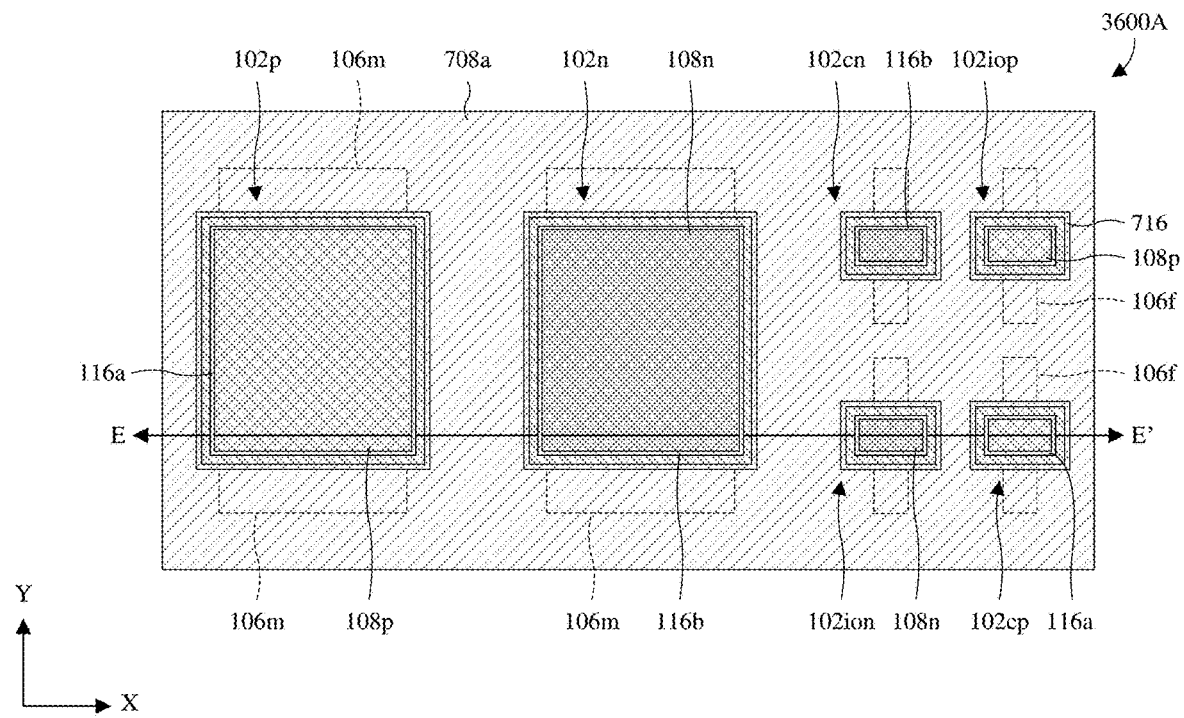
Figure 36B:
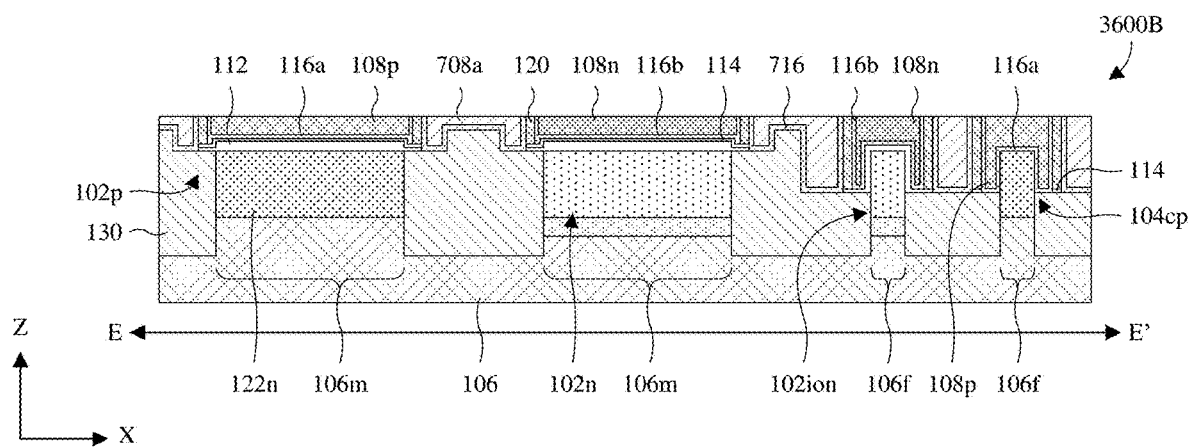

As illustrated by the views 3600A, 3600B of FIGS. 36A and 36B, the polysilicon gate electrodes 108ps for the N-type FETs being formed are replaced with N-type gate electrodes 108n and corresponding portions of a second core dielectric layer 116b, thereby defining an N-type planar FET 102n, an N-type IO finFET 104ion, and an N-type core finFET 104cn. Further, in the case of the N-type core finFET 104cn, but not the N-type IO finFET 104ion and the N-type planar FET 102n, portions of the second IO dielectric layer 114 directly under the corresponding polysilicon gate electrode 108ps are removed.

Figure 37A:
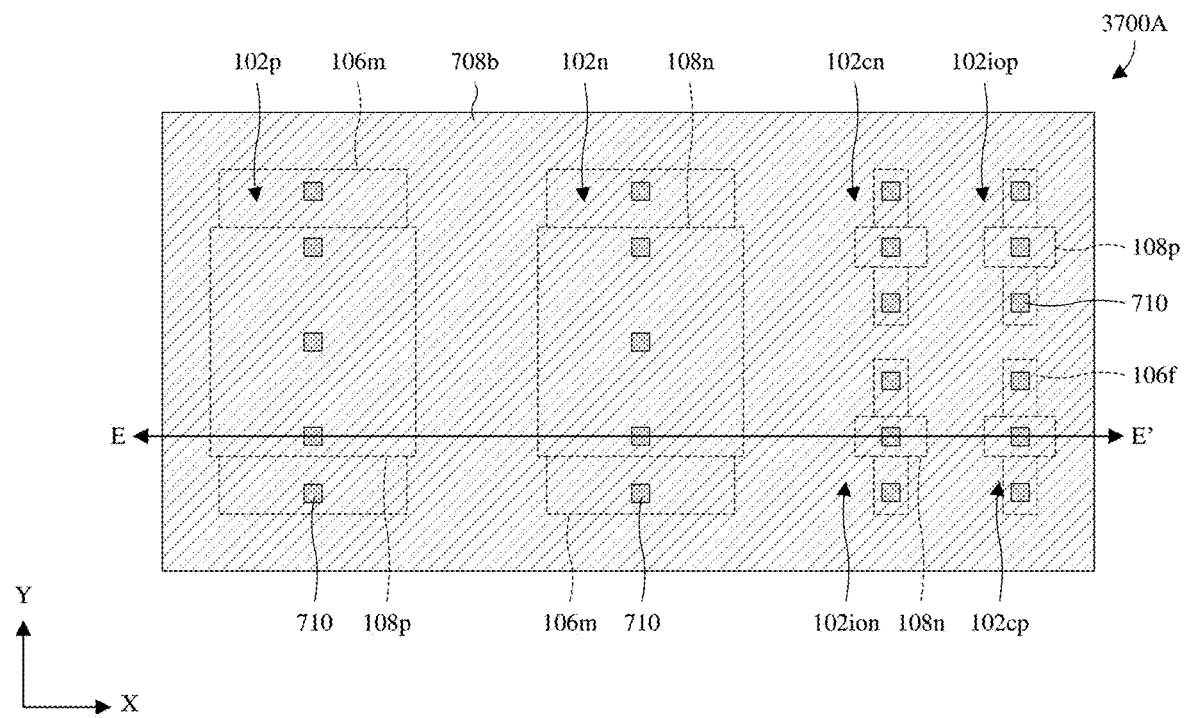
Figure 37B:
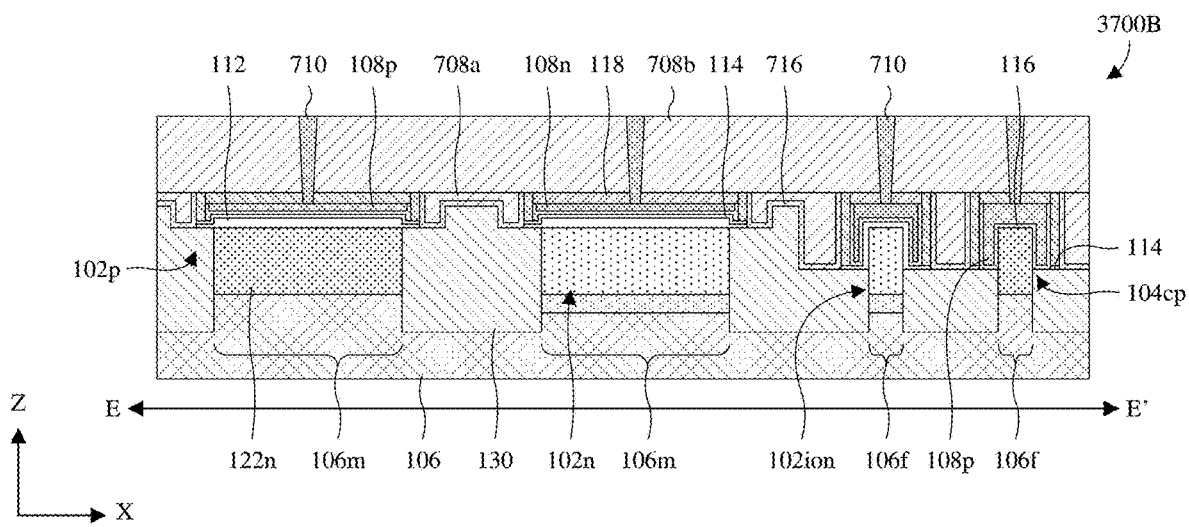

As illustrated by the views 3700A, 3700B of FIGS. 37A and 37B, hard masks 118 are formed atop the P-type and N-type gate electrodes 108p, 108n. The hard masks 118 may be formed by etching back the P-type and N-type gate electrodes 108p, 108n, depositing a hard mask layer in the resulting recesses, and performing a planarization into the hard mask layer. Other suitable processes are, however, amenable.

Also illustrated by the views 3700A, 3700B of FIGS. 37A and 37B, a second interconnect dielectric layer 708b is formed over the hard masks 118 and the first interconnect dielectric layer 708a. Further, contact vias 710 are formed extending through the second interconnect dielectric layer 708b to the FETs. Subsequently wires 712 and interwire vias 714 are formed over and electrically coupled to the contact vias 710 as shown at FIGS. 9A and 9B. In some embodiments, a passivation layer 720, pads 718, and corresponding pad openings 722 are formed over and electrically coupled to the wires 712 and the interwire vias 714 as illustrated at FIG. 7B.

While FIGS. 10A and 10B through FIGS. 13A and 13B, FIGS. 14A-14C through FIGS. 23A-23C, FIGS. 24A and 24B, FIGS. 25A-25D through FIGS. 28A-28D, FIGS. 29A and 29B through FIGS. 37A and 37B are described with reference to various embodiments of a method, it will be appreciated that the structures shown in FIGS. 10A and 10B through FIGS. 13A and 13B, FIGS. 14A-14C through FIGS. 23A-23C, FIGS. 24A and 24B, FIGS. 25A-25D through FIGS. 28A-28D, FIGS. 29A and 29B through FIGS. 37A and 37B are not limited to the method but rather may stand alone separate of the method. While FIGS. 10A and 10B through FIGS. 13A and 13B, FIGS. 14A-14C through FIGS. 23A-23C, FIGS. 24A and 24B, FIGS. 25A-25D through FIGS. 28A-28D, FIGS. 29A and 29B through FIGS. 37A and 37B are described as a series of acts, it will be appreciated that the order of the acts may be altered in other embodiments. While FIGS. 10A and 10B through FIGS. 13A and 13B, FIGS. 14A-14C through FIGS. 23A-23C, FIGS. 24A and 24B, FIGS. 25A-25D through FIGS. 28A-28D, FIGS. 29A and 29B through FIGS. 37A and 37B illustrate and describe as a specific set of acts, some acts that are illustrated and/or described may be omitted in other embodiments. Further, acts that are not illustrated and/or described may be included in other embodiments.

In some embodiments, replacement of the polysilicon gate electrodes 108ps at FIGS. 35A and 35B and/or FIGS. 36A and 36B may be omitted completely or partially in alternative embodiments. For example, the replacement may be omitted for the N-type and P-type planar FETs 102n, 102p in some embodiments, such that the polysilicon gate electrodes 108ps for the N-type and P-type planar FETs 102n, 102p may persist into the final structure of the IC.

Figure 38:
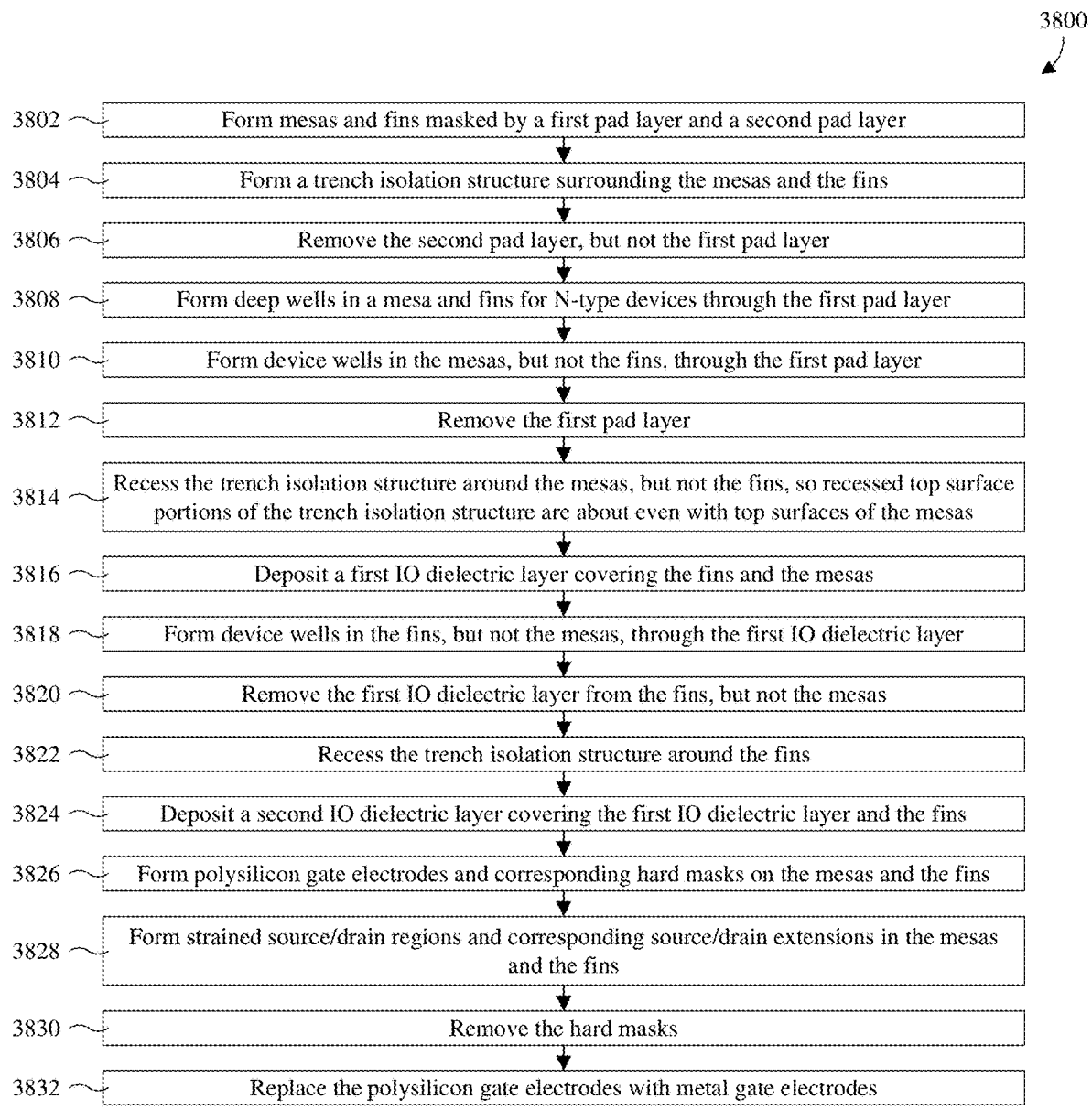
FIG. 38 illustrates a block diagram of some embodiments of a method for forming an IC comprising a planar FET and a finFET.

With reference to FIG. 38, a block diagram 3800 of some embodiments of a method for forming an IC comprising a planar FET and a finFET is provided.

At 3802, mesas and fins masked by a first pad layer and a second pad layer are formed. See, for example, FIGS. 10A and 10B through FIGS. 12A and 12B.

At 3804, a trench isolation structure is formed surrounding the mesas and the fins. See, for example, FIGS. 13A, 13B, and 14A-14C.

At 3806, the second pad layer, but not the first pad layer, is removed. See, for example, FIGS. 15A-15C.

At 3808, deep wells are formed in a mesa and fins for N-type devices through the first pad layer. See, for example, FIGS. 16A-16C. In alternative embodiments, this is omitted.

At 3810, device wells are formed in the mesas, but not the fins, through the first pad layer. See, for example, FIGS. 17A-17C and FIGS. 18A-18C.

At 3812, the first pad layer is removed. See, for example, FIGS. 19A-19C.

At 3814, the trench isolation structure is recessed around the mesas, but not the fins, so recessed top surface portions of the trench isolation structure are about even with top surfaces of the mesas. See, for example, FIGS. 20A-20C. The recessing may, for example, enhance saturation and off current for planar FETs being formed at the mesas. However, the enhancement may be marginal where the separation between top surfaces of the mesas and a top surface of the trench isolation structure is less than about 6 nanometers, 4 nanometers, or some other suitable value. Therefore, in alternative embodiments, the recessing is omitted.

At 3816, a first IO dielectric layer is deposited covering the fins and the mesas. See, for example, FIGS. 21A-21C.

At 3818, device wells are formed in the fins, but not the mesas, through the first IO dielectric layer. See, for example, FIGS. 22A-22C.

At 3820, the first IO dielectric layer is removed from the fins, but not the mesas. See, for example, FIGS. 22A-22C.

At 3822, the trench isolation structure is recessed around the fins. See, for example, FIGS. 22A-22C.

At 3824, a second IO dielectric layer is deposited covering the first IO dielectric layer and the fins. See, for example, FIGS. 23A-23C.

At 3826, polysilicon gate electrodes and corresponding hard masks are formed on the mesas and the fins. See, for example, FIGS. 24A and 24B.

At 3828, strained source/drain regions and corresponding source/drain extensions are formed in the mesas and the fins. See, for example, FIGS. 25A-25D through FIGS. 28A-28D and FIGS. 29A and 29B through FIGS. 31A and 31B. In alternative embodiments, the strained source/drain regions do not impose stress on the channels of corresponding channel regions and are therefore not "strained".

At 3830, the hard masks are removed. See, for example, FIGS. 32A and 32B and FIGS. 33A and 33B.

At 3832, the polysilicon gate electrodes are replaced with metal gate electrodes. See, for example, FIGS. 34A and 34B through FIGS. 36A and 36B. In alternative embodiments, the metal gate replacement is omitted for some or all of the polysilicon gate electrodes and the remaining polysilicon gate electrodes persist into the final structure.

While the block diagram 3800 of FIG. 38 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

In some embodiments, the present disclosure provides an IC including: a semiconductor substrate defining a mesa and a fin; a planar FET overlying the mesa, wherein the planar FET includes a first gate dielectric layer and a first gate electrode, and wherein the first gate electrode overlies the first gate dielectric layer; a finFET overlying the fin, wherein the finFET includes a second gate dielectric layer and a second gate electrode overlying the second gate dielectric layer, and wherein a thickness of the second gate dielectric layer is different than that of the first gate dielectric layer; and an interconnect structure covering and electrically coupled to the planar FET and the finFET, wherein the interconnect structure includes a first pad electrically coupled to the planar FET by wires and vias. In some embodiments, the interconnect structure includes a second pad electrically coupled to the finFET by additional wires and additional vias. In some embodiments, the IC further includes: a trench isolation structure overlying the semiconductor substrate and surrounding the mesa and the fin, wherein a top surface of the trench isolation structure has a recess at the mesa, and wherein the first gate electrode is in the recess. In some embodiments, the top surface of the trench isolation structure has a recessed portion in the recess, and wherein the recessed portion extends in a closed path along a border of the mesa and is about even with a top surface of the fin. In some embodiments, the first gate electrode overlaps opposite sidewalls of the mesa. In some embodiments, the IC further includes: a first dielectric layer and a second dielectric layer that collectively define the first gate dielectric layer, wherein the second dielectric layer, but not the first dielectric layer, defines the second gate dielectric layer. In some embodiments, the second dielectric layer has a same material as the first dielectric layer and further has an elevated concentration of nitrogen compared to the first dielectric layer.

In some embodiments, the present disclosure provides another IC including: a semiconductor substrate defining a mesa and a fin; a first gate electrode overlying the mesa and having a bottommost surface substantially elevated above a top surface of the mesa; a pair of first epitaxial structures recessed into the top surface of the mesa, wherein the first gate electrode is between and borders the first epitaxial structures; a second gate electrode overlying the fin, wherein the second gate electrode straddles the fin and extends along opposite sidewalls of the fin; and a pair of second epitaxial structures recessed into a top surface of the fin, wherein the second gate electrode is between and borders the second epitaxial structures, and wherein the second epitaxial structures have different heights than the first epitaxial structures. In some embodiments, the first epitaxial structures have smaller heights than the second epitaxial structures. In some embodiments, bottom surfaces of the first epitaxial structures are elevated relative to bottom surfaces of the second epitaxial structures. In some embodiments, top surfaces of the first epitaxial structures are recessed relative to top surfaces of the second epitaxial structures. In some embodiments, volumes of the first epitaxial structures are less than volumes of the second epitaxial structures. In some embodiments, the first and second epitaxial structures include silicon carbide or silicon germanium. In some embodiments, the first and second epitaxial structures include a first material and a second material, wherein the first epitaxial structures have a first ratio of the first material to the second material, wherein the second epitaxial structures have a second ratio of the first material to the second material, and wherein the first and second ratios are different.

In some embodiments, the present disclosure provides a method including: patterning a semiconductor substrate to define a mesa and a fin; forming a trench isolation structure overlying the semiconductor substrate and surrounding the mesa and the fin; forming a first gate dielectric layer on the mesa, but not the fin; recessing the trench isolation structure around the fin after the forming the first gate dielectric layer; depositing a second gate dielectric layer overlying the first gate dielectric layer at the mesa and further overlying the fin; forming a first gate electrode overlying the first and second gate dielectric layers at the mesa and partially defining a planar field-effect transistor; and forming a second gate electrode overlying the second gate dielectric layer at the fin and partially defining a fin field-effect transistor. In some embodiments, the forming of the first gate dielectric layer includes: depositing the first gate dielectric layer overlying the fin and the mesa; and patterning the first gate dielectric layer to remove the first gate dielectric layer from the fin, but not the mesa. In some embodiments, the forming of the first and second gate electrodes includes: depositing a gate electrode layer cover the mesa and the fin over the first and second gate dielectric layers; and performing a selective etch into the gate electrode layer to form the first and second gate electrodes from the gate electrode layer. In some embodiments, the method further includes performing an etch into the mesa and the fin to simultaneously form a pair of first openings and a pair of second openings, wherein the first openings are formed in the mesa with the first gate electrode sandwiched between the first openings, wherein the second openings are formed in the fin with the second gate electrode sandwiched between the second openings, and wherein the first openings have different profiles than the second openings. In some embodiments, the method further includes depositing first epitaxial structures and second epitaxial structures respectively in the first and second openings, wherein sidewall thicknesses of the first epitaxial structures are smaller than sidewall thicknesses of the second epitaxial structures part way through the depositing. In some embodiments, the method further includes recessing a top surface portion of the trench isolation structure at the mesa, but not the fin, until the top surface portion is about even with a top surface of the mesa.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC) comprising:
 a semiconductor substrate defining a mesa and a fin;
 a planar field-effect transistor (FET) overlying the mesa, wherein the planar FET comprises a first gate dielectric layer and a first gate electrode, and wherein the first gate electrode overlies the first gate dielectric layer;
 a finFET overlying the fin, wherein the finFET comprises a second gate dielectric layer and a second gate electrode overlying the second gate dielectric layer, and wherein a thickness of the second gate dielectric layer is different than that of the first gate dielectric layer;
 a first dielectric layer and a second dielectric layer that collectively form the first gate dielectric layer, wherein the second dielectric layer overlies the first dielectric layer and further forms the second gate dielectric layer, and wherein the first dielectric layer is spaced from the fin and the second gate dielectric layer; and
 an interconnect structure over and electrically coupled to the planar FET and the finFET;
 wherein a bottommost surface of the first gate electrode directly contacts the first gate dielectric layer and is completely elevated relative to a topmost surface of the mesa.

2. The IC according to claim 1, wherein the interconnect structure comprises a first pad and a second pad electrically coupled respectively to the planar FET and the finFET by wires and vias.

3. The IC according to claim 1, wherein the first gate electrode overlaps opposite sidewalls of the mesa.

4. The IC according to claim 1, wherein the second dielectric layer has a same material as the first dielectric layer and further has an elevated concentration of nitrogen compared to the first dielectric layer.

5. The IC according to claim 1, wherein the first gate dielectric layer has a greater thickness at a center of the mesa than at a periphery of the mesa.

6. The IC according to claim 1, wherein the first gate electrode has a first thickness directly over the mesa, wherein the second gate electrode has a second thickness directly over the fin, and wherein the first thickness is less than the second thickness.

7. The IC according to claim 1, further comprising:
 a trench isolation structure overlying the semiconductor substrate and surrounding the mesa and the fin, wherein a top surface of the trench isolation structure has a stepped profile stepping up from an elevation level with a top surface of the mesa to an elevation level with the first gate electrode.

8. An integrated circuit (IC) comprising:
 a semiconductor substrate defining a mesa and a fin spaced from the mesa;
 a first gate electrode overlying the mesa and having a bottommost surface substantially elevated above a top surface of the mesa;
 a pair of first epitaxial structures recessed into the top surface of the mesa, wherein the first gate electrode is between and borders the first epitaxial structures;
 a second gate electrode overlying the fin, wherein the second gate electrode straddles the fin and extends along opposite sidewalls of the fin; and
 a pair of second epitaxial structures recessed into a top surface of the fin and spaced from the pair of first epitaxial structures, wherein the second gate electrode is between and borders the second epitaxial structures, and wherein the second epitaxial structures have different heights than the first epitaxial structures.

9. The IC according to claim 8, wherein the first epitaxial structures have smaller heights than the second epitaxial structures.

10. The IC according to claim 8, wherein bottom surfaces of the first epitaxial structures are elevated relative to bottom surfaces of the second epitaxial structures.

11. The IC according to claim 8, wherein volumes of the first epitaxial structures are less than volumes of the second epitaxial structures.

12. The IC according to claim 8, wherein the first and second epitaxial structures comprise silicon carbide or silicon germanium.

13. The IC according to claim 8, wherein the first and second epitaxial structures comprise a first material and a second material, wherein the first epitaxial structures have a first ratio of the first material to the second material, wherein the second epitaxial structures have a second ratio of the first material to the second material, and wherein the first and second ratios are different.

14. The IC according to claim 8, wherein each of the first epitaxial structures comprises a plurality of epitaxial layers, including a first epitaxial layer and a second epitaxial layer, and wherein the first epitaxial layer separates the second epitaxial layer from the semiconductor substrate and has a different material composition than the second epitaxial layer.

15. The IC according to claim 8, further comprising:
a first gate dielectric layer underlying the first gate electrode, wherein the bottommost surface of the first gate electrode directly contacts the first gate dielectric layer and is completely elevated above the top surface of the mesa in multiple orthogonal cross-sectional planes.

16. An integrated circuit (IC) comprising:
a semiconductor substrate defining a mesa and a fin;
a first semiconductor device overlying the mesa, wherein the first semiconductor device comprises a first gate dielectric layer and a first gate electrode, and wherein the first gate electrode overlies the first gate dielectric layer;
a second semiconductor device overlying the fin, wherein the second semiconductor device comprises a second gate dielectric layer and a second gate electrode overlying the second gate dielectric layer, and wherein a thickness of the second gate dielectric layer is different than that of the first gate dielectric layer; and
a trench isolation structure overlying the semiconductor substrate and surrounding the mesa and the fin, wherein a top surface of the trench isolation structure has a stepped profile stepping up from a first portion of the top surface that adjoins the mesa to a second portion of the top surface that is elevated relative to a bottom surface of the first gate electrode, and wherein the first and second portions individually have ring-shaped top geometries surrounding the first gate electrode.

17. The IC according to claim 16, wherein a top of the fin is recessed into a bottom of the second gate electrode, and wherein a bottommost edge of the first gate electrode directly contacts the first gate dielectric layer and is elevated relative to a topmost edge of the mesa.

18. The IC according to claim 16, wherein the first gate dielectric layer overlies the trench isolation structure and the mesa, and wherein the first gate dielectric layer is thicker directly over the mesa than directly over the trench isolation structure.

19. The IC according to claim 16, wherein the mesa has a length that is greater than twice a length of the fin, and wherein the mesa has a width that is greater than twice a width of the fin.

20. The IC according to claim 16, wherein the top surface of the trench isolation structure has an additional stepped profile stepping down from the second portion of the top surface to a third portion of the top surface that adjoins the fin, and wherein the first portion of the top surface is elevated relative to the third portion of the top surface.

* * * * *